(12) United States Patent
Sonoda et al.

(10) Patent No.: US 8,969,111 B2
(45) Date of Patent: Mar. 3, 2015

(54) METHOD FOR MANUFACTURING DISPLAY DEVICE

(71) Applicant: Sharp Kabushiki Kaisha, Osaka (JP)

(72) Inventors: Tohru Sonoda, Osaka (JP); Shoji Okazaki, Osaka (JP); Hiromitsu Katsui, Osaka (JP); Tetsunori Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/237,560

(22) PCT Filed: Sep. 20, 2012

(86) PCT No.: PCT/JP2012/074114
§ 371 (c)(1),
(2) Date: Feb. 6, 2014

(87) PCT Pub. No.: WO2013/047331
PCT Pub. Date: Apr. 4, 2013

(65) Prior Publication Data
US 2014/0206117 A1    Jul. 24, 2014

(30) Foreign Application Priority Data
Sep. 26, 2011   (JP) .................................. 2011-209648

(51) Int. Cl.
*H01L 21/00* (2006.01)
*H01L 33/40* (2010.01)
*H01L 51/00* (2006.01)
*H05B 33/28* (2006.01)
*H01L 27/15* (2006.01)
*H01L 33/42* (2010.01)

(52) U.S. Cl.
CPC .......... *H01L 33/405* (2013.01); *H01L 51/0023* (2013.01); *H05B 33/28* (2013.01); *H01L 27/156* (2013.01); *H01L 33/42* (2013.01); *H01L 2251/308* (2013.01)
USPC ......................................................... 438/29

(58) Field of Classification Search
None
See application file for complete search history.

(56) References Cited

U.S. PATENT DOCUMENTS

2007/0102737 A1* 5/2007 Kashiwabara et al. ....... 257/291
2008/0265254 A1* 10/2008 Nishiura ......................... 257/59

FOREIGN PATENT DOCUMENTS

JP   2005-116516 A   4/2005
JP   2007-280677 A   10/2007
JP   2009-129604 A   6/2009

OTHER PUBLICATIONS

International Search Report received for PCT Patent Application No. PCT/JP2012/074114, mailed on Jan. 8, 2013, 5 pages (2 pages of English Translation and 3 pages of ISR).

* cited by examiner

*Primary Examiner* — Evan Pert
*Assistant Examiner* — Herve Assouman
(74) *Attorney, Agent, or Firm* — Morrison & Foerster LLP

(57) ABSTRACT

An IZO layer (113) is formed on an a-ITO layer (112), and resist patterns (202R, 202G) having different film thicknesses are formed in at least sub-pixels (71R, 71G). The a-ITO layer (112) and the IZO layer (113) are etched by utilizing (i) a reduction in thickness of the resist patterns (202R, 202G) by ashing and (ii) a change in etching tolerance due to transformation from the a-ITO layer (112) into a p-ITO layer (114).

20 Claims, 18 Drawing Sheets

METHOD FOR MANUFACTURING DISPLAY DEVICE

CROSS REFERENCE TO RELATED APPLICATIONS

This is a U.S. National Phase patent application of PCT/JP2012/074114 filed Sep. 20, 2012, which claims priority to Japanese Patent Application No. JP 2011-209648 filed Sep. 26, 2011, each of which is hereby incorporated by reference in the present disclosure in its entirety.

TECHNICAL FIELD

The present invention relates to a method for manufacturing a display device in which (i) an electrode of at least one sub-pixel includes a reflecting electrode layer and a plurality of transparent electrode layers formed on the reflecting electrode layer and (ii) a total film thickness of the transparent electrode layer(s) is different between sub-pixels.

BACKGROUND ART

Flat panel displays have been used for various products in various fields in recent years, and are required to have a larger size, a higher definition, and a less power consumption.

In view of the circumstances, organic EL display devices including organic EL elements utilizing electro luminescence (hereinafter, referred to as "EL") of an organic material draw significant attention as all-solid flat panel displays having excellent low-voltage driving, excellent high-speed response, excellent self-emitting, and an excellent wide-viewing-angle property.

For example, an organic EL display device is configured such that an organic EL element which is electrically connected to a thin film transistor (TFT) is provided on a substrate made from a glass substrate or the like on which the thin film transistor is provided.

The organic EL element is a light emitting element capable of emitting light having a high luminance by low-voltage direct-current driving, and includes a first electrode, an organic EL layer, and a second electrode which are stacked in this order.

As a method for achieving full-color display in an organic EL display device including such an organic EL element, there are known, for example, a first method involving arraying, as sub-pixels, organic EL elements, which emit red (R) light, green (G) light, and blue (B) light, on a substrate and a second method involving selecting a color of light for each sub-pixel by incorporating an organic EL element emitting white light with a color filter.

In those methods, there has been proposed in recent years a method for improving a chromaticity of emitted light and a light-emitting efficiency by utilizing a microcavity effect (e.g., see Patent Literatures 1, 2).

The microcavity is a phenomenon in which, by multiply reflecting emitted light between an anode and a cathode to resonate the emitted light, an emission spectrum is steeply changed, and a light intensity of a peak wavelength is amplified.

The microcavity effect can be obtained by, for example, optimally designing reflectivities and film thicknesses of anode and cathode, a layer thickness of an organic layer, etc.

As a method for introducing such a resonance structure, i.e., a microcavity structure into an organic EL element, for example, there is known a method involving changing, for each emission light color, optical path lengths of organic EL elements in respective sub-pixels.

As the method for changing, for each emission light color, the optical path lengths of the organic EL elements in the respective sub-pixels, there is a method involving stacking an organic EL layer including a light-emitting layer and a transparent electrode layer between a reflecting electrode and a semitransparent electrode.

That is, for example, in a case of a top emission organic EL element, there is a method involving (i) forming an anode by stacking a reflecting electrode layer and a transparent electrode layer and (ii) changing, for each sub-pixel, a film thickness of the transparent electrode layer provided on the reflecting electrode layer of the anode.

In a case of the top emission organic EL element, the microcavity structure can be introduced by (i) forming the anode by stacking the reflecting electrode layer and the transparent electrode layer as described above, (ii) stacking an organic EL layer appropriately, and (iii) forming a cathode with a semitransparent electrode made from, for example, a semitransparent silver which has been shaped into a thin film.

In a case where the microcavity structure is introduced into the organic EL element as described above, a spectrum of light emitted from the light-emitting layer through the cathode is more steeply changed as compared with a case where the organic EL element does not have the microcavity structure, and an emission intensity of the light to a front surface is largely increased.

Each of Patent Literatures 1 and 2 discloses an organic EL display device in which the microcavity structure is introduced into an organic EL element by stacking transparent electrode layers which are made from the identical material but whose number is different between sub-pixels.

CITATION LIST

Patent Literatures

Patent Literature 1

Japanese Patent Application Publication Tokukai No. 2007-280677 A (Publication date: Oct. 25, 2007)

Patent Literature 2

Japanese Patent Application Publication Tokukai No. 2005-116516 A (Publication date: Apr. 28, 2005)

Patent Literature 3

Japanese Patent Application Publication Tokukai No. 2009-129604 A (Publication date: Jun. 11, 2009)

SUMMARY OF INVENTION

Technical Problem

However, as described above, in an organic EL display device in which a color of light is adjusted by changing a film thickness of a transparent electrode layer to change the microcavity effect, there has not been known a method for appropriately changing, for each color, the film thickness of the transparent electrode layer between sub-pixels.

Note that Patent Literature 1 does not disclose a method for changing, for each color, the film thickness of the transparent electrode between the sub-pixels.

Meanwhile, Patent Literature 2 discloses a method below as a method for changing, for each of sub-pixels of different colors, the film thicknesses of stacked transparent electrodes which are made from an identical material but whose thicknesses are different from each other between the sub-pixels.

First, a transparent electrode layer and a resist pattern are alternately stacked on reflecting electrode layers while sub-pixels, on which the resist pattern is to be stacked, are changed in the order of a B sub-pixel, a G sub-pixel, and an R sub-pixel.

After a resist pattern is stacked on the R sub-pixel, an uppermost transparent electrode layer is subjected to etching while using the resist pattern of the R sub-pixel as a mask. When a resist pattern of the G sub-pixel is exposed, a second upper transparent electrode layer is subjected to etching while using the resist patterns of the R and G sub-pixels as masks.

Subsequently, when a resist pattern of the B sub-pixel is exposed, a lower most transparent electrode layer is subjected to etching while using the resist patterns of the R, G, and B sub-pixels as masks. In this way, all the transparent electrode layers can be patterned.

Finally, reflecting electrode layers are subjected to etching while using the resist patterns of the R, G, and B sub-pixels as the masks, thereby patterning the reflecting electrode layer.

In Patent Literature 2, although the numbers of times of etching and removing of a resist can be reduced to one time, a forming step of a resist pattern needs to be carried out three times. Further, a transparent electrode layer is stacked on the resist pattern, so that, if the resist and the transparent electrode layer are not sufficiently adhered to each other, the transparent electrode layer might be removed during this process, which may lead to a risk of a defective pattern and a contamination.

If a substrate on which the resist is stacked is put into a sputtering device, a foreign matter such as garbage is adhered to the substrate, thereby decreasing a yield and causing a defect, unevenness of film thickness, and unevenness of film quality (in-plane distribution of optical properties).

As described in Patent Literature 2, in a case where the transparent electrode is stacked on the resist pattern and a thickness of the resist pattern is thick, a part shaded by a resist pattern is increased, which results in a defect of the transparent electrode layer or the unevenness of the film thickness in this part. It is therefore difficult to set the film thickness of the transparent electrode layer suitably for each color, and the sub-pixels cannot be formed with a highly accurate pattern.

For this reason, it is difficult to change, for each color, the film thickness of the transparent electrode among the sub-pixels by simply stacking the transparent electrode layer.

An example of the method for changing, for each color, the film thickness of the transparent electrode among the sub-pixels is below.

FIG. 18 is a cross-sectional view illustrating, in (a) through (f), successive steps in an example method for changing, for each sub-pixel, a film thickness of a transparent electrode layer on a reflecting electrode layer of an anode.

The following description will discuss, with reference to (a) through (f) of FIG. 18, a method for changing, for each sub-pixel, the film thicknesses of the transparent electrode layers on the reflecting electrode layers of the anode as described above.

First, as illustrated in (a) of FIG. 18, a reflecting electrode layer 302, made from a reflecting electrode material such as silver (Ag) or the like, is formed on the supporting substrate 301 by a sputtering method or the like.

Next, resist patterns (not illustrated) are formed for sub-pixels of different colors on the reflecting electrode layer 302 by photolithography, and the reflecting electrode layer 302 is subjected to etching while using the resist patterns as masks. Subsequently, the resist patterns are washed to be removed with the use of a resist removing solution.

Thus, as illustrated in (b) of FIG. 18, the reflecting electrode layer 302 is patterned to be separated for the sub-pixels of different colors.

Then, as illustrated in (c) of FIG. 18, for example, an IZO layer 303 is made from IZO (indium zinc oxide) as the transparent electrode layer on the reflecting electrode layer 302, and then a photoresist 311 is formed only in the R sub-pixel by photolithography.

Then, as illustrated in (d) of FIG. 18, an exposed part of the IZO layer 303 is removed by etching with the use of an oxalic acid, and the photoresist 311 is removed. As such, the IZO layer 303 thus patterned is formed only in the R sub-pixel as a first IZO layer.

Subsequently, as illustrated in (e) of FIG. 18, IZO is used again to form an IZO layer 304 so as to cover (i) the IZO layer 303 of the R sub-pixel and (ii) the reflecting electrode layers 302 of the G and B sub-pixels, and then photoresists 312 are formed only in the R and G sub-pixels by photolithography.

After that, as illustrated in (f) of FIG. 18, the IZO layer 304 is subjected to etching while using the photoresists 312 as masks and then the photoresists 312 are removed. As such, the IZO layers 304 thus patterned are formed in the sub-pixel R and in the sub-pixel G as second IZO layers.

In a case where the stacked number of transparent electrode layers made from an identical material varies between sub-pixels as described above in order to achieve the microcavity effect, a set of photolithography, etching, and removing of a resist needs to be carried out at least three times if sub-pixels are constituted by, for example, R, G, and B sub-pixels.

In other words, in order to change, for each sub-pixel, the film thicknesses of the transparent electrode layers on the reflecting electrode layers of the anode, photolithography needs to be carried out three times (see (a) through (f) of FIG. 18). Note that, if photolithography for patterning of a reflecting electrode layer is included, photolithography needs to be carried out four times. In (f) of FIG. 18, in a case where another transparent electrode layer is formed on a B pixel, photolithography needs to be carried out four times.

Therefore, in a case where a thickness of an electrode is changed for each sub-pixel in order to achieve the microcavity effect as described above, there is needed a device for carrying out photolithography, etching, and removing of a resist at least three times (if photolithography for patterning a reflecting electrode layer is included, at least four times). This increases the number of photolithography devices (photo processing devices), which are needed in a manufacturing line, for carrying out the above processes.

An expensive device and/or an expensive material are needed in photolithography. Therefore, changing the thickness of the electrode for each sub-pixel as described above leads to an increase in cost of the entire devices and an increase in footprint.

Furthermore, it is difficult to reduce a tact time because photolithography needs development and baking processes for a certain time period.

Therefore, it is desirable that the number of times of the photolithography be as small as possible.

In a case where removing and baking of the photoresist are repeated as described above, a surface of the reflecting electrode layer becomes rough or oxidized, thereby decreasing a reflective efficiency. Further, the roughness of the reflecting electrode layer may cause leakage of light between the electrodes, which may result in defective pixels.

Patent Literature 3 discloses a method for reducing the number of times of the photolithography by stacking ITOs having different crystallinities. However, even if such a method is employed, photolithography needs to be carried out at least twice.

In Patent Literature 3, the film thickness of the transparent electrode layer is changed for each sub-pixel by (i) forming an ITO film having a crystallinity, (ii) patterning the ITO film so as to remain in first and third sub-pixels, (iii) stacking an amorphous ITO film, and (iv) patterning the amorphous ITO film so as to remain in the first sub-pixel and a second sub-pixel.

That is, in Patent Literature 3, the number of times of photolithography is reduced by forming patterns of transparent electrode layers having an identical film thickness in two sub-pixels in each photolithography, and changing, in each photolithography, sub-pixels in which a pattern of the transparent electrode layers is formed.

For this reason, in Patent Literature 3, an optical path length of a sub-pixel is determined by a combination of film thicknesses of two transparent electrode layers. Therefore, setting of the optical path length is limited, and it is difficult to change the optical path length arbitrarily.

The present invention is made in view of the above problems, and an object of the present invention is to provide a method for manufacturing a practical display device in which film thicknesses of transparent electrode layers on reflecting electrode layers can be changed between sub-pixels of different display colors, and to reduce the number of times of photolithography.

Solution to Problem

In order to attain the object, a method for manufacturing a display device in accordance with the present invention is a method for manufacturing a display device in which, (i) in at least one sub-pixel, one of two electrodes, which are paired so as to form an electric field, has a reflecting electrode layer and a plurality of transparent electrode layers formed on the reflecting electrode layer, and (ii) a total film thickness of the plurality of transparent electrode layers varies between sub-pixels having different display colors, the method including the steps of:

(a) forming a first transparent electrode layer from an amorphous transparent electrode material;
(b) forming, on the first transparent electrode layer, a second transparent electrode layer from a transparent electrode material whose composition is different from the amorphous transparent electrode material;
(c) forming first resist patterns, which have different film thicknesses, on the second transparent electrode layer in respective at least two of a plurality of sub-pixels having different display colors;
(d) patterning at least the second transparent electrode layer and the first transparent electrode layer by etching while using the first resist patterns as a mask;
(e) ashing the first resist patterns so as to (i) remove a thinnest one of the first resist patterns so that the second transparent electrode layer is exposed and (ii) reduce thicknesses of the other of the first resist patterns, and then etching and removing an exposed part of the second transparent electrode layer while using, as a mask, the other of the first resist patterns whose thicknesses have been reduced or, in a case where a transparent electrode layer made of an amorphous transparent electrode material exists, etching and removing the exposed part of the second transparent electrode layer and the transparent electrode layer, the step (e) being carried out at least once;
(f) after the step (e), removing a thickest one of the first resist patterns which have been formed in the step (c), the step (e) being repeated until a part of the second transparent electrode layer, which part is provided under a second thickest one of the first resist patterns, is removed by etching, the step (e) at least including the steps of:
(e-1) ashing so as to (i) remove the second thickest one of the first resist patterns so that the part of the second transparent electrode layer, which part is provided under the second thickest one of the first resist patterns, is exposed and (ii) reduce a thickness of the thickest one of the first resist patterns;
(e-2) etching and removing the exposed part of the second transparent electrode layer while using, as a mask, the thickest one of the first resist patterns whose thickness has been reduced in the step (e-1); and
(e-3) crystallizing the first transparent electrode layer so as to transform the first transparent electrode layer into a polycrystalline first transparent electrode layer, the step (e-3) being carried out (i) immediately before the step (e-1) or (ii) between the step (e-1) and the step (e-2).

According to the method, the plurality of transparent electrode layers are stacked by making use of an etching selectivity derived from a difference in etching tolerance between a transparent electrode layer made of an amorphous transparent electrode material and a transparent electrode layer made of a polycrystalline transparent electrode material.

According to the method, the amorphous transparent electrode material is transformed into the polycrystalline transparent electrode material, and this makes it possible to increase an etching tolerance with respect to an etchant.

Therefore, according to the method, it is possible to vary the number of transparent electrode layers, which are stacked on the reflecting electrode layer, between sub-pixels, e.g., for each sub-pixel by carrying out, for example, photolithography only once.

This makes it possible to arbitrarily vary a total film thickness of transparent electrode layers on the reflecting electrode layer for, for example, each of sub-pixels of different display colors by the smaller number of times of photolithography than that of a conventional technique.

This makes it possible to further reduce cost and footprint as compared with a conventional technique.

According to the conventional method, the number of times of carrying out removing processes and baking processes on photoresists is increased, and a surface of the reflecting electrode layer therefore becomes rough or oxidized, thereby decreasing a reflective efficiency. Further, the roughness of the reflecting electrode layer may cause leakage between the electrodes, which may result in defective pixels.

However, according to the method, the number of times of carrying out the processes such as exposure, development, and resist removing can be reduced, and it is therefore possible to avoid such a problem. Moreover, it is possible to shorten a tact time.

Advantageous Effects of Invention

According to the method of the present invention for manufacturing a display device, as above described, the second transparent electrode layer, which is made of the transparent electrode material whose composition is different from the amorphous transparent electrode material, is formed on the first transparent electrode layer made of the amorphous transparent electrode material, and resist patterns having different film thicknesses are formed in respective at least two sub-pixels, and the transparent electrode layers are etched by making use of (i) reduction in thickness of the resist pattern by ashing and (ii) a variation of etching tolerance which variation is derived by utilizing crystallization of the first transparent electrode layer. This makes it possible to vary the number of transparent electrode layers, which are stacked on the reflecting electrode layer, between sub-pixels by carrying out, for example, photolithography only once.

This makes it possible to arbitrarily vary a total film thickness of transparent electrode layers on the reflecting electrode layer for each of sub-pixels of different display colors by the smaller number of times of photolithography than that of a conventional technique.

This makes it possible to further reduce cost and footprint as compared with a conventional technique.

According to the method, the number of times of carrying out the processes such as exposure, development, and resist removing can be reduced, and it is therefore possible to avoid (i) the decrease in reflective efficiency and (ii) the defective pixel caused by the leakage between the electrodes due to the roughness of the surface of the reflecting electrode layer. Moreover, it is possible to shorten a tact time.

DESCRIPTION OF EMBODIMENTS

The following description will discuss embodiments of the present invention in detail.

Embodiment 1

The present embodiment will be described below with reference to (a) through (i) of FIG. 1 through (a) through (i) of FIG. 9.

<Schematic Configuration of Organic EL Display Device>

First, the following description will discuss a schematic configuration of an organic EL display device.

Figure 2:
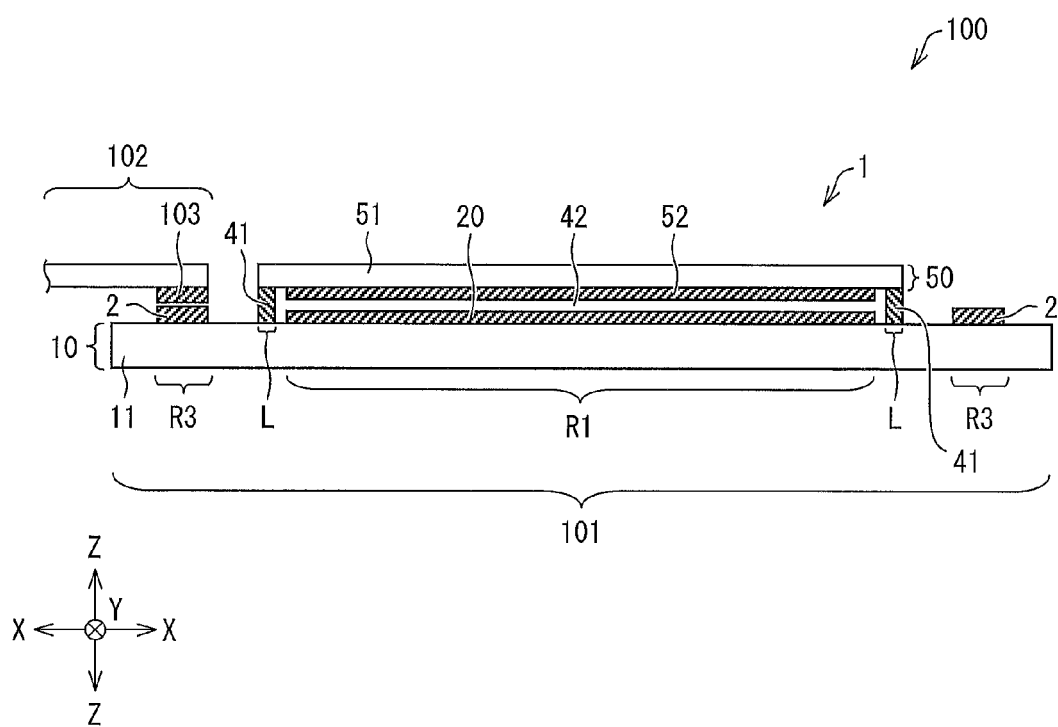
FIG. 2 is an exploded cross-sectional view schematically illustrating a main part of the organic EL display device in accordance with Embodiment 1.

FIG. 2 is an exploded cross-sectional view schematically illustrating a main part of an organic EL display device 100 in accordance with the present embodiment.

As illustrated in FIG. 2, the organic EL display device 100 in accordance with the present embodiment includes a pixel section 101 and a circuit section 102.

The pixel section 101 includes an organic EL display panel 1 (display panel). The circuit section 102 includes: a circuit substrate on which a driving circuit for driving the organic EL display device 100 and the like are provided; an IC (integrated circuit) chip; and other members.

The organic EL display panel 1 is configured such that an organic EL element 20, sealing resin layers 41, a filler resin layer 42, and a sealing substrate 50 are provided in this order on a supporting substrate 10 (substrate on which a film is formed, TFT substrate).

The supporting substrate 10 is constituted by a semiconductor substrate such as a TFT substrate, and is configured such that, for example, a TFT (thin film transistor) 12 (see FIG. 5) serving as an active element (drive element) and the like are provided on an insulating substrate 11.

The organic EL element 20 is connected to the TFT 12. On the organic EL element 20, an adhesive filler resin layer 42 containing a desiccating agent is formed. Filler resin forming the filler resin layer 42 is filled in a space surrounded by the supporting substrate 10, the sealing substrate 50, and the sealing resin layers 41.

Note that the organic EL display device 100 may be a bottom emission type which emits light from the supporting substrate 10 side or a top emission type which emits light from the sealing substrate 50 side.

A base substrate for use in the supporting substrate 10 and the sealing substrate 50 can be made from, for example, glass or plastic. As an example, a glass substrate such as a non-alkali glass substrate can be used.

Note, however, that the base substrate is not limited to this, and, as a substrate which does not emits light, an opaque material such as a metal substrate can be used.

In a case of the top emission type, a substrate on which a CF (color filter) layer is formed may be used as the sealing substrate 50. Meanwhile, in a case of the bottom emission type, a CF layer may be formed on the supporting substrate 10 side.

In a case where the CF layer is used together as described above, a spectrum of light emitted from the organic EL element 20 can be adjusted with the use of the CF layer.

Hereinafter, in the present embodiment, the description will discuss a case where the organic EL display device 100 is the top emission type. However, the present embodiment is not limited to this, and the organic EL display device 100 may be the bottom emission type as describe above.

As illustrated in FIG. 2, for example, the sealing substrate 50 in accordance with the present embodiment is configured such that a CF layer 52, a BM (black matrix) 53 (see FIG. 5), and the like are provided on an insulating substrate 51.

In order to prevent the organic EL element 20 from being damaged by moisture or oxygen, the supporting substrate 10, on which the organic EL element 20 is stacked, is attached to the sealing substrate 50 via the sealing resin layer 41 and the filler resin layer 42 which are provided in a frame-like sealing region L, so that the organic EL element 20 is sealed between the pair of substrates (i.e., the supporting substrate 10 and the sealing substrate 50).

In the organic EL display panel 1, the organic EL element 20 is sealed between the supporting substrate 10 and the sealing substrate 50 as described above. This prevents oxygen and/or moisture from infiltrating the organic EL element 20 from the outside.

On the outside of the frame-like sealing region L of the supporting substrate 10 is provided a terminal section region R3 in which an electric wiring terminal 2 (electrical connection part, connection terminal) and the like are formed.

The electric wiring terminal 2 is a connection terminal to which a connection terminal 103 of the circuit section 102 is connected, and is made from a wire material such as metal.

On the circuit section 102 are provided, for example, wires such as flexible film cables and a driving circuit such as a driver.

As illustrated in FIG. 2, the circuit section 102 is connected to the organic EL display panel 1 via the electric wiring terminal 2 provided in the terminal section region R3.

<Configuration of Supporting Substrate 10>

Figure 3:
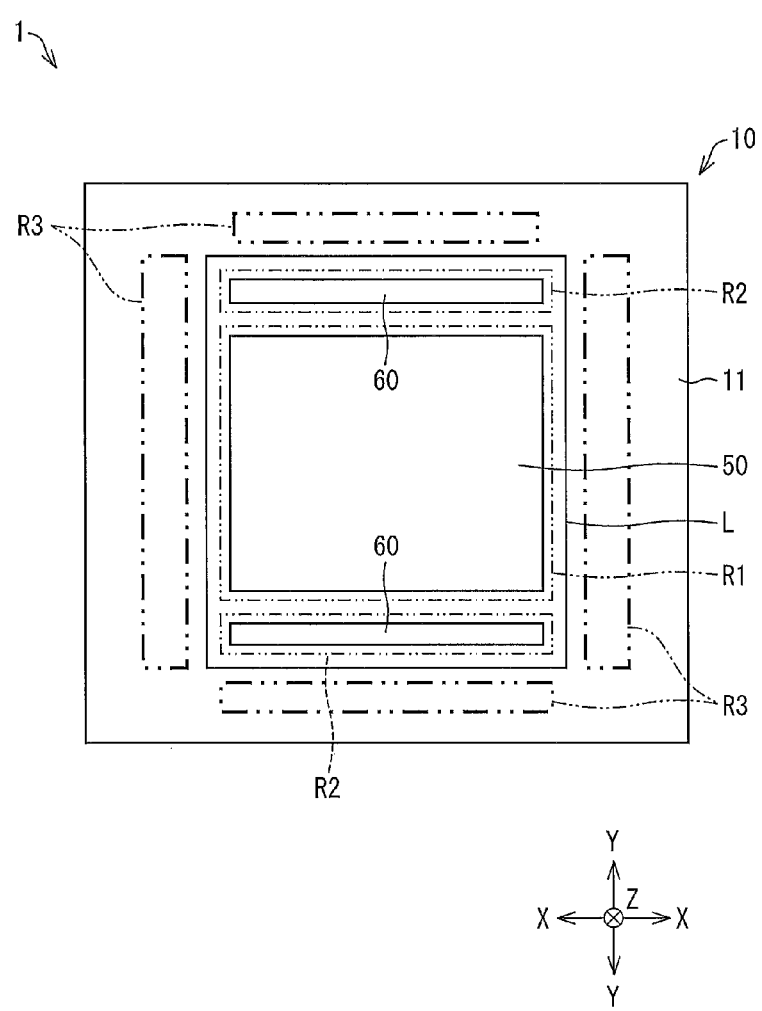
FIG. 3 is a plan view schematically illustrating a configuration of a supporting substrate of the organic EL display device in accordance with Embodiment 1.

With reference to FIG. 3, the following description will discuss regions of the supporting substrate 10 including the terminal section region R3.

FIG. 3 is a plan view schematically illustrating a configuration of the supporting substrate 10 of the organic EL display device 100.

As illustrated in FIG. 3, a display region R1, second electrode connection regions R2, the terminal section regions R3 and the frame-like sealing region L are provided on a main surface serving as an active surface (active element formation surface) of the supporting substrate 10.

<Display Region R1>

The display region R1 (display section) is located in the center of the supporting substrate 10, and is formed in, for example, a rectangular shape. On the display region R1, a pixel array constituted by a plurality of sub-pixels 71 (see FIG. 4 and FIG. 5) is formed. Note that a configuration of the display region R1 will be described later in detail.

<Second Electrode Connection Region R2>

The second electrode connection regions R2 are a region where a second electrode 31 (see FIG. 5) is connected in the organic EL element 20. For example, the second electrode connection regions R2 are formed along and outside respective opposite two sides of the display region R1, which two sides are one of two pairs of sides of the display region R1.

On the second electrode connection regions R2, connection parts 60 (connection electrodes) are respectively formed. Each of the connection parts 60 is a part to which the second electrode 31 is connected and is made from a metal material.

<Sealing Region L>

As described above, the sealing resin layer 41 is formed in the sealing region L for attaching the supporting substrate 10 and the sealing substrate 50 to each other.

As illustrated in FIG. 3, the sealing region L is formed in the frame shape so as to surround the display region R1 and the second electrode connection regions R2.

<Terminal Section Region R3>

As described above, the terminal section regions R3 are regions for connecting the pixel section 101 and the circuit section 102 to each other. The terminal section regions R3 are provided along and outside the frame-like sealing region L.

Specifically, as illustrated in FIG. 3, two of the terminal section regions R3 are formed along and outside the respective second electrode connection regions R2. Further, the other of the terminal section regions R3 are formed along and outside respective opposite sides of the display region R1, on which sides the second electrode connection regions R2 are not provided.

Note that the terminal section regions R3 are not necessarily provided on all sides, and, for example, may be provided integrally on any one of the sides.

<Configuration of Display Region R1>

The following description will discuss a configuration of the display region R1.

Figure 4:
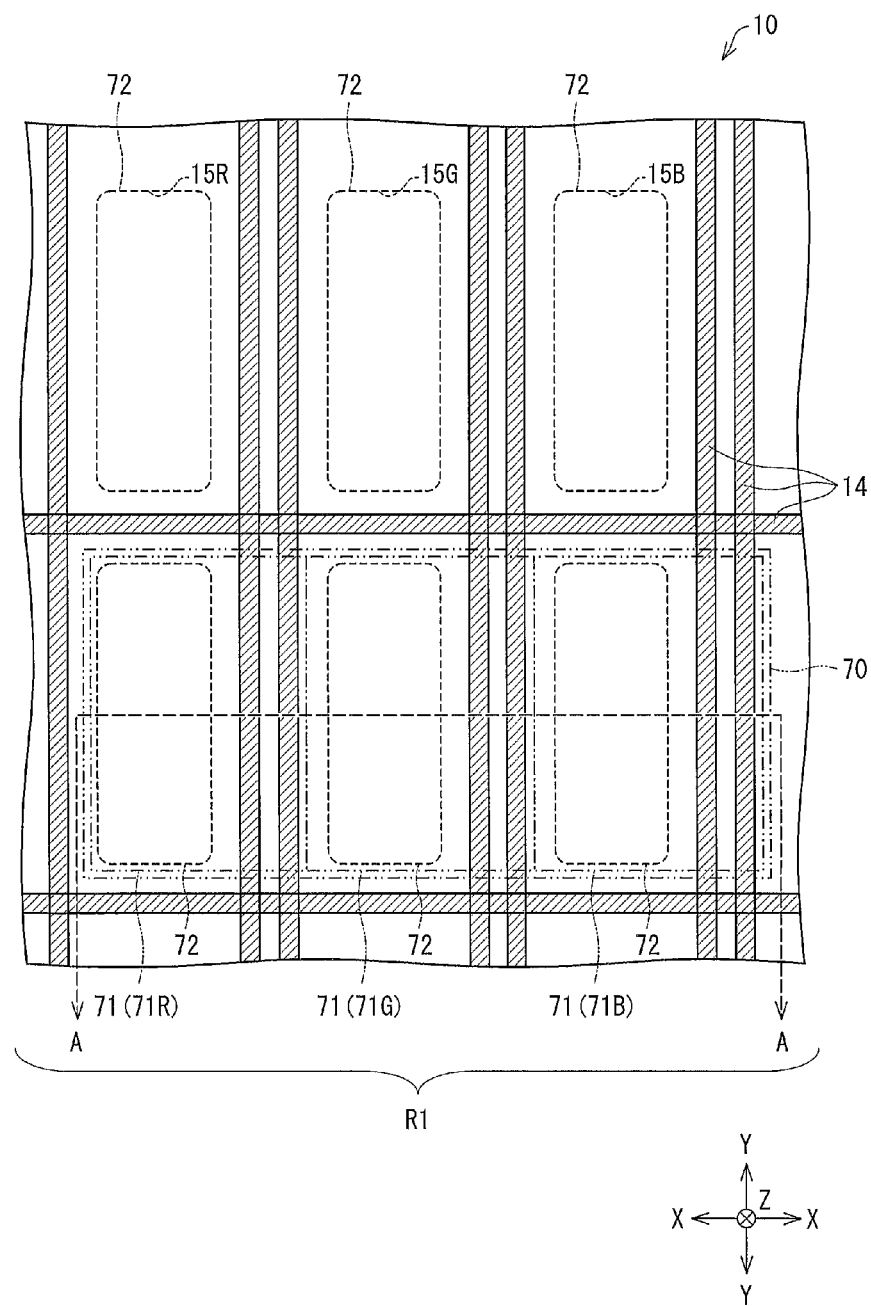
FIG. 4 is a plan view illustrating a configuration of a main part in a display region of the supporting substrate illustrated in FIG. 3.
Figure 5:
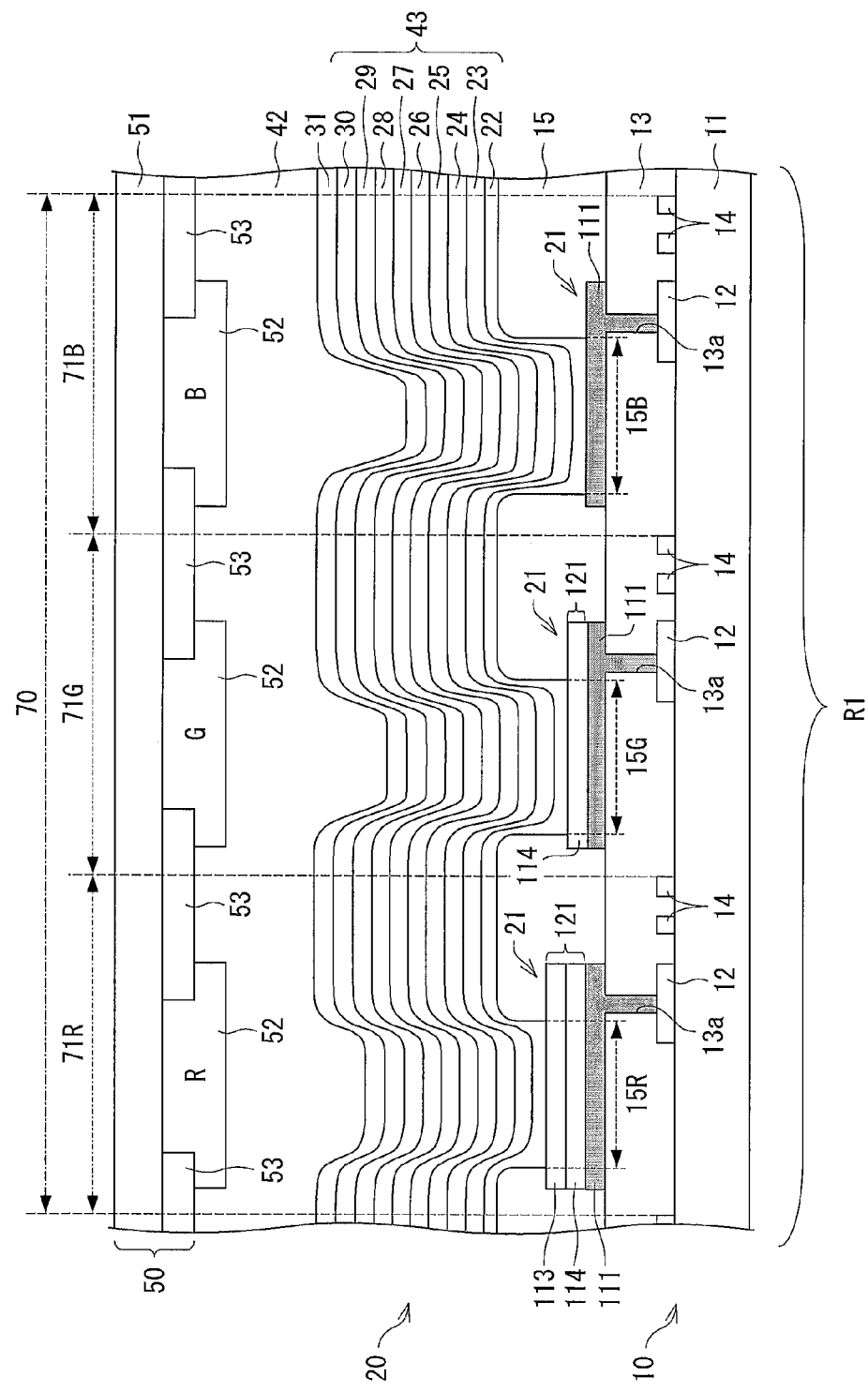
FIG. 5 is a cross-sectional view schematically illustrating a configuration of the organic EL display panel in accordance with Embodiment 1, which is taken along the line A-A of FIG. 4.

FIG. 4 is a plan view illustrating a configuration of a main part in the display region R1 of the supporting substrate 10. FIG. 5 is a cross-sectional view schematically illustrating a configuration of the organic EL display panel 1, which is taken along the line A-A of FIG. 4.

As illustrated in FIG. 4 and FIG. 5, the display region R1 is constituted by a plurality of pixels 70 in which organic EL elements 20 are formed.

Each of the pixels 70 is constituted by the plurality of sub-pixels 71. The organic EL display device 100 is a full-color active matrix organic EL display device. As illustrated in FIG. 5, for example, three sub-pixels 71R, 71G, and 71B, i.e., a sub-pixel 71 for emitting red (R) light (hereinafter, referred to as "sub-pixel 71R"), a sub-pixel 71 for emitting green (G) light (hereinafter, referred to as "sub-pixel 71G"), and a sub-pixel 71 for emitting blue (B) light (hereinafter, referred to as "sub-pixel 71B") constitute one (1) pixel 70.

The sub-pixels 71, which are constituted by the respective organic EL elements 20 for emitting any of red light, green light, and blue light, are arrayed in a matrix in the display region R1. In the present embodiment, the sub-pixels 71R, 71G, and 71B are arrayed so that, in the active surface of the supporting substrate 10, sub-pixels 71 for emitting light of identical color are adjacent to each other in one of an X-axis direction (lateral direction) and a Y-axis direction (longitudinal direction) (e.g., in the X-axis direction) and sub-pixels 71 for emitting light of different colors are adjacent to each other in the other of the directions (e.g., Y-axis direction).

As illustrated in FIG. 4 and FIG. 5, in the display region R1, a plurality of signal lines 14 (wires) are arranged in the X-axis direction and in the Y-axis direction.

The signal lines 14 are constituted by, for example, a plurality of lines for selecting pixels (gate lines), a plurality of lines for writing data (source lines), and a plurality of lines for supplying electric power to the organic EL elements 20 (power source lines).

Note that, for example, the gate lines are provided in the X-axis direction and the source lines are provided in the Y-axis direction so as to intersect with the gate lines.

The gate lines are connected to a gate line driving circuit (not illustrated) for driving the gate lines, and the source lines are connected to a data line driving circuit (not illustrated) for driving the source lines.

The sub-pixels 71 are arrayed in respective regions surrounded by the signal lines 14. That is, one (1) region surrounded by any four of signal lines 14 is one (1) sub-pixel 71, and luminescent regions 72 of different colors are defined in respective sub-pixels 71.

The signal lines 14 are connected to an external circuit of the circuit section 102 on the outside of the display region R1. By supplying an electric signal to the signal lines 14 from the circuit section 102, the organic EL elements 20 located at intersections of the signal lines 14 can be driven (can emit light).

In each of the sub-pixels 71R, 71G, and 71B, the TFT 12 connected to a first electrode 21 of the organic EL element 20 is provided.

The signal lines 14 are connected to the TFTs 12 provided in the respective sub-pixels 71. In a case of the active matrix type, at least one TFT 12 is provided in each of the sub-pixels 71.

Note that, in each of the sub-pixels 71, a capacitor for retaining a written voltage or/and a compensation circuit for compensating characteristic variations of the TFTs 12 may be further formed.

A light intensity of each of the sub-pixels 71 is determined by scanning of the signal lines 14 and by selecting of the TFTs 12. The organic EL display device 100 displays an image with the use of the TFTs 12 by selectively causing the organic EL elements 20 to emit light at a desired luminance.

<Cross-Sectional Configuration of Supporting Substrate 10>

As illustrated in FIG. 4 and FIG. 5, the supporting substrate 10 includes the insulating substrate 11 as a base substrate.

As illustrated in FIG. 5, in the display region R1, the supporting substrate 10 is configured such that the TFTs 12 (switching elements), the signal lines 14, interlayer insulating film 13 (planarization film), and an edge cover 15 are formed on the transparent insulating substrate 11 such as a glass substrate.

On the insulating substrate 11, the signal lines 14 are provided and the TFTs 12 are provided in correspondence with the sub-pixels 71R, 71G, and 71B. Note that a configuration of the TFTs is conventionally known. Further, the TFTs 12 are manufactured by a known method. Therefore, drawings and description of layers of the TFTs 12 are omitted.

The interlayer insulating film 13 is formed on the insulating substrate 11 over an entire region of the insulating substrate 11 so as to cover the sub-pixels 71R, 71G, and 71B and the signal lines 14.

On the interlayer insulating film 13, the first electrodes 21 of the respective organic EL elements 20 are formed.

On the interlayer insulating film 13 is provided contact holes 13a for electrically connecting the TFTs 12 to the first electrodes 21 of the organic EL elements 20, respectively. As such, the TFTs 12 are electrically connected to the organic EL elements 20 via the contact holes 13a.

The edge cover 15 is an insulating layer (barrier) for preventing a short circuit between the first electrode 21 and the second electrode 31 of the organic EL element 20, which short circuit is caused in an end part (pattern edge) of the first electrode 21 when an organic EL layer 43 (described later) becomes thinner or an electric field concentration occurs.

The edge cover 15 is formed on the interlayer insulating film 13 so as to cover the end parts (pattern edges) of the first electrodes 21.

In the edge cover 15, openings 15R, 15G, and 15B are provided in the sub-pixels 71R, 71G, and 71B, respectively. Therefore, as illustrated in FIG. 5, the first electrodes 21 are exposed at parts which are not covered by the edge cover 15 (i.e., at the openings 15R, 15G, and 15B). Such exposed parts become luminescent regions 72 of the sub-pixels 71R, 71G, and 71B.

<Configuration of Organic EL Element 20>

In the present embodiment, full-color image display is achieved, with the use of a luminescent layer which emits white (W) light, by introducing a microcavity structure into each of the sub-pixels 71 as described above.

At this time, by using the CF layer 52 together as described above, a spectrum of light emitted from the organic EL element 20 can be adjusted by the CF layer 52.

Each of the organic EL elements 20 is a light-emitting element capable of emitting light at a high luminance with low-voltage direct-current driving, and the first electrode 21, the organic EL layer 43, and the second electrode 31 are stacked in this order.

The first electrode 21 is a layer having a function of injecting (supplying) positive holes to the organic EL layer 43. The first electrode 21 is connected to the TFT 12 via the contact hole 13a.

The second electrode 31 is a layer having a function of injecting (supplying) electrons to the organic EL layer 43.

In a case where the luminescent layer and the CF layer 52, which emit white light, are thus combined with each other, a carrier transport layer (hole transfer layer, electron transfer layer) and a luminescent layer are stacked via a carrier generation layer.

Specifically, as illustrated in FIG. 5, a hole injection layer 22, a hole transfer layer 23, a first luminescent layer 24, an electron transfer layer 25, a carrier generation layer 26, a hole transfer layer 27, a second luminescent layer 28, an electron transfer layer 29, and electron injection layer 30 are formed, as the organic EL layer 43, in this order from the first electrode 21 between the first electrode 21 and the second electrode 31. Note that the first luminescent layer 24 and the second luminescent layer 28 are different in emission light color, and white light can be obtained by combining the both colors with each other.

Examples of such a combination of emission light colors encompass a combination of blue light and orange light, a combination of blue light and yellow light, etc. Further, as described later, in a case where white light is obtained by combining three colors of emitted light, i.e., by stacking the first luminescent layer 24, the second luminescent layer 28, and, in addition, a third luminescent layer, the combination of emission light colors is, for example, red light, blue light, and green light.

Note that, in the present embodiment, a luminescent layer which emits blue light is formed as the first luminescent layer 24, and a luminescent layer which emits orange light is formed as the second luminescent layer 28.

In a case where the first luminescent layer 24 and the second luminescent layer 28 are thus stacked as luminescent layers, light can be obtained, by the organic EL element 20, from a combination of lights emitted from the first luminescent layer 24 and the second luminescent layer 28 on which combination of lights the microcavity effect is exerted. Further, by adjusting the light with the use of the CF layer 52 provided in the sealing substrate 50, it is possible to take out light having a desired spectrum to the outside. By thus combining the luminescent layer emitting white light, the microcavity effect, and the CF layer 52, it is possible to improve a color purity.

The hole injection layer 22 is a layer having a function of improving an efficiency of injecting positive holes from the first electrodes 21 to the organic EL layer 43. Meanwhile, the electron injection layer 30 is a layer having a function of improving an efficiency of injecting electrons from the second electrode 31 to the organic EL layer 43.

The hole transfer layer 23 is a layer having a function of improving a positive hole transport efficiency to the first luminescent layer 24, and the hole transfer layer 27 is a layer having a function of improving a positive hole transport efficiency to the second luminescent layer 28.

Meanwhile, electron transfer layer 25 is a layer having a function of improving an electron transport efficiency to the first luminescent layer 24, and the electron transfer layer 29 is a layer having a function of improving an electron transport efficiency to the second luminescent layer 28.

The first luminescent layer 24 and the second luminescent layer 28 are independently a layer having a function of emitting light by recombining positive holes injected from the first electrode 21 with electrons injected from the second electrode 31. The first luminescent layer 24 and the second luminescent layer 28 are made from a material having a high light emission efficiency, such as a low-molecular fluorescent pigment or a metal complex.

The carrier generation layer 26 is a layer for supplying electrons to the first luminescent layer 24 and supplying positive holes to the second luminescent layer 28.

That is, assuming that a hole transfer layer, a luminescent layer, and an electron transfer layer are considered as one unit, a unit on a first-luminescent-layer-24 side and another unit on a second-luminescent-layer-28 side are connected to each other via the carrier generation layer 26.

In the organic EL display device 100 formed by combining the luminescent layers (e.g., the first luminescent layer 24 and the second luminescent layer 28), which emit white light, with the CF layers 52 as described above, colors of light emitted from the sub-pixels 71 are changed by the microcavity effect, by the CF layers 52, or by other methods. Therefore, it is unnecessary to selectively form the luminescent layers between the sub-pixels 71.

Therefore, in the present embodiment, as illustrated in FIG. 5, the hole injection layer 22, the hole transfer layer 23, the first luminescent layer 24, the electron transfer layer 25, the carrier generation layer 26, the hole transfer layer 27, the second luminescent layer 28, the electron transfer layer 29, the electron injection layer 30, and the second electrode 31 are uniformly formed over the entire display region R1 of the supporting substrate 10 so as to cover the first electrodes 21 and the edge cover 15.

Note that, in FIG. 5, there has been exemplified the case where (i) a hole transfer layer, a luminescent layer, and an electron transfer layer are considered as one unit and (ii) the unit on the first-luminescent-layer-24 side and the unit on the second-luminescent-layer-28 side are connected to each other via the carrier generation layer 26. Note, however, that the present embodiment is not limited to this.

For example, a unit having a third luminescent layer may be provided similarly, or four or more units may be provided.

Further, the present embodiment may have a stacking structure in which the third luminescent layer is directly stacked on the second luminescent layer 28.

Furthermore, a carrier blocking layer (not illustrated) for stopping a flow of carriers such as positive holes and electrons may be provided as necessary. For example, by adding a positive hole blocking layer as a carrier blocking layer between the luminescent layer and the electron transfer layer, positive holes are prevented from entering the electron transfer layer. This makes it possible to improve the light emission efficiency. Similarly, by adding an electron blocking layer as a carrier blocking layer between the luminescent layer and the hole transfer layer, electrons are prevented from entering the hole transfer layer.

Alternatively, an electron injection layer may be inserted between the electron transfer layer and the carrier generation layer.

As an example configuration of the organic EL element 20, the following layer configurations (1) through (8) and combinations thereof can be employed:

(1) First electrode/hole injection layer/hole transfer layer/luminescent layer (first luminescent layer)/electron transfer layer/carrier generation layer/hole transfer layer/luminescent layer (second luminescent layer)/electron transfer layer/electron injection layer/second electrode (2) First electrode/hole injection layer/hole transfer layer/luminescent layer (first luminescent layer)/electron transfer layer/electron injection layer/carrier generation layer/hole transfer layer/luminescent layer (second luminescent layer)/electron transfer layer/electron injection layer/second electrode (3) First electrode/hole injection layer/hole transfer layer/luminescent layer (first luminescent layer)/positive hole blocking layer/electron transfer layer/carrier generation layer/hole transfer layer/luminescent layer (second luminescent layer)/positive hole blocking layer/electron transfer layer/electron injection layer/second electrode (4) First electrode/hole injection layer/hole transfer layer/electron blocking layer/luminescent layer (first luminescent layer)/positive hole blocking layer/electron transfer layer/electron injection layer/carrier generation layer/hole transfer layer/electron blocking layer/luminescent layer (second luminescent layer)/positive hole blocking layer/electron transfer layer/electron injection layer/second electrode (5) First electrode/hole injection layer/hole transfer layer/luminescent layer (first luminescent layer)/electron transfer layer/carrier generation layer/hole transfer layer/luminescent layer (second luminescent layer)/electron transfer layer/carrier generation layer/hole transfer layer/luminescent layer (third luminescent layer)/electron transfer layer/electron injection layer/second electrode (6) First electrode/hole injection layer/hole transfer layer/electron blocking layer/luminescent layer (first luminescent layer)/positive hole blocking layer/electron transfer layer/electron injection layer/carrier generation layer/hole transfer layer/electron blocking layer/luminescent layer (second luminescent layer)/positive hole blocking layer/electron transfer layer/electron injection layer/carrier generation layer/hole transfer layer/electron blocking layer/luminescent layer (third luminescent layer)/positive hole blocking layer/electron transfer layer/electron injection layer/second electrode (7) First electrode/hole injection layer/hole transfer layer/luminescent layer (first luminescent layer)/electron transfer layer/carrier generation layer/hole transfer layer/luminescent layer (second luminescent layer)/luminescent layer (third luminescent layer)/electron transfer layer/electron injection layer/second electrode (8) First electrode/hole injection layer/hole transfer layer/electron blocking layer/luminescent layer (first luminescent layer)/positive hole blocking layer/electron transfer layer/electron injection layer/carrier generation layer/hole transfer layer/electron blocking layer/luminescent layer (second luminescent layer)/luminescent layer (third luminescent layer)/positive hole blocking layer/electron transfer layer/electron injection layer/second electrode The present embodiment has exemplified the case where (i) the carrier transport layers (i.e., the hole transfer layer, the electron transfer layer) and luminescent layers for emitting white light (i.e., the first luminescent layer 24, the second luminescent layer 28) are provided via the carrier generation layers, and (ii) at least two luminescent layers, i.e., the first luminescent layer 24 and the second luminescent layer 28, are provided as the luminescent layers for emitting white light.

However, organic layers other than the luminescent layers are not necessary layers as the organic EL layer 43, and it is sufficient as long as at least one luminescent layer is provided. The configuration of the organic EL layer 43 may be formed as appropriate in accordance with a property desired for the organic EL element 20.

Therefore, as an example, the organic EL element 20 may have a layer configuration (9):
(9) First electrode/hole injection layer/hole transfer layer/luminescent layer (first luminescent layer)/electron transfer layer/electron injection layer/second electrode One (1) layer may have a plurality of functions, and, for example, a hole injection layer and a hole transfer layer may be formed as independent layers or may be integrally provided. That is, as a hole injection layer and a hole transfer layer, there may be provided a hole injection layer/hole transfer layer in which a hole injection layer and a hole transfer layer are integrally formed.

Similarly, an electron transfer layer and an electron injection layer may be independently formed or may be integrally formed as the electron transfer layer/electron injection layer.

Note that the order of stacking layers is determined on the assumption that the first electrode 21 serves as an anode and the second electrode 31 serves as a cathode. In a case where the first electrode 21 serves as a cathode and the second electrode 31 serves as an anode, the order of stacking layers in the organic EL layer 43 is inverted.

Note that, in a case of the bottom emission organic EL element 20, the first electrode 21 is made from a semitransparent electrode, and the second electrode 31 is made from a reflecting electrode.

On the contrary, in a case of the top emission organic EL element 20, the first electrode 21 is made from a reflecting electrode, and the second electrode 31 is made from a semitransparent electrode.

Note that the configuration of the organic EL element 20 is not limited to the layer configurations exemplified above, and a desired layer configuration can be employed in accordance with a property desired for the organic EL element 20.

<Method for Displaying Image>

Figure 6:
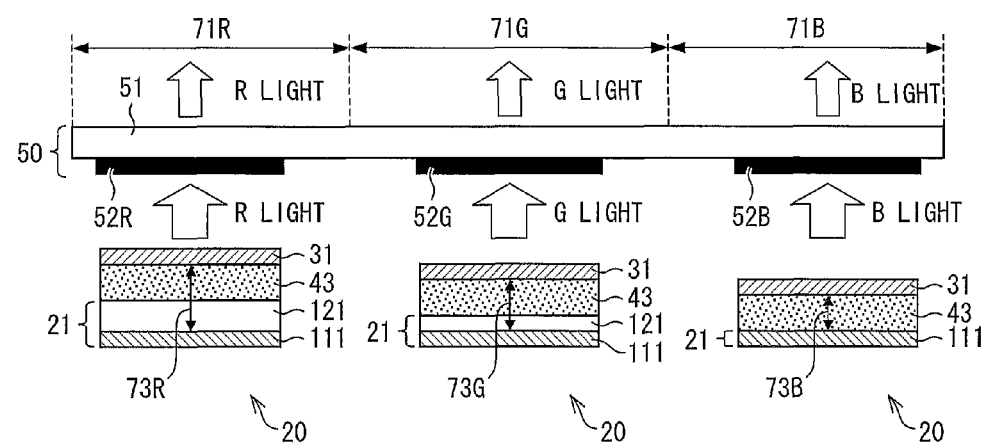
FIG. 6 is a schematic view for explaining a method for displaying an image by the organic EL display device in accordance with Embodiment 1.

FIG. 6 is a schematic view for explaining a method for displaying an image by the organic EL display device 100 in accordance with the present embodiment. Note that, in FIG. 6, a main part of an optical path of the organic EL element 20 is simply illustrated.

The organic EL element 20 in accordance with the present embodiment has a microcavity structure.

The microcavity means a phenomenon in which, by multiply reflecting emitted light between an anode and a cathode to resonate the emitted light, an emission spectrum is steeply changed and a light intensity of a peak wavelength is amplified.

The microcavity effect can be obtained by, for example, optimally designing reflectivities and film thicknesses of an anode and a cathode, a film thickness of an organic layer, etc.

The organic EL element 20 in accordance with the present embodiment is a top emission organic EL element. As illustrated in FIG. 6, the second electrode 31, which is a cathode and from which emitted light is taken out, functions as a semitransparent electrode (semitransparent reflecting electrode), meanwhile, the first electrode 21, which is an anode and from which emitted light is not taken out, has a reflecting electrode layer 111 and therefore functions as a reflecting electrode.

According to the configuration, light emitted from the luminescent layers (in the example illustrated in FIG. 5, the first luminescent layer 24 and the second luminescent layer 28) of the organic EL layer 43, which is provided between the first electrodes 21 and the second electrode 31, is repeatedly reflected between the reflecting electrode layer 111 of the first electrode 21 and the second electrode 31.

At this time, as illustrated in FIG. 6, optical path lengths 73R, 73G, and 73B of the sub-pixels 71R, 71G, and 71B of the organic EL elements 20, respectively, are made different for each emission light color, and therefore the light emitted from the luminescent layers goes and returns between the second electrode 31 and the reflective layers of the respective first electrodes 21. This amplifies an intensity of light having a certain wavelength.

In the present embodiment, a transparent electrode layer 121 is provided on each of the reflecting electrode layers 111, and film thicknesses of the respective transparent electrode layers 121 vary for each of the sub-pixels 71R, 71G, and 71B. This makes the optical path lengths 73R, 73G, and 73B different from each other between the sub-pixels 71R, 71G, and 71B of the organic EL elements 20, respectively.

Specifically, as illustrated in FIG. 5 and FIG. 6, in the present embodiment, the film thickness of the transparent electrode layer 121 varies between the sub-pixel 71R, 71G, and 71B in such a manner that, (i) in the sub-pixel 71B, the first electrode 21 is constituted only by the reflecting electrode layer 111, (ii) in the sub-pixel 71R, the first electrode 21 is constituted by a stacking structure of the reflecting electrode layer 111 and the transparent electrode layer 121 including two layers, and (iii) in the sub-pixel 71G, the first electrode 21 is constituted by a stacking structure of the reflecting electrode layer 111 and the transparent electrode layer 121 including one (1) layer.

In the examples illustrated in FIG. 5 and FIG. 6, the film thickness of the transparent electrode layer 121 in the sub-pixel 71B is set to 0 (zero). Note, however, that a transparent electrode layer 121 may be provided also in the sub-pixel 71B as described in an embodiment below. Moreover, the number of the transparent electrode layer(s) 121 stacked on the reflecting electrode layer 111 in each of the sub-pixels 71R and 71G is not limited to one and two.

As described above, the microcavity effect is changed by making different the film thicknesses of the transparent electrode layers 121 between the sub-pixels 71R, 71G, and 71B, and it is therefore possible to adjust colors of emitted light.

The optical path lengths 73R, 73G, and 73B of the organic EL elements 20 in the sub-pixels 71R, 71G, and 71B, i.e., optical distances of optical paths in the sub-pixels 71R, 71G, and 71B in the microcavity structure are set to have a given relationship with respect to a wavelength of light to be resonated.

That is, by adjusting a distance between the reflecting electrode layer 111 of the first electrode 21 and the second electrode 31 in each of the sub-pixels 71R, 71G, and 71B as described above, an intensity of light having a wavelength of a matching optical path length is increased by resonance, and therefore only light, whose wavelength conforms to the optical path length, is emitted from the second electrode 31 side. Meanwhile, intensities of light having wavelengths of optical path lengths other than the matching optical path length are decreased.

Therefore, each of the optical path lengths 73R, 73G, and 73B is set in accordance with a color of light emitted from the second electrode 31.

As described in the present embodiment, in a case where display colors of the sub-pixels 71 are, for example, R, G, and B, the film thicknesses of the transparent electrode layers 121 of the sub-pixels 71R, 71G, and 71B are set so that (i) the optical path lengths 73R, 73G, and 73B match with light spectrum peak wavelengths of colors R, G, and B and (ii) the optical path lengths 73R, 73G, and 73B are reduced in the order of the optical path length 73R>the optical path length 73G>the optical path length 73B.

Note, however, that, because there are plural optical path lengths suitable for resonance of each light, the order of the optical path length 73R>optical path length 73G>optical path length 73B is not necessarily needed, and other relationships may be employed.

That is, the transparent electrode layer 121 which overlaps with the organic EL layer 43 for red light is set to have a thickness suitable for resonance of the red light, the transparent electrode layer 121 which overlaps with the organic EL layer 43 for green light is set to have a thickness suitable for resonance of the green light, and the transparent electrode layer 121 which overlaps with the organic EL layer 43 for blue light is set to have a thickness (in the present embodiment, the thickness is zero) suitable for resonance of the blue light. This makes it possible to emit light having a high color purity, and it is therefore possible to improve a color reproducibility of the organic EL display device 100.

<Method for Manufacturing Organic EL Display Device 100>

The following description will discuss a method for manufacturing the organic EL display device 100 in accordance with the present embodiment.

Materials of layers of the organic EL element 20 and a method for stacking the layers will be schematically described.

<Schematic Description of Materials of Layers of Organic EL Element 20 and Method for Stacking Layers>

The first electrodes 21 in the respective sub-pixels 71R, 71G, and 71B are formed by (i) forming a film of an electrode material by sputtering or the like and then (ii) patterning the film by photolithography, etching, or the like for the sub-pixels 71R, 71G, and 71B.

Although various electrically conductive materials can be used as the first electrode 21, it is necessary to use a semitransparent material as described above in a case where the organic EL element 20 is the bottom emission type which emits light from the insulating substrate 11 side.

On the other hand, in a case where the organic EL element 20 is the top emission type which emits light from a side opposite to the insulating substrate 11, the second electrode 31 needs to be semitransparent.

In a case where the organic EL element 20 is the top emission type, the reflecting electrode layer 111 of the first electrode 21 is preferably an opaque electrode. Examples of the reflecting electrode material for use in the reflecting electrode layer 111 encompass Ag (silver), an Ag alloy, Al (aluminum), an Al alloy, and a stacked body (stacked film) having layers made from the above electrode materials.

Examples of the transparent electrode material for use in the transparent electrode layer 121 encompass ITO (indium tin oxide), IZO (indium zinc oxide), and gallium-added zinc oxide (GZO).

The second electrode 31 is preferably a semitransparent electrode. Examples of the semitransparent electrode encompass (i) a single metal semitransparent electrode and (ii) a stacked boy of a metal semitransparent electrode layer and a transparent electrode layer. In view of a reflectance and a transmittance, silver is preferable.

Examples of a method for stacking the first electrode 21 and the second electrode 31 encompass sputtering, vacuum vapor deposition, CVD (chemical vapor deposition), plasma CVD, and printing.

In the present embodiment, in order to control a color of emission light by a difference in optical path length, the microcavity structure is introduced into the sub-pixels 71R, 71G, and 71B by making different the thickness of the transparent electrode layer 121 between the sub-pixels 71R, 71G, and 71B in the first electrodes 21 or in the second electrode 31 (in the examples illustrated in FIG. 5 and FIG. 6, in the first electrodes 21).

Note that a method for introducing the microcavity structure into the sub-pixels 71R, 71G, and 71B by thus making different the thickness of the transparent electrode layer 121 will be described later in detail.

The organic EL layer 43 can be made from a known material.

Examples of materials for the hole injection layer, the hole transfer layer, or the hole injection layer/hole transfer layer encompass: anthracene; azatriphenylene; fluorenone; hydrazone; stilbene; triphenylene; benzine; styryl amine; triphenylamine; porphyrin; triazole; imidazole; oxadiazole; oxazole; polyarylalkane; phenylenediamine; arylamine; and derivatives thereof; and a monomer, an oligomer, and a polymer of a chain conjugated system and a cyclic conjugated system, such as a thiophene compound, a polysilane compound, a vinylcarbazole compound, and an aniline compound.

Examples of materials for the electron transfer layer, the electron injection layer, or the electron transfer layer/electron injection layer encompass tris(8-quinolinate) aluminum complex, oxadiazole derivative, triazole derivative, phenylquinoxaline derivative, and silole derivative.

An example of the material for the luminescent layer encompasses a material having a high light emission efficiency such as a low-molecular fluorescent pigment or a metal complex. Examples of the material encompass anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof, tris(8-quinolinate) aluminum complex, bis(benzo quinolinolato)beryllium complex, tri(dibenzoylmethyl) phenanthroline europium complex, ditoluyl vinyl biphenyl, hydroxyphenyl oxazole, and hydroxyphenyl thiazole.

Note that a luminescent layer may be made from a single material, or from a mixed material obtained by mixing a material serving as a host material with another material serving as a guest material or as a dopant.

Examples of a material for the carrier generation layer encompass: metal oxides such as molybdenum oxide and vanadium pentoxide; materials formed by co-vapor depositing the above materials with an aromatic polycyclic hydrocarbon or with a carbazole derivative; metal thin films made from Au, Ag, and the like; and transparent electrode layers made from IZO, ITO, and the like.

<Method for Manufacturing Organic EL Display Device 100>

The following description will discuss a method for manufacturing the organic EL display device 100.

Note, however, that the size, the material, the shape, etc. of each constituent element in the present embodiment are merely one embodiment, and therefore the scope of the present invention should not be limited to this embodiment.

A flow of manufacturing steps of the organic EL display device 100 will be schematically described below with reference to FIG. 7.

Figure 7:
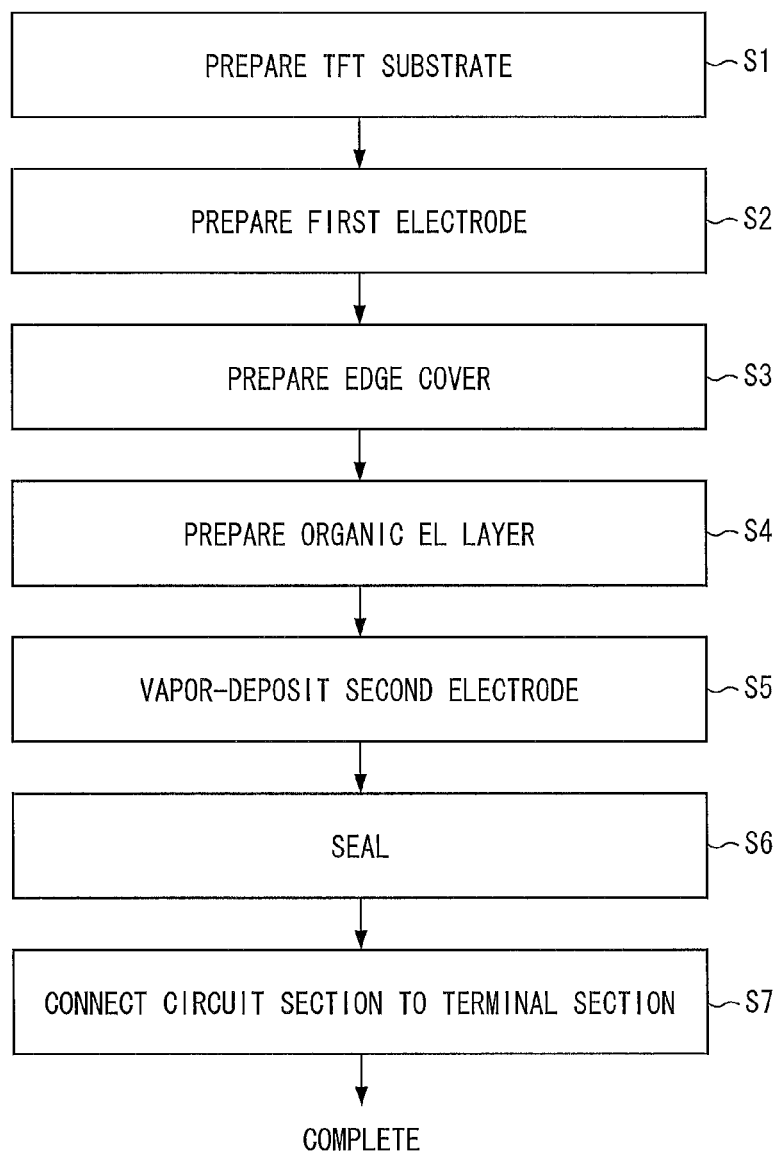
FIG. 7 is a flowchart illustrating successive steps in an example method for manufacturing the organic EL display device in accordance with Embodiment 1.

FIG. 7 is a flowchart illustrating successive steps in an example method for manufacturing the organic EL display device 100.

As described above, the order of stacking layers in the present embodiment is determined on the assumption that the first electrode 21 is used as an anode and the second electrode 31 is used as a cathode. Therefore, in a case where the first electrode 21 is used as a cathode and the second electrode 31 is used as an anode, the materials and the thicknesses of the first electrode 21 and the second electrode 31 are inverted.

In the step S1, as illustrated in FIG. 5, the TFTs 12, the signal lines 14, the interlayer insulating film 13, and the contact holes 13a are formed in the display region R1 of the insulating substrate 11 by a known method.

In a case where the top emission organic EL display device 100 is manufactured as in the present embodiment, a glass substrate, such as a non-alkali glass substrate, or a plastic substrate having a plate thickness of 0.7 mm to 1.1 mm is used as the insulating substrate 11.

Note that a size of the insulating substrate 11 in the X-axis direction and in the Y-axis direction may be set appropriately in accordance with usage or the like, and therefore is not particularly limited. Note that, in the present embodiment, a non-alkali glass substrate having the plate thickness of 0.7 mm is used.

The interlayer insulating film 13 and the contact holes 13a are formed, with the use of a publicly-known technique, by (i) applying photosensitive resin to the insulating substrate 11 on which the TFTs 12, the signal lines 14, and the like have been formed and (ii) patterning the photosensitive resin by photolithography.

Note that, as the interlayer insulating film 13, a known photosensitive resin can be used. The photosensitive resin is, for example, acrylic resin or polyimide resin. A film thickness of the interlayer insulating film 13 is not limited to a specific one, provided that the interlayer insulating film 13 can compensate a height difference caused by the TFTs 12. In the present embodiment, for example, acrylic resin is formed into a film having a film thickness of 2 µm.

Note that, in this step, the signal lines 14, such as gate lines and source lines, for driving the TFTs 12 are patterned to be extended to the terminal section regions R3. Further, in this step, for example, the connection parts 60 are patterned in the second electrode connection region R2 (see FIG. 3).

Then, the first electrodes 21, whose thicknesses are different from each other between the sub-pixels 71R, 71G, and 71B, are formed in the step S2. Note that, as described above, a method for preparing the first electrodes 21 in a case where the organic EL display device 100 is the top emission type will be described later in detail.

Subsequently, in the step S3, the edge cover 15 is formed on the interlayer insulating film 13 so as to cover the end parts (pattern edges) of the first electrodes 21 and to have the openings 15R, 15G, and 15B in the sub-pixels 71R, 71G, and 71B, respectively (see FIG. 4).

As with the interlayer insulating film 13, the edge cover 15 can be formed with the use of known photosensitive resin. Examples of the photosensitive resin encompass acrylic resin and polyimide resin.

In order to compensate a height difference caused by a difference in layer thickness between the first electrodes 21 of adjacent sub-pixels 71 and to prevent short circuit between the end parts of the first electrodes 21 and the second electrode 31, the edge cover 15 is set to have a height of, for example, about 1 µm from a surface of the first electrode 21, which has the largest film thickness, of the sub-pixel 71R.

In the present embodiment, the edge cover 15 made from acrylic resin is patterned to have a height of about 1.2 µm from a surface of the interlayer insulating film 13 so that the height of the edge cover 15 from the surface of the first electrode 21 in the sub-pixel 71R becomes about 1 µm.

By carrying out the above steps, the supporting substrate 10 is prepared on which the first electrodes 21 and the edge cover 15 are formed.

In the step S4, the supporting substrate 10, which has been subjected to such steps as described above, is subjected to a low-pressure bake for dehydration and an oxygen plasma treatment for washing surfaces of the first electrodes 21. Subsequently, as illustrated in FIG. 5, the organic EL layer 43 is formed in the entire display region R1 of the supporting substrate 10 so as to cover the first electrodes 21 and the edge cover 15. Note that a method for preparing the organic EL layer 43 will be concretely described later.

After that, in the step S5, the second electrode 31 is formed by a known method. Specifically, the second electrode 31 is formed in the entire display region R1 and, in order to be electrically connected to the connection parts 60 in the second electrode connection regions R2, the second electrode 31 is patterned by, for example, the vapor deposition method with the use of a mask for vapor deposition so that the connection parts 60 in the second electrode connection regions R2 are exposed. Note that, as a method for preparing the second electrode 31, a similar method to the method for preparing the organic EL layer 43 can be employed.

The film thickness of the second electrode 31 is preferably 10 nm to 30 nm. In a case where the film thickness of the second electrode 31 is less than 10 nm, light cannot be reflected enough and therefore the microcavity effect may not be sufficiently achieved. On the contrary, in a case where the film thickness of the second electrode 31 exceeds 30 nm, a transmittance of light may be decreased to reduce a luminance of the light. In the present embodiment, the second electrode 31 is made from Ag to have the film thickness of 20 nm.

In this way, the organic EL element 20 including the first electrodes 21, the organic EL layer 43, and the second electrode 31 is formed on the supporting substrate 10.

In the step S6, as illustrated in FIG. 2, the supporting substrate 10, on which the organic EL element 20 is formed, and the sealing substrate 50 are attached to each other with the use of the sealing resin layer 41 such that the organic EL element 20 is sealed.

This sealing of the organic EL element 20 can be carried out, for example, as follows.

First, as illustrated in FIG. 2, the sealing resin layer 41 is formed in a frame-like sealing region L that surrounds (i) the display region R1 and (ii) the second electrode connection region R2 of the supporting substrate 10 (see FIG. 3).

Next, as a protective film for preventing oxygen and/or moisture from infiltrating the organic EL element 20 from the outside, an adhesive filler resin layer 42 containing a desiccating agent is provided so as to (i) fill a space surrounded by the supporting substrate 10 and the sealing resin layer 41 and (ii) cover the second electrode 31.

For example, epoxy resin is used to form the filler resin layer 42. The film thickness of the filler resin layer 42 is, for example, 1 μm to 20 μm.

Subsequently, the supporting substrate 10 and the sealing substrate 50 are attached to each other via the sealing resin layer 41.

As such, the organic EL element 20 is sealed by the supporting substrate 10, the sealing substrate 50, the sealing resin layer 41, and the filler resin layer 42.

As the sealing substrate 50, for example, there is used an insulating substrate, such as a glass substrate or a plastic substrate which has a plate thickness of 0.4 mm to 1.1 mm. In the present embodiment, a non-alkali glass substrate having a plate thickness of 0.7 mm is employed.

Subsequently, in the step S7, as illustrated in FIG. 2, the electric wiring terminal 2 in the terminal section region R3 of the supporting substrate 10 is connected to the connection terminal 103 of the circuit section 102 via, for example, an ACF (anisotropic conductive film) (not illustrated). In this way, the organic EL display device 100 is manufactured.

Note that the size of the sealing substrate 50 in the X-axis direction and in the Y-axis direction may be appropriately adjusted in accordance with an intended size of the organic EL display device 100. Alternatively, the size of the sealing substrate 50 may be determined by being cut in accordance with the intended size of the organic EL display device 100 after sealing the organic EL element 20 with the use of an insulating substrate having a size substantially identical with that of the insulating substrate 11 of the supporting substrate 10.

<Flow of Preparing Organic EL Layer 43>

Next, the following description will schematically discuss a flow of preparing the organic EL layer 43 in the step S4 while exemplifying the organic EL display device 100 having the configuration illustrated in FIG. 5.

Figure 8:
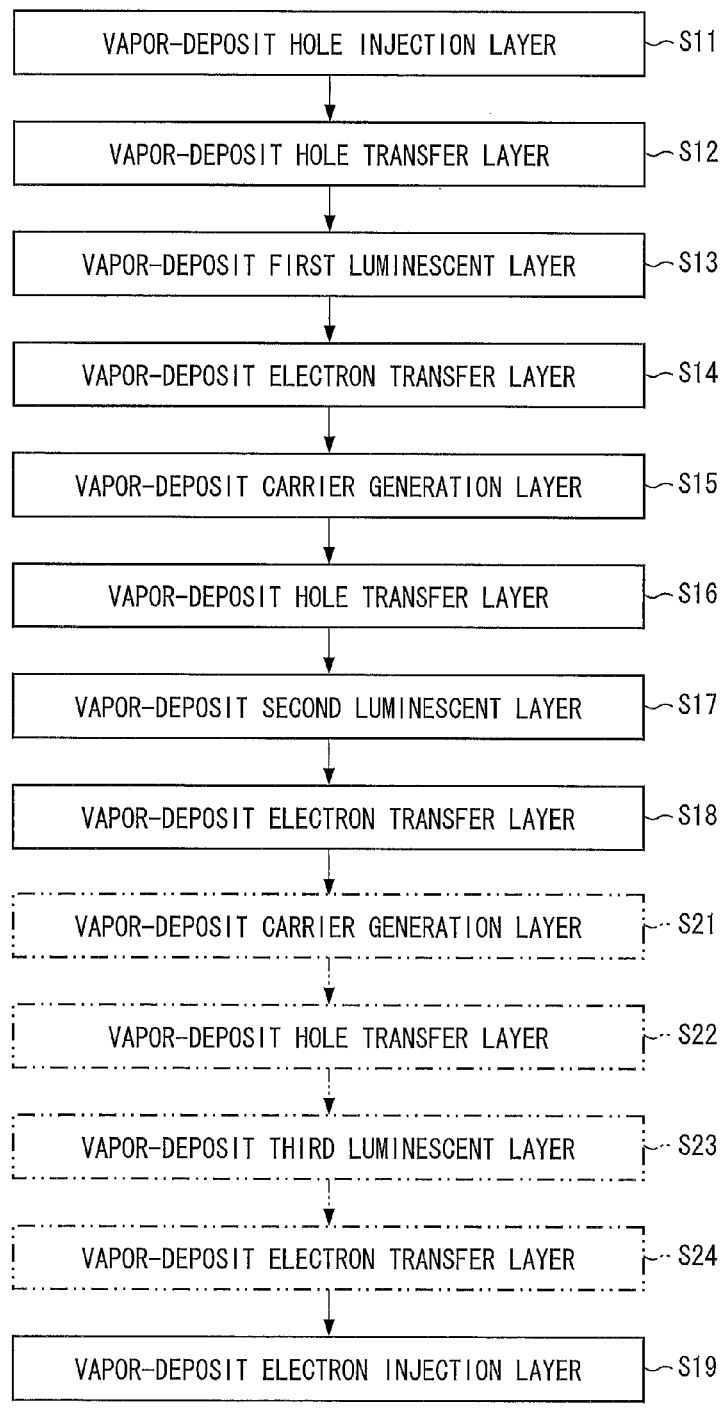
FIG. 8 is a flowchart illustrating successive steps in an example method for preparing an organic EL layer in accordance with Embodiment 1.

FIG. 8 is a flowchart illustrating successive steps in an example method for preparing the organic EL layer 43.

Note that the stacking order illustrated in FIG. 8 is based on the configuration in which the first electrode 21 serves as an anode and the second electrode 31 serves as a cathode. Therefore, in a case where the first electrode 21 serves as a cathode and the second electrode 31 serves as an anode, the stacking order of layers in the organic EL layer 43 is inverted.

In the step S4 illustrated in FIG. 7, a hole injection layer 22 is formed in a pattern by vapor deposition in an entire display region R1 of the supporting substrate 10, which has been subjected to (i) a low-pressure bake for dehydration and (ii) an oxygen plasma treatment for washing the surface of the first electrode 21, so that the hole injection layer 22 covers the first electrode 21 and the edge cover 15 (the step S11 in FIG. 8).

The pattern of the hole injection layer 22 is formed with the use of a vacuum vapor deposition method. In the vacuum vapor deposition method, a vapor-deposition surface of the supporting substrate 10, on which vapor-deposition surface a mask (open mask) having an opening equivalent to the entire display region R1 is closely fixed, is faced to a vapor deposition source so that vapor deposition particles (a film formation material) from the vapor deposition source are vapor-deposited on the vapor-deposition surface via the opening in the mask. As such, the vapor deposition particles scattered from the vapor deposition source are uniformly vapor deposited on the entire display region R1 via the opening of the open mask.

Note that the vapor deposition can be carried out, for example, as follows: the open mask having the opening equivalent to the display region R1 is aligned with respect to the supporting substrate 10 and is then attached to the supporting substrate 10, and the vapor deposition particles scattered from the vapor deposition source are vapor deposited onto the display region R1 via the opening of the open mask while the supporting substrate 10 and the open mask are being rotated together. Alternatively, a scanning vapor deposition can be carried out in which the vapor deposition source is scanned while the open mask is being closely fixed to the supporting substrate 10.

Note that the vapor deposition in the entire display region R1 means that the vapor deposition is seamlessly carried out over the sub-pixels which are adjacent to each other and have different colors.

In the vapor deposition, a vacuum vapor deposition device can be employed as with a conventional technique. Therefore, details of such a vacuum vapor deposition device and a vapor deposition method are not described and are not illustrated in drawings.

Note that, in a case where a vapor-deposited film is formed with the use of the vacuum vapor deposition device as above described, it is preferable that the vacuum vapor deposition device is set to a degree of vacuum of $1.0 \times 10^{-4}$ Pa or higher by a vacuum pump. In other words, it is preferable that a pressure in a vacuum chamber is set to $1.0 \times 10^{-4}$ Pa or lower.

In a case where a degree of vacuum which is higher than $1.0 \times 10^{-3}$ Pa is achieved, a necessary and sufficient mean free path of the vapor deposition particles can be obtained. On the other hand, in a case where the degree of vacuum is lower than $1.0 \times 10^{-3}$ Pa, the mean free path becomes short, and the vapor deposition particles are therefore scattered. This causes (i) a reduction in arrival ratio of the vapor deposition particles to the supporting substrate 10 on which a film is to be formed and/or (ii) the vapor deposition particles to attach to an unintended area. Therefore, it is preferable that the vacuum chamber is set to achieve the degree of vacuum.

Next, in the step S12, a hole transfer layer 23 is formed (vapor-deposited) as with the hole injection layer 22 in a pattern, which is identical with that of the hole injection layer 22, in the entire display region R1 with the use of the open mask so as to cover the hole injection layer 22.

Next, each of a first luminescent layer 24 (step S13), an electron transfer layer 25 (step S14), a carrier generation layer 26 (step S15), a hole transfer layer 27 (step S16), a second luminescent layer 28 (step S17), an electron transfer layer 29 (step S18), and an electron injection layer 30 (step S19) is formed (vapor deposited) in this order in the entire display region R1 with the use of the open mask as with the hole injection layer 22 and the hole transfer layer 23 so as to cover the hole transfer layer 23 and to be in a pattern identical with that of the hole injection layer 22 and the hole transfer layer 23.

The film thickness of each of the layers in the organic EL layer 43 is set in a manner which is, for example, similar to that of a conventional technique.

Note that the hole injection layer 22 and the hole transfer layer 23 can be formed as separate layers as above described or can be integrated with each other as early described. A film thickness of each of the hole injection layer 22 and the hole transfer layer 23 is, for example, 1 nm to 100 nm. Moreover, a total film thickness of the hole injection layer 22 and the hole transfer layer 23 is, for example, 2 nm to 200 nm.

The electron transfer layer 29 and the electron injection layer 30 can be formed as separate layers as above described or can be integrated with each other as early described.

A film thickness of each of the electron transfer layer 25, the electron transfer layer 29, and the electron injection layer 30 is, for example, 1 nm to 100 nm. Moreover, a total film thickness of the electron transfer layer 29 and the electron injection layer 30 is, for example, 20 nm to 200 nm.

A film thickness of each of the first luminescent layer 24 and the second luminescent layer 28 is, for example, 10 nm to 100 nm.

A film thickness of the carrier generation layer 26 is, for example, 1 nm to 30 nm.

In the present embodiment, the hole injection layer 22 is made of copper phthalocyanine and has a film thickness of 2 nm. The hole transfer layer 23 is made of NPB (4,4'-bis[N-(1-naphthyl)-N-phenylamino]biphenyl) and has a film thickness of 30 nm.

Each of the electron transfer layer 25 and the electron transfer layer 29 is made of an oxadiazole derivative and has a film thickness of 40 nm. The electron injection layer 30 is made of lithium fluoride and has a film thickness of 1 nm.

Each of the first luminescent layer 24 and the second luminescent layer 28 is formed by codeposition of an iridium complex as a guest material and CBP (4,4'-N,N'-dicarbazole-biphenyl) as a host material and has a film thickness of 30 nm. The carrier generation layer 26 is formed by codeposition of molybdenum oxide and NPB and has a film thickness of 10 nm.

In a case where a unit having a third luminescent layer is stacked, for example, a carrier generation layer (step S21), a hole transfer layer (step S22), a third luminescent layer (step S23), and an electron transfer layer (step S24) are formed (vapor deposited) in a pattern in this order between the step S18 and the step S19 as indicated by two-dot chain lines.

In this case, materials and film thicknesses of the carrier generation layer, the hole transfer layer, the third luminescent layer, and the electron transfer layer can be set, for example, as with a unit including the second luminescent layer 28.

According to the organic EL display device 100 thus configured, when the TFT 12 is turned ON by a signal supplied via the signal line 14, holes (positive holes) are injected from the first electrode 21 to the organic EL layer 43. Meanwhile, electrons are injected from the second electrode 31 to the organic EL layer 43, and the positive holes and the electrons are recombined with each other in the luminescent layers. From this, light is emitted when the positive holes and the electrons are becoming inactive due to the recombination.

According to the present embodiment, the first luminescent layer 24 and the second luminescent layer 28 are luminescent layers for different emission light colors, and light obtained by the organic EL element 20 is resulted from lights which are (i) emitted from the first luminescent layer 24 and the second luminescent layer 28, (ii) combined with each other, and (iii) subjected to a microcavity effect.

<Method for Preparing First Electrode 21>

The following description will discuss a method for preparing a first electrode 21 in the top emission organic EL display device 100 (i.e., a method for preparing electrodes which are different in light path length for each sub-pixel 71).

Figure 1:
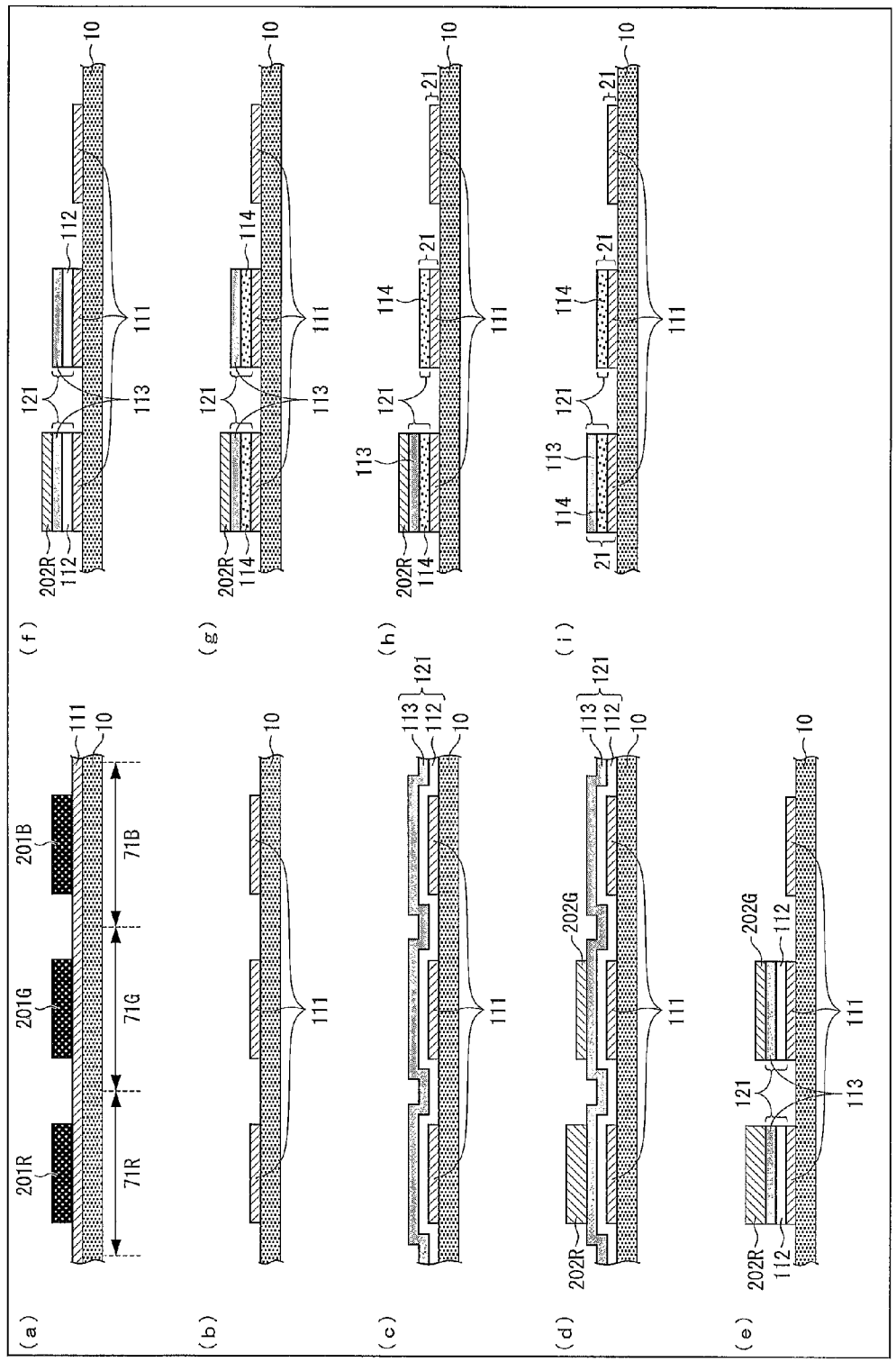
FIG. 1 is a cross-sectional view illustrating, in (a) through (i), successive steps in an example method for preparing a first electrode in a top emission organic EL display device in accordance with Embodiment 1.

FIG. 1 is a cross-sectional view illustrating, in (a) through (i), successive steps in an example method, employed in the step S2, for preparing the first electrode 21 in the top emission organic EL display device 100.

First, as illustrated in (a) of FIG. 1, a reflecting electrode layer 111 is formed from a reflecting electrode material such as a metal material by, for example, sputtering on a supporting substrate 10 which includes an interlayer insulating film 13 having contact holes 13a therein as illustrated in FIG. 5.

Next, resist patterns 201R, 201G, and 201B (second resist pattern) are formed on the reflecting electrode layer 111 for respective sub-pixels 71R, 71G, and 71B by photolithography. Subsequently, the reflecting electrode layer 111 is etched while using the resist patterns 201R, 201G, and 201B as masks, and then the resist patterns 201R, 201G, and 201B are washed and removed with the use of a resist removing solution.

As such, the reflecting electrode layer 111 is patterned so as to be separated for each of the sub-pixels 71R, 71G, and 71B as illustrated in (b) of FIG. 1. That is, the reflecting electrode layer 111 is formed which is patterned for each of the sub-pixels 71R, 71G, and 71B.

It is preferable that the reflecting electrode layer 111 is made of a reflecting electrode material which does not cause electrolytic corrosion by reacting with amorphous ITO. For example, any one selected from the group consisting of Ag, an Ag alloy, and an Al alloy can be employed. Among these, Ag or the Ag alloy is suitable.

A thickness of the reflecting electrode layer 111 is set to, for example, 50 nm to 150 nm. In the present embodiment, an Ag electrode having an electrode thickness of 100 nm is prepared as the reflecting electrode layer 111.

Note that, as the etching, wet etching is carried out in which, for example, an etchant such as (i) a mixed solution of phosphoric acid, nitric acid, and acetic acid or (ii) ferric chloride is used. As the resist removing solution, for example, monoisopropanolamine is employed.

Next, an amorphous ITO (hereinafter, referred to as "a-ITO") layer 112 (first transparent electrode layer) and an IZO layer 113 (second transparent electrode layer), which constitute a transparent electrode layer 121, are stacked on the supporting substrate 10 in this order by, for example, sputtering so as to cover the reflecting electrode layer 111 (see (c) of FIG. 1).

In this case, the a-ITO layer 112 and the IZO layer 113 are set to have such film thicknesses that the total film thickness of the a-ITO layer 112 and the IZO layer 113 allows the sub-pixel 71R to have the greatest light path length 73R.

A film thickness of the a-ITO layer 112 is set to, for example, 40 nm to 50 nm. A film thickness of the IZO layer 113 is set to, for example, 45 nm to 55 nm. In the present embodiment, the a-ITO layer 112 has a film thickness of 45 nm, and the IZO layer 113 has a film thickness of 50 nm.

Subsequently, as illustrated in (d) of FIG. 1, resist patterns 202R and 202G (second resist pattern), which have different thicknesses, are formed in the sub-pixel 71R and the sub-pixel 71G, respectively, by photolithography. The resist patterns 202R and 202G are patterned so as to overlap with the patterned reflecting electrode layer 111 in a plan view.

In the present embodiment, double exposure is carried out in order to vary film thicknesses between the resist patterns 202R and 202G in respective of the sub-pixel 71R and the sub-pixel 71G so that the resist pattern 202R becomes thicker than the resist pattern 202G.

The double exposure includes, for example: a first exposure (full exposure) in which a photoresist is exposed so that the resist patterns 202R and 202G are formed for the sub-pixels 71R and 71G, respectively; and a second exposure (half exposure) in which the photoresist of the sub-pixel 71G is exposed to such an amount of exposure that the photoresist constituting the resist pattern 202G of the sub-pixel 71G is not completely exposed. This causes the resist pattern 202G of the sub-pixel 71G to have a decreased film thickness after development, so that the resist pattern 202G has the film thickness which is smaller than that of the resist pattern 202R of the sub-pixel 71R.

The present embodiment uses stepper exposure machines for the first and second exposures, respectively, to set the amount of exposure of the first exposure to 50 mJ/cm$^2$ and the amount of exposure of the second exposure to 30 mJ/cm$^2$, whereby the resist pattern 202R formed in the sub-pixel 71R has a film thickness of 1.6 μm and the resist pattern 202G formed in the sub-pixel 71G has a film thickness of 0.8 μm.

Although the present embodiment employs the double exposure to cause the amounts of exposure of the photoresist to be different between the sub-pixels 71R and 71G, the present embodiment may alternatively use a halftone mask to cause the amounts of exposure to be different between the sub-pixels 71R and 71G.

After that, portions of the a-ITO layer 112 and the IZO layer 113, which portions are not masked by the resist patterns 202R and 202G, are wet-etched altogether with an etchant while using the resist patterns 202R and 202G as masks (i.e., portions of the a-ITO layer 112 and the IZO layer 113, which portions are other than the sub-pixels 71R and 71G, are wet-etched altogether).

As the etchant, oxalic acid or the like can be used.

As such, the transparent electrode layer 121 which is made up of the a-ITO layer 112 and the IZO layer 113 is patterned for each of the sub-pixels 71R and 71G as illustrated in (e) of FIG. 1.

Note here that Ag, of which the reflecting electrode layer 111 is made, is not etched or is very slow in etching speed. For this reason, as illustrated in (e) of FIG. 1, the sub-pixel 71G is left with the reflecting electrode layer 111 alone.

Then, the surfaces of the resist patterns 202R and 202G are decomposed and removed for regression by ashing with the use of a dry etching apparatus so that the resist pattern 202R in the sub-pixel 71R is turned into a thinner film, while the resist pattern 202G in the sub-pixel 71G is completely removed (see (f) of FIG. 1). This causes the surface of the IZO layer 113 in the sub-pixel 71G to be exposed.

As the ashing, for example, O$_2$ ashing can be employed. In the present embodiment, the ashing is carried out until the resist pattern 202G in the sub-pixel 71G is completely removed by using, as the dry etching apparatus, "HT series" manufactured by Tokyo Electron Limited.

After that, the supporting substrate 10 is treated with heat (i.e., annealed), whereby the a-ITO layer 112 is crystallized (see (g) of FIG. 1).

Note that a treatment temperature and a treatment time in the heat treatment can be set as appropriate so that the a-ITO layer 112 can be crystallized, and are not limited in particular.

In the present embodiment, the heat treatment is carried out for one hour at 200° C. This causes the a-ITO to be transformed into crystalline ITO (hereinafter, referred to as "p-ITO"). As a result, the a-ITO layers 112, which are provided under the IZO layers 113, are transformed into p-ITO layers 114 in the respective sub-pixels 71R and 71G as illustrated in (g) of FIG. 1.

Note that the transformation from a-ITO into p-ITO does not reduce a film thickness or the like, and therefore the film thickness does not change from that of the a-ITO layer.

Subsequently, a portion of the IZO layer 113, which portion is not masked by the resist pattern 202R left in the sub-pixel 71R, is wet-etched with an etchant while using the resist pattern 202R as a mask.

The etchant used in this case can be an etchant such as oxalic acid, which is identical with the etchant used to etch the a-ITO layer 112 and the IZO layer 113 in the step illustrated in (e) of FIG. 1.

In this case, p-ITO, of which the p-ITO layer 114 (polycrystalline first transparent electrode layer) is made, is not etched or is very slowly etched by the etchant (oxalic acid).

Moreover, as above described, Ag, of which the reflecting electrode layer 111 is made, is not etched or is very slow in etching speed. Therefore, the reflecting electrode layer 111 in the sub-pixel 71B remains without being removed by etching.

As such, in the wet etching illustrated in (g) of FIG. 1, only IZO, of which the IZO layer 113 in the sub-pixel 71G is made, is etched.

As a result, as illustrated in (h) of FIG. 1, only the p-ITO layer 114 remains as the transparent electrode layer 121 in the sub-pixel 71G, and therefore a first electrode 21 is obtained in which the transparent electrode layer 121 made up of the p-ITO layer 114 is stacked on the reflecting electrode layer 111.

In the sub-pixel 71B, a first electrode 21 made up of the reflecting electrode layer 111 is obtained.

Then, the surface of the IZO layer 113 in the sub-pixel 71R is exposed by carrying out ashing until the resist pattern 202R remaining in the sub-pixel 71R is completely removed (see (i) of FIG. 1). This makes it possible to obtain, in the sub-pixel 71R, a first electrode 21 in which a transparent electrode layer 121 having the IZO layer 113 and the p-ITO layer 114, which are stacked in this order from an upper layer side, is stacked on the reflecting electrode layer 111.

In the ashing, for example, O$_2$ ashing can be employed as with the step illustrated in (f) of FIG. 1. Moreover, in the ashing, the dry etching apparatus can be used which is used in the step illustrated in (f) of FIG. 1.

Note that, in this case, wet processing can be carried out together with the use of a resist removing solution. Alternatively, the resist pattern 202R remaining in the sub-pixel 71R can be removed solely by wet processing with a resist removing solution.

Through these steps described above, it is possible to cause the transparent electrode layer 121 to have film thicknesses different between the sub-pixels 71R, 71G, and 71B of different colors.

In the present embodiment, after the first electrode 21 is thus formed, the edge cover 15 is prepared as indicated in the step S3.

<Effect>

According to the present embodiment, it is possible to arbitrarily vary the number of transparent electrode layers, in other words, a thickness of the first electrode 21 for each sub-pixel 71, by carrying out photolithography only once. Moreover, according to the present embodiment, it is possible to form first electrodes 21, which have different thicknesses for each sub-pixel 71, by carrying out photolithography twice, even though the patterning of the reflecting electrode layer 111 is included. This makes it possible to vary the film thickness of the first electrode 21, in other words, the light path length of the organic EL element 20 for each sub-pixel 71 by the smaller number of times of photolithography than that of conventional techniques.

This makes it possible to further reduce cost and footprint as compared with a conventional technique.

As early described, according to the conventional method, the number of times of carrying out removing processes and baking processes on photoresists is increased, and a surface of the reflecting electrode layer therefore becomes rough or oxidized, thereby decreasing a reflective efficiency. Further, the roughness of the reflecting electrode layer may cause leakage between the electrodes, which may result in defective pixels.

However, according to the present embodiment, the number of times of carrying out the processes such as exposure, development, and resist removing can be reduced, and it is therefore possible to avoid such a problem. This allows an improvement in quality of the supporting substrate 10 which is a substrate for an organic EL. Moreover, it is possible to shorten a tact time.

The following description will discuss modification examples of the present embodiment.

Modification Example of Method for Preparing First Electrode 21

The present embodiment has been described with reference to the example in which the film thickness of the resist pattern 202R in the sub-pixel 71R is reduced and the resist pattern 202G in the sub-pixel 71G is removed by ashing as illustrated in (f) of FIG. 1, and then the a-ITO layer 112 is crystallized by the heat treatment as illustrated in (g) of FIG. 1.

Note, however, that the step illustrated in (f) of FIG. 1 and the step illustrated in (g) of FIG. 1 can be transposed.

Figure 9:
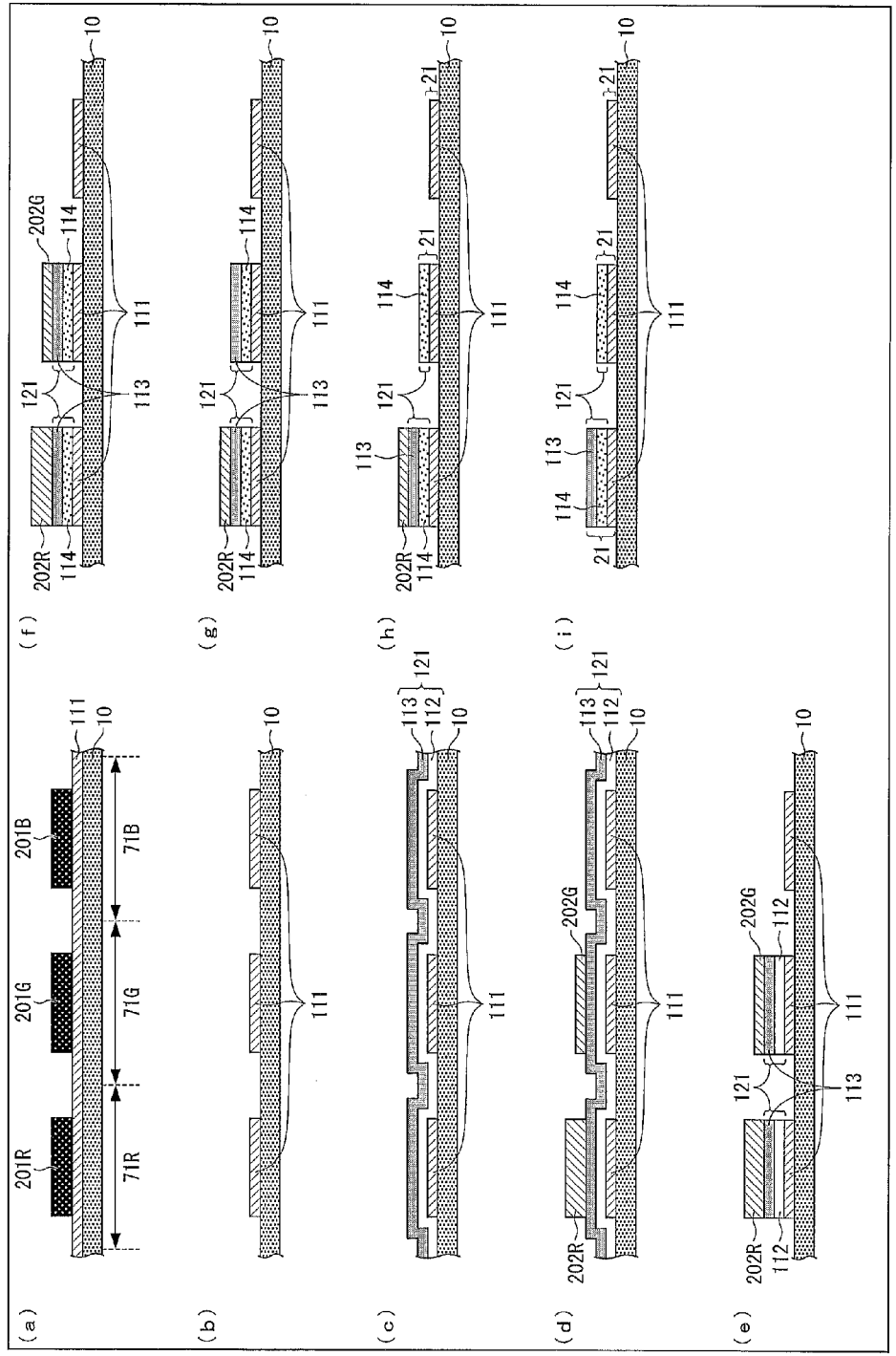
FIG. 9 is a cross-sectional view illustrating, in (a) through (i), successive steps in another example method for preparing a first electrode in a top emission organic EL display device in accordance with Embodiment 1.

FIG. 9 is a cross-sectional view illustrating, in (a) through (i), successive steps in another example method for preparing, in the step S2, the first electrode 21 in the top emission organic EL display device 100.

The steps illustrated in (a) through (e) of FIG. 9 are identical with the steps illustrated in (a) through (e) of FIG. 1. In this modification example, the a-ITO layer 112 in the sub-pixels 71R and 71G is crystallized by heating the supporting substrate 10 as illustrated in (f) of FIG. 1 after the step which is illustrated in (e) of FIG. 9 (i.e., the step described with reference to (e) of FIG. 1) without carrying out ashing.

Note that, in this case also, a treatment temperature and a treatment time in the heat treatment can be set as appropriate so that the a-ITO layer 112 can be crystallized, and are not limited in particular.

In this modification example also, the heat treatment is carried out at 200° C. for one hour so that the p-ITO layer 114 is formed by transforming a-ITO, of which the a-ITO layer 112 provided under the IZO layer 113 is made, into p-ITO.

In this modification example, then, ashing is carried out with the use of a dry etching apparatus as with the step illustrated in (f) of FIG. 1 so that the surfaces of the resist patterns 202R and 202G are decomposed and removed for regression. This causes the resist pattern 202R in the sub-pixel 71R to be turned into a thinner film, while the resist pattern 202G in the sub-pixel 71G is completely removed (see (g) of FIG. 9). This causes the surface of the IZO layer 113 in the sub-pixel 71G to be exposed.

Subsequently, a portion of the IZO layer 113, which portion is not masked by the resist pattern 202R left in the sub-pixel 71R, is wet-etched with an etchant while using the resist pattern 202R as a mask.

As a result, as illustrated in (h) of FIG. 9 and as with the case illustrated in (h) of FIG. 1, only the p-ITO layer 114 remains as the transparent electrode layer 121 in the sub-pixel 71G, and therefore a first electrode 21 is obtained in which the transparent electrode layer 121 made up of the p-ITO layer 114 is stacked on the reflecting electrode layer 111.

After that, as illustrated in (h) and (i) of FIG. 9 and as with the case illustrated in (h) and (i) of FIG. 1, wet etching and removing of the resist pattern 202R are carried out so as to vary the film thickness of the transparent electrode layer 121 for each of the sub-pixels 71R, 71G, and 71B of different colors (see (i) of FIG. 9).

Modification Example of Method for Sealing Organic EL Element 20

The present embodiment has been described with reference to the example in which, as early described, the adhesive filler resin layer 42 containing the desiccating agent is formed on the organic EL element 20 so that the supporting substrate 10 and the sealing substrate 50 are adhered to each other and the organic EL element 20 is sealed.

Note, however, that the present embodiment is not limited to this. It is possible to employ a hollow structure in which, instead of the sealing resin, inert gas is sealed in a space surrounded by the supporting substrate 10, the sealing substrate 50, and the sealing resin layer 41. In addition to this, a desiccating agent can be applied or attached inside the hollow structure. Note, however, that, in a case where light is emitted from a sealing substrate 50 side, it is necessary to prevent the desiccating agent from blocking the light.

The present embodiment has been described with reference to the example in which the organic EL element 20, the sealing resin layer 41, the filler resin layer 42, and the sealing substrate 50 are stacked on the supporting substrate 10 in this order. Note, however, that the present embodiment is not limited to this.

For example, in order to improve a sealing performance of the organic EL element 20, an inorganic film or a mixed stacked film of organic and inorganic layers (not illustrated) can be stacked on the organic EL element 20.

In a case where the sealing performance of the organic EL element 20 can be sufficiently secured by providing the film such as the inorganic film or the mixed stacked film of organic and inorganic layers, the sealing resin layer 41, the sealing substrate 50, and the filler resin layer 42 do not need to be provided.

The present embodiment has been described with reference to the example in which the supporting substrate 10 and the sealing substrate 50 are attached to each other via the frame-like sealing resin layer 41 so as to seal the organic EL element 20.

However, the method for sealing the organic EL element 20 is not limited to this. For example, the organic EL element 20 can be sealed with the use of frit glass (powdered glass), which is formed in a frame, instead of the sealing resin.

Modification Example of Pixel Configuration

The present embodiment has been described with reference to the example in which one (1) pixel 70 is made up of the sub-pixels 71R, 71G, and 71B for respective three colors of R, G, and B. Note, however, that the present embodiment is not limited to this. One (1) pixel 70 can be made up of sub-pixels 71 for three colors of, for example, cyan (C), magenta (M), and yellow (Y), which are not R, G, and B.

The present embodiment has been described with reference to the example of the active matrix organic EL display device 100 in which the TFTs 12 are provided in the respective sub-pixels 71. Note, however, that the present embodiment is not limited to this. That is, the present invention can be applied to manufacturing of a passive matrix organic EL display device in which no TFT is formed, provided that no influence is exerted by a system of driving the organic EL element 20.

Modification Example of Method for Preparing Organic EL Layer 43

The present embodiment has been described with reference to the example in which the organic EL layer 43 is prepared with the vacuum vapor deposition method. Note, however, that the method for preparing the organic EL layer 43 is not limited to this. Therefore, it is of course possible to appropriately select and employ a conventionally known method, such as an inkjet method or a laser transfer method, for forming an organic film.

Modification Example of Display Device

The present embodiment has been described with reference to the example in which the display device is manufactured which includes the organic EL element as a light-emitting element. However, the present embodiment is not limited to this. For example, the present embodiment can be widely applied to a display device including a light-emitting element, such as an inorganic EL element, which can be configured as a micro resonator.

Embodiment 2

Figure 10:
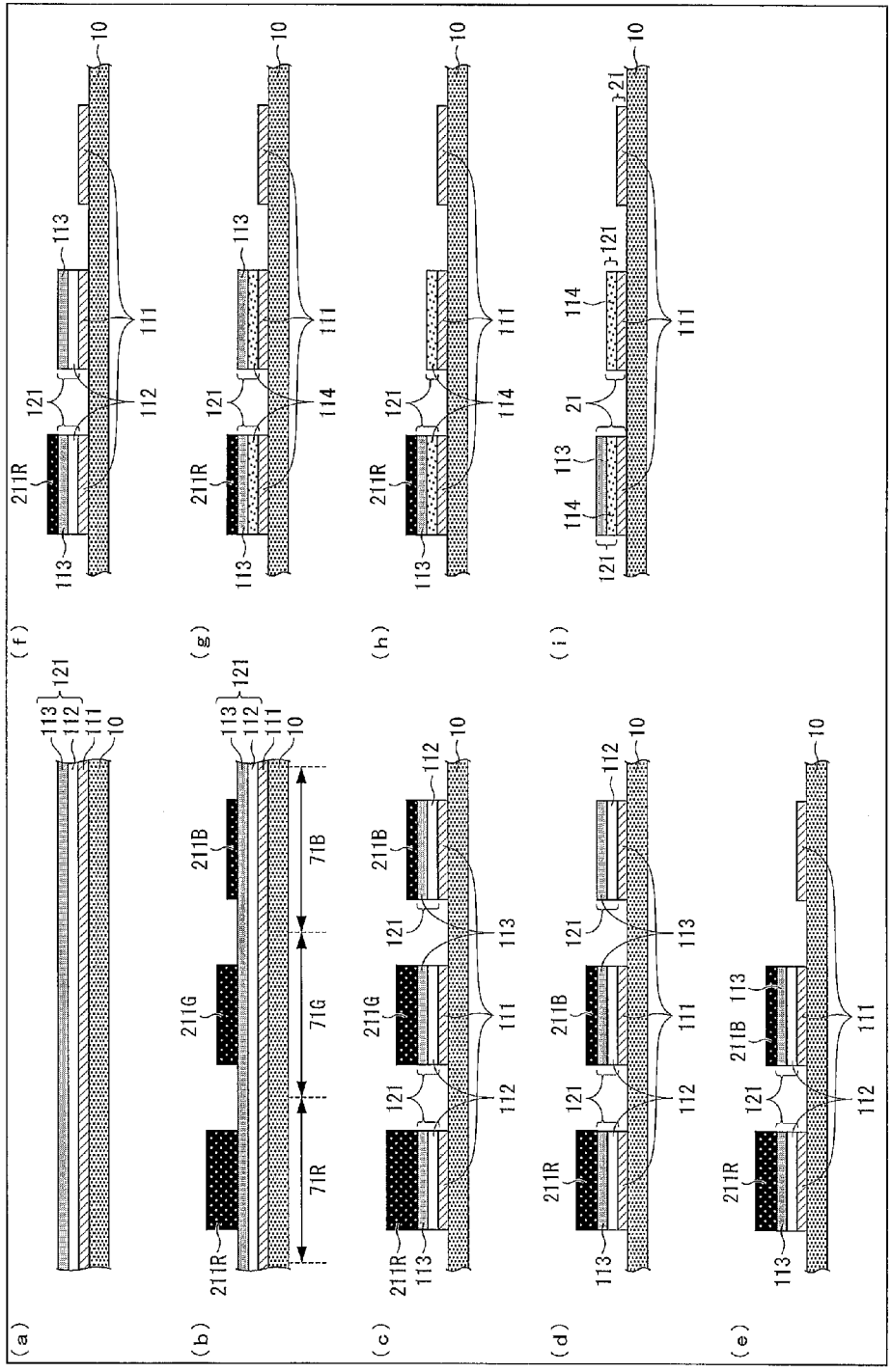
FIG. 10 is a cross-sectional view illustrating, in (a) through (i), successive steps in an example method for preparing a first electrode in a top emission organic EL display device in accordance with Embodiment 2.

The following description will discuss Embodiment 2 mainly with reference to (a) through (i) of FIG. 10.

Note that, in Embodiment 2, differences from Embodiment 1 are mainly described. Identical reference numerals are given to components that have functions identical to those of Embodiment 1, and such constituent elements are not explained repeatedly.

An organic EL display device 100 of Embodiment 2 has a configuration which is identical with that of Embodiment 1. A difference from Embodiment 1 is a method for preparing a first electrode 21 indicated by the step S2. Therefore, in Embodiment 2, the different method for preparing the first electrode 21 indicated by the step S2 is described.

<Method for Preparing First Electrodes 21>

FIG. 10 is a cross-sectional view illustrating, in (a) through (i), successive steps in an example method for preparing, in the step S2, a first electrode 21 in a top emission organic EL display device 100.

In the present embodiment, first, as illustrated in (a) of FIG. 10, a reflecting electrode layer 111 made of a reflecting electrode material such as a metal material, an a-ITO layer 112 (first transparent resin layer) and an IZO layer 113 (second transparent resin layer), which serve as a transparent electrode layer 121, are stacked in this order, for example, by sputtering on a supporting substrate 10 (see FIG. 5) formed with an interlayer insulating film 13 and contact holes 13a.

In the present embodiment, too, as the reflecting electrode material, a reflecting electrode material which is similar to that used in Embodiment 1 can be used. Further, the thickness of the reflecting electrode material (i.e., the thickness of the reflecting electrode layer 111) can be set to be similar to that of the reflecting electrode material used in Embodiment 1. In the present embodiment, as in Embodiment 1, an Ag electrode having an electrode thickness of 100 nm is prepared as the reflecting electrode layer 111.

Further, in the present embodiment, as in Embodiment 1, the a-ITO layer 112 and the IZO layer 113 are set to have such film thicknesses that the total film thickness of the a-ITO layer 112 and the IZO layer 113 allows the sub-pixel 71R to have the greatest light path length 73R. In the present embodiment, as in Embodiment 1, the a-ITO layer 112 has a film thickness of 45 nm, and the IZO layer 113 has a film thickness of 50 nm.

Next, as illustrated in (b) of FIG. 10, resist patterns 211R, 211G, and 211B (first resist patterns) are formed by photolithography on the IZO layer 113 for the sub-pixels 71R, 71G, and 71B in such a manner as to have different thicknesses for the sub-pixels 71R, 71G, and 71B, respectively.

The present embodiment employs triple exposure, whereby the film thicknesses of the resist patterns 211R, 211G, and 211B of the sub-pixels 71R, 71G, and 71B are made different from each other so that the film thicknesses of the resist patterns 211R, 211G, and 211B of the sub-pixels 71R, 71G, and 71B satisfy the inequality "Resist Pattern 211R of Sub-pixel 71R>Resist Pattern 211G of Sub-pixel 71G>Resist Pattern 211B of Sub-pixel 71B".

The triple exposure includes, for example: a first exposure (full exposure) in which a photoresist is exposed so that the resist patterns 211R, 211G, and 211B are formed for the sub-pixels 71R, 71G, and 71B, respectively; a second exposure (half exposure) in which the photoresist of the sub-pixel 71G is exposed to such an amount of exposure that the photoresist constituting the resist pattern 211G of the sub-pixel 71G is not completely exposed; and a third exposure (half exposure) in which the photoresist of the sub-pixel 71B is exposed to such an amount of exposure that the photoresist constituting the resist pattern 211B of the sub-pixel 71B is not completely exposed (note, however, that "Amount of Exposure of Third Exposure>Amount of Exposure of Second Exposure").

This causes the resist patterns 211G and 211B of the sub-pixels 71G and 71B to have decreased film thicknesses after development, so that as mentioned above, the resist patterns 211R, 211G, and 211B have film thicknesses which decrease in the following order, i.e., "Resist Pattern 211R>Resist Pattern 211G>Resist Pattern 211B".

The present embodiment uses stepper exposure machines for the first and second exposures, respectively, to set the amount of exposure of the first exposure to 70 mJ/cm$^2$, the amount of exposure of the second exposure to 20 mJ/cm$^2$, and the amount of exposure of the third exposure to 40 mJ/cm$^2$, whereby the resist pattern 211R formed in the sub-pixel 71R has a film thickness of 2.4 μm, the resist pattern 211G formed in the sub-pixel 71G has a film thickness of 1.6 μm, and the resist pattern 211B formed in the sub-pixel 71B has a film thickness of 0.8 μm.

Although the present embodiment employs the triple exposure to vary the amount of exposure of the photoresist between the sub-pixels 71R, 71G, and 71B, the present embodiment may alternatively use a halftone mask to vary the amount of exposure between the sub-pixels 71R, 71G, and 71B.

Further, the first exposure (full exposure) may be (i) followed by the second exposure (half exposure) in which the photoresists of the sub-pixels 71G and 71B are exposed to such an amount of exposure that the photoresists constituting the resist patterns 211G and 211B of the sub-pixels 71G and 71B are not completely exposed, and further (ii) followed by the third exposure (half-exposure) in which only the photoresist of the sub-pixel 71B is exposed to such an amount of exposure that the photoresist constituting the resist pattern 211B of the sub-pixel 71B is not completely exposed.

After that, portions of the reflecting electrode layer 111, the a-ITO layer 112, and the IZO layer 113 which portions are not masked by the resist patterns 211R, 211G, and 211B are wet-etched all at once by using an etchant while using the resist patterns 211R, 211G, and 211B as masks, so that the respective first electrodes 21 of the sub-pixels 71R, 71G, and 71B are separated from each other.

Usable examples of the etchant include etchants such as (i) a mixed solution of phosphoric acid, nitric acid, and acetic acid and (ii) ferric chloride.

Thus, as illustrated in (c) of FIG. 10, (i) the reflecting electrode layer 111 and (ii) the transparent electrode layer 121 composed of the a-ITO layer 112 and the IZO layer 113 are patterned for each of the sub-pixels 71R, 71G, and 71B.

Then, the surfaces of the resist patterns 211R, 211G, and 211B are decomposed and removed for recession by ashing with a dry etching apparatus which is similar to that used in Embodiment 1, so that as illustrated in (d) of FIG. 10, the resist patterns 211R and 211G in the sub-pixels 71R and 71G are turned into thinner films, while the resist pattern 211B in the sub-pixel 71B is completely removed. This causes the surface of the IZO layer 113 in the sub-pixel 71B to be exposed.

After that, portions of the a-ITO layer 112 and the IZO layer 113 in the sub-pixel 71B which portions are not masked by the resist patterns 211R and 211G are wet-etched all at once by using an etchant with the remaining resist patterns 211R and 211G as masks.

As the etchant, oxalic acid or the like can be used.

Note here that Ag, of which the reflecting electrode layer 111 is made, is not etched or is very slow in etching speed. For this reason, as illustrated in (e) of FIG. 10, the sub-pixel 71G is left with the reflecting electrode layer 111 alone.

Then, the surfaces of the resist patterns 202R and 202G are decomposed and removed for recession by ashing with a dry etching apparatus in a manner similar to (d) of FIG. 10, so that as illustrated in (f) of FIG. 10, the resist pattern 211R in the sub-pixel 71R is turned into a thinner film, while the resist pattern 211G in the sub-pixel 71G is completely removed. This causes the surface of the IZO layer 113 in the sub-pixel 71G to be exposed.

After that, the supporting substrate 10 is treated with heat, whereby as illustrated in (g) of FIG. 1, the a-ITO layer 112 is crystallized.

The steps illustrated in (f) through (i) of FIG. 10 are identical to those illustrated in (f) through (i) of FIG. 1. Therefore, the present embodiment omits to describe or detail the steps illustrated in (f) through (i) of FIG. 10.

Modification Example

Further, in the present embodiment, the step illustrated in (i) of FIG. 10 may involve concomitant use of wet processing with a resist removing solution, as with the step illustrated in (i) of FIG. 1. Alternatively, the resist pattern 211R remaining in the sub-pixel 71R may be removed solely by wet processing with a resist removing solution.

Further, in the present embodiment, the steps illustrated in (f) and (g) of FIG. 10 may be transposed as described with reference to (f) and (g) of FIG. 9, as with the steps illustrated in (f) and (g) of FIG. 1.

<Effects>

Through these steps described above, the present embodiment, too, allows the transparent electrode layer 121 to have any different film thicknesses for the sub-pixels 71R, 71G, and 71B of different colors as illustrated in (i) of FIG. 10.

Further, in the present embodiment, as described above, after the a-ITO layer 112 and the IZO layer 113 have been stacked in this order on the reflecting electrode layer 111, the reflecting electrode layer 111, the a-ITO layer 112, and the IZO layer 113 are etched all at once by using the resist patterns 211R, 211G, and 211B, which have different films thicknesses for the respective sub-pixels. This allows first electrodes 21 having different thicknesses for the sub-pixels 71R, 71G, and 71B to be formed by carrying out photolithography once, including patterning of the reflecting electrode layer 111.

This makes it possible to further shorten a tact time and to reduce cost and footprint as compared with a conventional technique.

Embodiment 3

The present embodiment is described below mainly with reference to (a) through (i) of FIG. 11.

Note that the present embodiment is described mainly in terms of difference from Embodiment 1, and components having the same functions as those used in Embodiment 1 are given the same reference numerals, and as such, are not described below.

The organic EL display device 100 according to the present embodiment is substantially identical to that of Embodiment 1, except for the stacking structure of each first electrode 21 and the method, employed in step 2, for preparing first electrodes 21. Accordingly, in the present embodiment, the different method, employed in step 2, for preparing first electrodes 21 and a stacking structure of each first electrode 21 are described.

<Method for Preparing First Electrodes 21>

Figure 11:
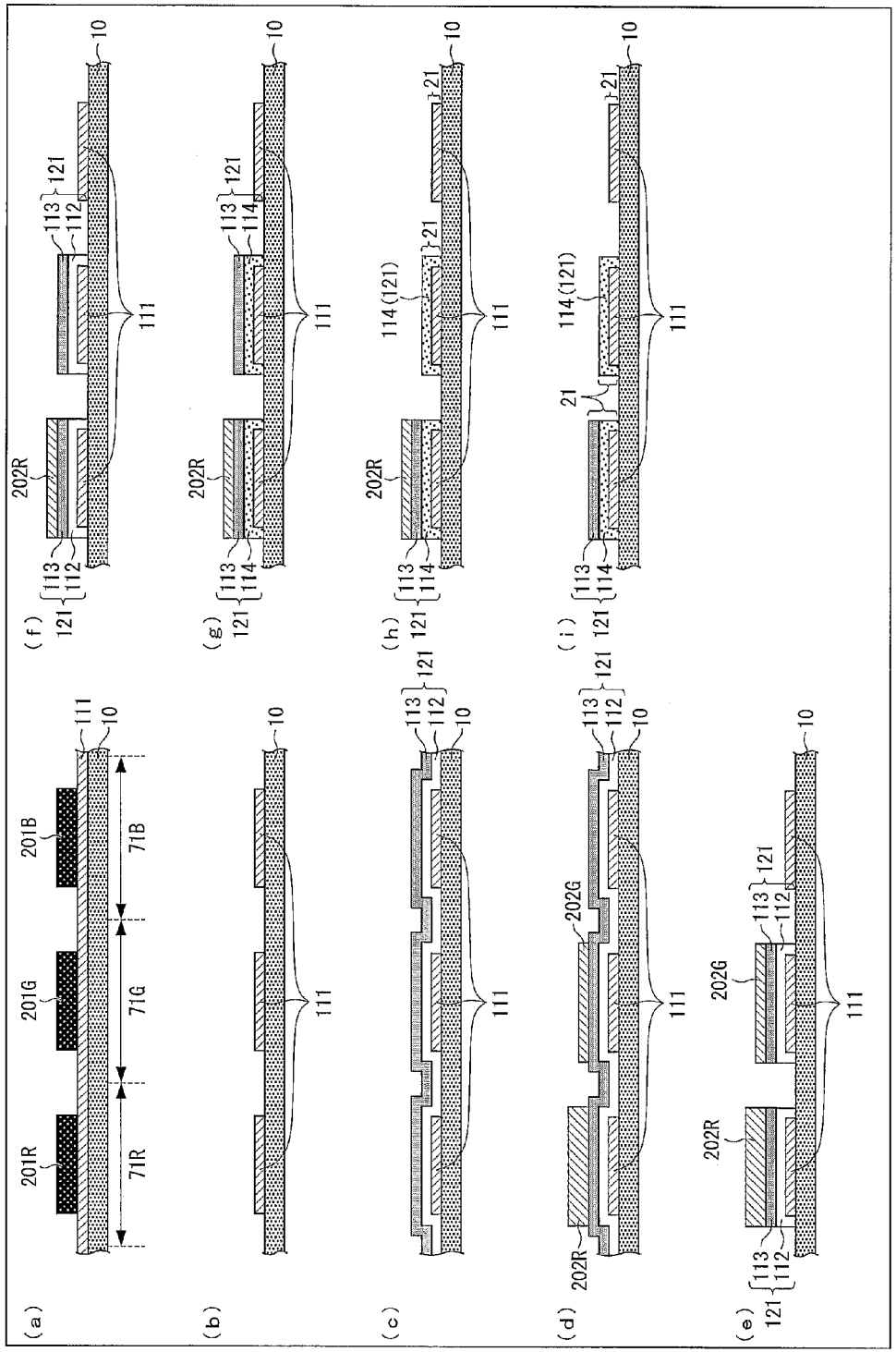
FIG. 11 is a cross-sectional view illustrating, in (a) through (i), successive steps in an example method for preparing a first electrode in a top emission organic EL display device in accordance with Embodiment 3.

FIG. 11 is a set of cross-sectional views (a) through (i) illustrating examples of the successive steps, respectively, of the method, employed in step S2, for preparing first electrodes 21 of a top emission organic EL display device 100.

The steps illustrated in (a) through (c) of FIG. 11 are identical to those illustrated in (a) through (c) of FIG. 1, except that the reflecting electrode material used is different from that used in Embodiment 1. Therefore, the present embodiment omits to describe the steps illustrated in (a) through (c) of FIG. 11.

In the present embodiment, as the reflecting electrode material of which the reflecting electrode layer 111 is made, Al (aluminum) or an Al alloy is used instead of Ag (silver) or an Ag alloy). As the reflecting electrode layer 111, a stacked electrode having an Al layer as a surface thereof may be used. Examples of the stacked electrode having an Al layer as a surface thereof include a stack of Al and Mo (molybdenum) and a stack of Al and Ti (titanium).

In this case, the thickness of the reflecting electrode layer 111 is set to be, for example, in the range between 100 nm and 300 nm. In the present embodiment, an Al electrode having an electrode thickness of 100 nm is prepared as the reflecting electrode layer 111.

In the present embodiment, as in Embodiment 1, the reflecting electrode layer 111 is wet-etched with an etchant such as (i) a mixed solution of phosphoric acid, nitric acid, and acetic acid or (ii) ferric chloride.

Further, in the present embodiment, as in Embodiment 1, the a-ITO layer 112 (first transparent resin layer) and the IZO layer 113 (second transparent resin layer) are set to have such film thicknesses that the total film thickness of the a-ITO layer 112 and the IZO layer 113 allows the sub-pixel 71R to have the greatest light path length 73R. In the present embodiment, as in Embodiment 1, the a-ITO layer 112 has a film thickness of 45 nm, and the IZO layer 113 has a film thickness of 50 nm.

In the present embodiment, as illustrated in (d) of FIG. 11, double exposure is carried out as in Embodiment 1 subsequent to the step illustrated in (c) of FIG. 11, whereby resist patterns 202R and 202G (first resist patterns) of different thicknesses are formed by photolithography for the sub-pixels 71R and 71G, respectively.

The double exposure was carried out under the same conditions as those set in Embodiment 1. Therefore, in the present embodiment, as in Embodiment 1, the resist pattern 202R formed for the sub-pixel 71R has a film thickness of 1.6 µm, and the resist pattern 202G for the sub-pixel 71G has a film thickness of 0.8 µm.

However, in the present embodiment, as illustrated in (d) of FIG. 11, the resist patterns 202R and 202G are formed wider than the respective patterns of reflecting electrode layer 111 in the sub-pixels 71R and 71G so as to cover the edges of the patterns of reflecting electrode layer 111 when viewed in the plan view.

In the present embodiment, the amounts of protrusion of the resist patterns 202R and 202G from the edges of the patterns of reflecting electrode layer 111 in the plan view are set to be 5 µm.

Although the present embodiment employs the double exposure to vary the amount of exposure of the photoresist between the sub-pixels 71R and 71G, the present embodiment may of course alternatively use a halftone mask to vary the amount of exposure between the sub-pixels 71R and 71G.

Then, in the present embodiment, too, as illustrated in (e) of FIG. 11, portions of the a-ITO layer 112 and the IZO layer 113 which portions are not masked by the resist patterns 202R and 202G (i.e., portions of the a-ITO layer 112 and the IZO layer 113 which portions are not used for the sub-pixels 71R and 71G) are wet-etched all at once by using an etchant while using the resist patterns 202R and 202G as masks.

As in Embodiment 1, usable examples of the etchant include oxalic acid.

With this, as illustrated in (e) of FIG. 11, the transparent electrode layer 121, composed of the a-ITO layer 112 and the IZO layer 113, is patterned for each of the sub-pixels 71R and 71G.

Note here that Al, of which the reflecting electrode layer 111 is made, is not etched or is very slow in etching speed, as with Ag. For this reason, as illustrated in (e) of FIG. 11, the sub-pixel 71G is left with the reflecting electrode layer 111 alone.

Note that, in the present embodiment, as illustrated in (d) of FIG. 11, the resist patterns 202R and 202G are formed wider than the respective patterns of reflecting electrode layer 111 in the sub-pixels 71R and 71G so as to cover the edges of the patterns of reflecting electrode layer 111 when viewed in the plan view.

For this reason, in the present embodiment, portions of the transparent electrode layer 121, which portions are around the patterns of reflecting electrode layer 111 and are covered with the resist patterns 202R and 202G (i.e., at least the a-ITO layer 112 in the example illustrated in (d) of FIG. 11), are not etched and are left so as to cover the patterns of reflecting electrode layer 111.

For this reason, in the present embodiment, no region of contact between the reflecting electrode layer 111 and the a-ITO layer 112 is exposed. In a case where the reflecting electrode material used is Al or an Al alloy having no resistance to electrolytic corrosion, exposure of such a region of contact may cause an electrolytic corrosion reaction between Al and ITO during cleaning, the development of the edge covers 15, or the like, and therefore Al and ITO may be damaged.

However, the present embodiment prevents such a problem from happening even in a case where the reflecting electrode material used is Al or an Al alloy having no resistance to electrolytic corrosion.

Then, as illustrated in (f) of FIG. 10, ashing is carried out as in (f) of FIG. 1, so that the resist pattern 202R in the sub-pixel 71R is turned into a thinner film, while the resist pattern 202G in the sub-pixel 71G is completely removed.

The steps illustrated in (f) through (i) of FIG. 11 are identical to those illustrated in (f) through (i) of FIG. 1, and the process for preparing first electrodes 21 and the resulting stacking structure of each first electrode 21 are identical to those of Embodiment 1, except that the reflecting electrode layer 111 is covered with a p-ITO layer 114.

Therefore, the present embodiment omits to describe the steps illustrated in (f) through (i) of FIG. 11. However, the present embodiment can of course be modified in a manner similar to that of Embodiment 1.

<Effects>

As described above, the present embodiment, too, it is possible, by carrying out photolithography only once, to cause the transparent electrode layer 121 to have any different film thicknesses for the sub-pixels 71R, 71G, and 71B of different colors as illustrated in (i) of FIG. 11. Further, in the present embodiment, too, the first electrodes 21 having different thicknesses for the respective sub-pixels 71 can be formed by carrying out photolithography twice, including patterning of the reflecting electrode layer 111.

Further, the present embodiment makes it possible, without causing damage to Al or ITO due to an electrolytic corrosion reaction, to form first electrodes 21 whose respective patterns of reflecting electrode layer 111 are made of Al or an Al alloy having no resistance to electrolytic corrosion.

Modification Example

Although the present embodiment has been described by taking, as an example, a case where as mentioned above, the reflecting electrode layer 111 includes a layer made of Al or an Al alloy, it is needless to say that the reflecting electrode material of which the reflecting electrode layer 111 is made can be a reflecting electrode material which is similar to that exemplified in Embodiment 1.

Embodiment 4

The present embodiment is described below mainly with reference to (a) through (i) of FIG. 12.

Note that the present embodiment is described mainly in terms of difference from Embodiments 1 and 3, and components having the same functions as those used in Embodiment 1 are given the same reference numerals, and as such, are not described below.

The organic EL display device 100 according to the present embodiment is substantially identical to that of Embodiment 1, except for the stacking structure of each first electrode 21 and the method, employed in step 2, for preparing first electrodes 21. Accordingly, in the present embodiment, the different method, employed in step 2, for preparing first electrodes 21 and a stacking structure of each first electrode 21 are described.

<Method for Preparing First Electrodes 21>

Figure 12:
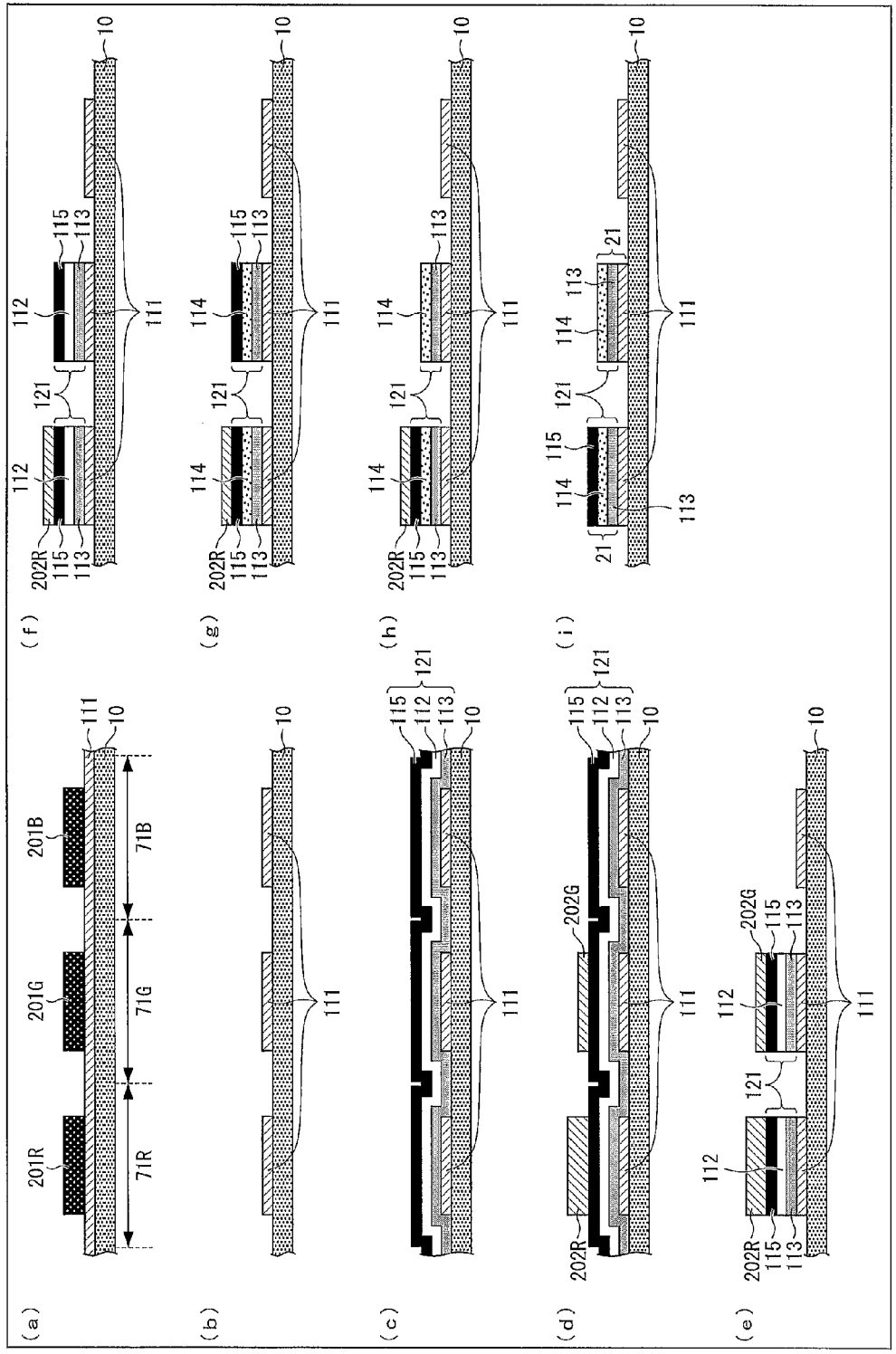
FIG. 12 is a cross-sectional view illustrating, in (a) through (i), successive steps in an example method for preparing a first electrode in a top emission organic EL display device in accordance with Embodiment 4.

FIG. 12 is a set of cross-sectional views (a) through (i) illustrating examples of the successive steps, respectively, of the method, employed in step S2, for preparing first electrodes 21 of a top emission organic EL display device 100.

The steps illustrated in (a) and (b) of FIG. 12 are identical to those illustrated in (a) and (b) of FIG. 11 in Embodiment 3. Therefore, the steps illustrated in (a) and (b) of FIG. 12 are not described below.

In the present embodiment, as in Embodiment 3, Al is used as a reflecting electrode material of which a reflecting electrode layer 111 is made. In the present embodiment, as in Embodiment 3, an Al electrode having an electrode thickness of 100 nm is prepared as the reflecting electrode layer 111.

Further, for etching of the reflecting electrode layer 111, wet etching similar to that used in Embodiment 3 is used.

Next, as illustrated in (c) of FIG. 12, an IZO layer 113 (third transparent electrode layer), an a-ITO layer 112 (first transparent electrode layer), and an IZO layer 115 (second transparent electrode layer), which serve as a transparent electrode layer 121, are stacked in this order, for example, by sputtering so as to cover the patterns of reflecting electrode layer 111.

Note here that the IZO layer 113, the a-ITO layer 112, and the IZO layer 115 are set to have such film thicknesses that the total film thickness of the IZO layer 113, the a-ITO layer 112, and the IZO layer 115 allows the sub-pixel 71R to have the greatest light path length 73R.

In this case, too, the IZO layer 113 has its film thickness set to be, for example, in the range between 20 nm and 30 nm, and the a-ITO layer 112 has its film thickness set to be, for example, in the range between 15 nm and 25 nm. Further, the IZO layer 115 has its film thickness set to be, for example, in the range between 45 nm and 55 nm.

In the present embodiment, the IZO layer 113 has a film thickness of 25 nm, the a-ITO layer 112 has a film thickness of 25 nm, and the IZO layer 115 has a film thickness of 50 nm.

Then, as illustrated in (d) of FIG. 12, double exposure is carried out as in Embodiment 1, whereby resist patterns 202R and 202G (first resist patterns) of different thicknesses are formed by photolithography for the sub-pixels 71R and 71G, respectively.

In the present embodiment, too, the double exposure is carried out under the same conditions as those set in Embodiment 1. Therefore, in the present embodiment, as in Embodiment 1, the resist pattern 202R formed for the sub-pixel 71R has a film thickness of 1.6 µm, and the resist pattern 202G for the sub-pixel 71G has a film thickness of 0.8 µm.

Instead of employing the double exposure to vary the amount of exposure of the photoresist between the sub-pixels 71R and 71G, the present embodiment may of course use a halftone mask to vary the amount of exposure between the sub-pixels 71R and 71G.

Then, as illustrated in (e) of FIG. 12, portions of the IZO layer 113, the a-ITO layer 112, and the IZO layer 115 which portions are not masked by the resist patterns 202R and 202G (i.e., portions of the IZO layer 113, the a-ITO layer 112, and the IZO layer 115 which portions are not used for the sub-pixels 71R and 71G) are wet-etched all at once by using an etchant while using the resist patterns 202R and 202G as masks.

As in Embodiment 1, usable examples of the etchant include oxalic acid.

With this, as illustrated in (e) of FIG. 12, the transparent electrode layer 121, composed of the IZO layer 113, the a-ITO layer 112, and the IZO layer 115, is patterned for each of the sub-pixels 71R, 71G, and 71B.

Note here that Al, of which the reflecting electrode layer 111 is made, is not etched or is very slow in etching speed. For this reason, as illustrated in (e) of FIG. 12, the sub-pixel 71G is left with the reflecting electrode layer 111 alone.

Then, as illustrated in (f) of FIG. 12, ashing is carried out as in (f) of FIG. 1, so that the resist pattern 202R in the sub-pixel 71R is turned into a thinner film, while the resist pattern 202G in the sub-pixel 71G is completely removed. This causes the surface of the IZO layer 115 in the sub-pixel 71G to be exposed.

After that, as illustrated in (g) of FIG. 12, the a-ITO layer 112 is crystallized by heat-treating the supporting substrate 10 in a manner similar to that illustrated in (g) of FIG. 1. This causes a-ITO to be transformed into p-ITO in the present embodiment, too. As a result, the a-ITO layer 112 below the IZO layer 115 in the sub-pixels 71R and 71G is transformed into a p-ITO layer 114 as illustrated in (g) of FIG. 12.

After that, a portion of the IZO layer 115 which portion is not masked by the resist pattern 202R is wet-etched by using an etchant while using, as a mask, the resist pattern 202R left in the sub-pixel 71R.

A usable example of the etchant here is an etchant, such as oxalic acid, which is similar to that used in etching the IZO layer 113, the a-ITO layer 112, and the IZO layer 115 in the step illustrated in (e) of FIG. 12.

Note here that p-ITO, of which the p-ITO layer 114 is made, is not etched with the etchant (oxalic acid) or is very slow in etching speed.

Further, as mentioned above, Al, of which the reflecting electrode layer 111 is made, is not etched or is very slow in etching speed.

Therefore, in the etching step, only IZO used as the IZO layer 115 in the sub-pixel 71G is etched.

As a result, as illustrated in (h) of FIG. 12, only the p-ITO layer 114 and the IZO layer 113 below the p-ITO layer 114 are left as a transparent electrode layer 121 in the sub-pixel 71G, so that a first electrode 21 is obtained which has a stacking structure in which the transparent electrode layer 121, composed of the p-ITO layer 114 and the IZO layer 113, is stacked on the reflecting electrode layer 111.

Further, in the sub-pixel 71B, a first electrode 21 composed of the reflecting electrode layer 111 is obtained.

After that, as illustrated in (i) of FIG. 12, an ashing process is carried out until complete removal of the resist pattern 202R left in the sub-pixel 71R, so that a surface of the IZO layer 115 in the sub-pixel 71R is exposed. With this, in the sub-pixel 71R, a first electrode 21 is obtained which has a stacking structure in which a transparent electrode layer 121, which is made up of the IZO layer 115, the a-ITO layer 112, and the IZO layer 113 stacked in this order from above, is stacked on the reflecting electrode layer 111.

For the ashing process, an ashing process and a dry etching apparatus which are similar to those employed in the steps illustrated in (f) of FIG. 1 and (f) of FIG. 12 can be employed.

<Effects>

Through these steps described above, the present embodiment, too, allows the transparent electrode layer 121 to have any different film thicknesses for the sub-pixels 71R, 71G, and 71B of different colors as illustrated in (i) of FIG. 12.

Further, in the present embodiment, since the IZO layer is interposed between Al, of which the reflecting electrode layer 111 is made, and the ITO layer, Al and the ITO layer are not in direct contact with each other, so that the occurrence of an electrolytic corrosion reaction can be suppressed.

Modification Example

In the present embodiment, too, the step illustrated in (i) of FIG. 12 may involve concomitant use of wet processing with a resist removing solution, as with the step illustrated in (i) of FIG. 1. Alternatively, the resist pattern 202R remaining in the sub-pixel 71R may be removed solely by wet processing with a resist removing solution.

Further, in the present embodiment, too, the steps illustrated in (f) and (g) of FIG. 12 may be transposed as described with reference to (f) and (g) of FIG. 9, as with the steps illustrated in (f) and (g) of FIG. 1.

Further, in the present embodiment, as described above, variations in the thickness of the transparent electrode layer 121 are made by a method which is similar to that employed in Embodiment 1, except that the type of reflecting electrode material is different and that the number of transparent electrode layers that are stacked is three. Alternatively, variations in the thickness of the transparent electrode layer 121 may be made by the method (procedure) of Embodiment 2.

Further, in the present embodiment, as in Embodiment 3, the resist patterns 202R and 202G may be formed so as to overlap the patterned reflecting electrode layer 111 when viewed in the plan view and be larger than the patterned reflecting electrode layer 111 when viewed in the plan view. This makes it possible to bring about effects which are similar to those brought about by Embodiment 3.

Although the present embodiment, too, has been described by taking, as an example, a case where as mentioned above, the reflecting electrode layer 111 includes a layer made of Al, it is needless to say that as the reflecting electrode material of which the reflecting electrode layer 111 is made, a reflecting electrode material which is similar to that taken as an example in Embodiments 1 and 3 may be used.

Embodiment 5

The present embodiment is described below mainly with reference to (a) through (j) of FIG. 13.

Note that the present embodiment is described mainly in terms of difference from Embodiment 1, and components having the same functions as those used in Embodiment 1 are given the same reference numerals, and as such, are not described below.

The organic EL display device 100 according to the present embodiment is substantially identical to that of Embodiment 1, except for the stacking structure of each first electrode 21 and the method, employed in step 2, for preparing first electrodes 21. Accordingly, in the present embodiment, the different method, employed in step 2, for preparing first electrodes 21 and a stacking structure of each first electrode 21 are described.

<Method for Preparing First Electrodes 21>

Figure 13:
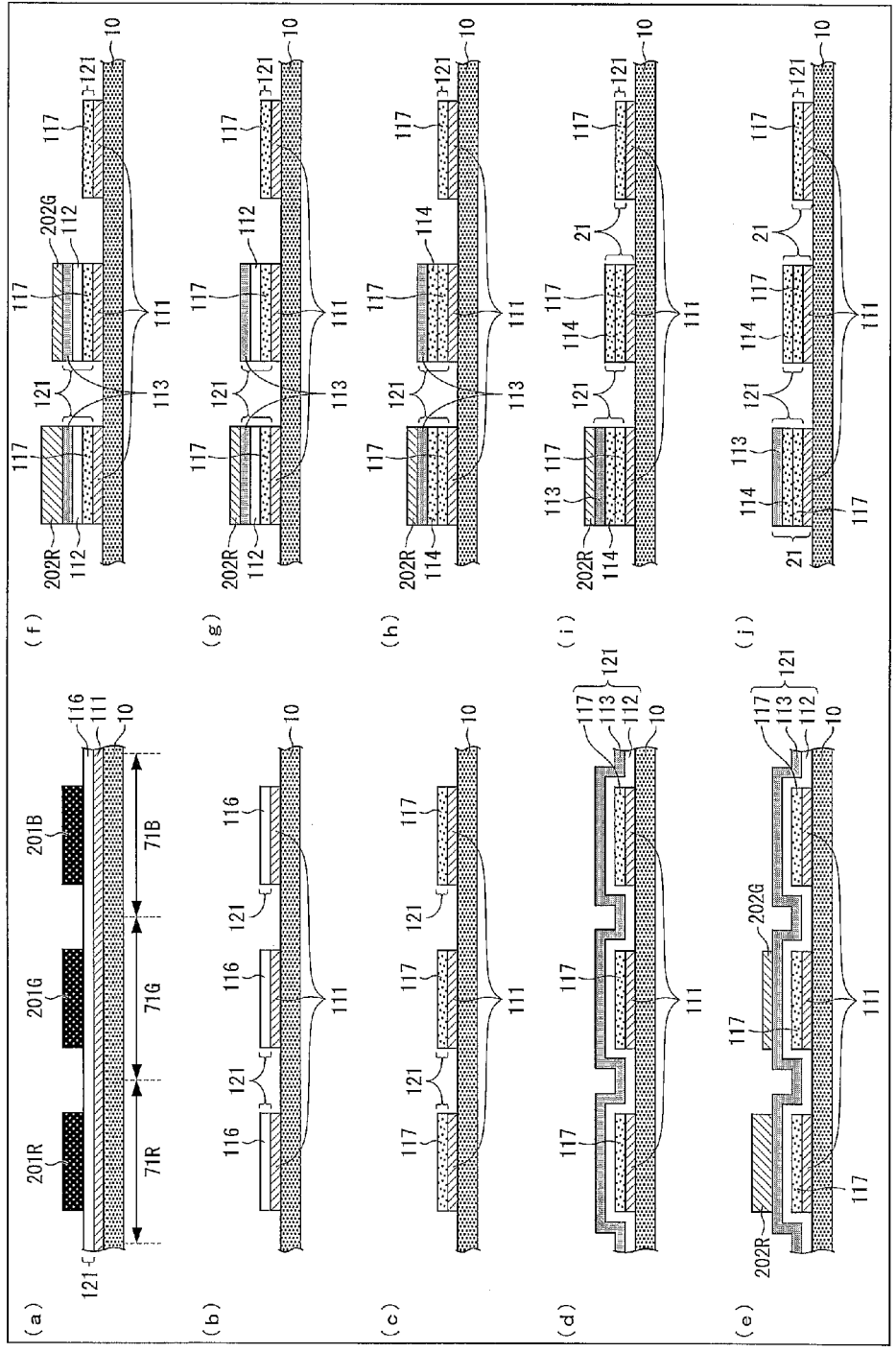
FIG. 13 is a cross-sectional view illustrating, in (a) through (j), successive steps in an example method for preparing a first electrode in a top emission organic EL display device in accordance with Embodiment 5.

FIG. 13 is a set of cross-sectional views (a) through (j) illustrating examples of the successive steps, respectively, of the method, employed in step S2, for preparing first electrodes 21 of a top emission organic EL display device 100.

In the present embodiment, first, as illustrated in (a) of FIG. 13, a reflecting electrode layer 111 made of a reflecting electrode material such as a metal material and an a-ITO layer 116 (fourth transparent electrode layer) are stacked in this order, for example, by sputtering on a supporting substrate 10 (see FIG. 5) formed with an interlayer insulating film 13 and contact holes 13a.

Next, resist patterns 201R, 201G, and 201B (second resist patterns) are formed by photolithography on the a-ITO layer 116 for the sub-pixels 71R, 71G, and 71B, respectively. After that, the reflecting electrode layer 111 and the a-ITO layer 116 are etched while using the resist patterns 201R, 201G, and 201B as masks, and then the resist patterns 201R, 201G, and 201B are removed and washed away with a resist removing solution.

For the etching, wet etching with an etchant which is similar to that used in the step illustrated in (b) of FIG. 1 can be used. Further, as the resist removing solution, a resist removing solution which is similar to that used in the step illustrated in (b) of FIG. 1 can be used.

This causes the reflecting electrode layer 111 and the a-ITO layer 116 to be patterned so as to be separated for the sub-pixels 71R, 71G, and 71B of different colors as illustrated in (b) of FIG. 13. That is, the reflecting electrode layer 111 and the a-ITO layer 116 are patterned for each of the sub-pixels 71R, 71G, and 71B.

In the present embodiment, too, as the reflecting electrode material, a reflecting electrode material which is similar to that used in Embodiment 1 can be used. Further, the thickness of the reflecting electrode layer 111 can be set to be similar to that of the reflecting electrode layer 111 used in Embodiment 1. In the present embodiment, as in Embodiment 1, an Ag electrode having an electrode thickness of 100 nm is prepared as the reflecting electrode layer 111.

Further, the film thickness of the a-ITO layer 116 is set to be, for example, in the range between 15 nm and 25 nm. In the present embodiment, the film thickness of the a-ITO layer 116 is 20 nm.

Next, the a-ITO layer 116 is crystallized, as illustrated in (c) of FIG. 13, by heat-treating the supporting substrate 10.

The temperature at which the supporting substrate 10 is heat-treated and the length of time during which the supporting substrate 10 is heat-treated may be appropriately set so that the a-ITO layer can be crystallized, and as such, are not to be particularly limited.

In the present embodiment, the supporting substrate 10 is heat-treated at 200° C. for one hour. This causes the a-ITO layer 116 of each of the sub-pixels 71R, 71G, and 71B to be transformed into a p-ITO layer 117 (fourth transparent electrode layer).

Next, as illustrated in (d) of FIG. 13, an a-ITO layer 112 (first transparent electrode layer) and an IZO layer 113 (second transparent electrode layer), which serve as a transparent electrode, are stacked in this order, for example, by sputtering on the supporting substrate 10, on which the reflecting electrode layer 111 thus patterned and the p-ITO layer 117 thus patterned have been formed, in such a manner as to cover the reflecting electrode layer 111 and the p-ITO layer 117.

Note here that the p-ITO layer 117, the a-ITO layer 112, and the IZO layer 113 are set to have such film thicknesses that the total film thickness of the p-ITO layer 117, the a-ITO layer 112, and the IZO layer 113 allows the sub-pixel 71R to have the greatest light path length 73R.

In the present embodiment, the p-ITO layer 117 has a film thickness of 20 nm, the a-ITO layer 112 has a film thickness of 45 nm, and the IZO layer 113 has a film thickness of 50 nm. However, in comparison with Embodiment 1, the p-ITO layer 117 undesirably causes increases in the light path lengths 73R, 73G, and 73B between the reflecting electrode layer 111 of the first electrode 21 and the second electrode 31. Therefore, in the present embodiment, the film thickness of the hole transfer layer 23 (film thickness of NPB) is 10 nm, so that these light path lengths 73R, 73G, and 73B can be adjusted.

The steps illustrated in (d) through (j) of FIG. 13 are substantially identical to those illustrated in (c) through (i) of FIG. 1, except that the p-ITO layer 117 is stacked on the reflecting electrode layer 111.

As mentioned in Embodiments 1 through 4, as with the reflecting electrode layer 111, p-ITO is not etched or is very slow in etching speed when the a-ITO layer 112 and the IZO layer 113 are etched.

For this reason, in the steps illustrated in (c) through (i) of FIG. 1, the term "reflecting electrode layer 111" or "Ag, of which the reflecting electrode layer is made" shall be read as "reflecting electrode layer 111 and the p-ITO layer 117 which is the transparent electrode layer 121 stacked on the reflecting electrode layer 111".

In the present embodiment, too, the step illustrated in (j) of FIG. 13 may involve concomitant use of wet processing with a resist removing solution, as with the step illustrated in (i) of FIG. 1. Alternatively, the resist pattern 202R (first resist pattern) remaining in the sub-pixel 71R may be removed solely by wet processing with a resist removing solution.

Modification Example

Further, in the present embodiment, too, the steps illustrated in (g) and (h) of FIG. 13 may be transposed as described with reference to (f) and (g) of FIG. 9, as with the steps illustrated in (f) and (g) of FIG. 1.

<Effects>

Through these steps described above, the present embodiment, too, allows the transparent electrode layer 121 to have different film thicknesses for the sub-pixels 71R, 71G, and 71B of different colors as illustrated in (j) of FIG. 13.

As compared to Embodiment 1, the present embodiment makes it possible that the number of layers that are stacked to form the transparent electrode layer 121 in the sub-pixels 71R and 71G can be increased without an increase in the total number of times of photolithography. That is, the present embodiment allows first electrodes 21 having different thicknesses for the respective sub-pixels 71 to be formed by carrying out photolithography twice, including patterning of the reflecting electrode layer 111.

Further, the film thickness of the transparent electrode layer 121 can be optionally adjusted and changed by changing at least either the film thickness of each transparent electrode layer or the number of transparent electrode layers that are stacked to form the transparent electrode layer 121.

Therefore, for example, the present embodiment makes it possible that the ratio of the light path lengths 73R, 73G, and 73B in the respective sub-pixels 71R, 71G, and 71B can be set to the same ratio as or a different ratio from that of Embodiment 1 by adjusting the respective thicknesses of the p-ITO layer 117, the p-ITO layer 114 (a-ITO layer 112), and the IZO layer 113.

Therefore, even in a case where a combination of sub-pixels, whose emission light colors are different from red, green, and blue, is to be employed, a suitable ratio of light path lengths of such emission light colors (i.e., a suitable ratio of light path lengths which is different from that of red, green, and blue) can also be achieved by the use of the method according to the present embodiment.

In Embodiment 1, too, it is of course possible to change the suitable ratio of light path lengths in the respective sub-pixels by adjusting and changing the respective thicknesses of the p-ITO layer 114 and the IZO layer 113. However, since a larger number of variable parameters leads to a higher degree of freedom of setting, a change in the ratio of light path lengths in the respective sub-pixels can be more easily made by, as mentioned above, changing the number of transparent electrode layers that are stacked, in addition to changing the film thickness of each transparent electrode layer.

Embodiment 6

The present embodiment is described below mainly with reference to (a) through (j) of FIG. 14.

Note that the present embodiment is described mainly in terms of difference from Embodiments 1, 3, and 5, and components having the same functions as those used in Embodiments 1, 3, and 5 are given the same reference numerals, and as such, are not described below.

The organic EL display device 100 according to the present embodiment is substantially identical to that of Embodiment 1, except for the stacking structure of each first electrode 21 and the method, employed in step 2, for preparing first electrodes 21. Accordingly, in the present embodiment, the different method, employed in step 2, for preparing first electrodes 21 and a stacking structure of each first electrode 21 are described.

<Method for Preparing First Electrodes 21>

Figure 14:
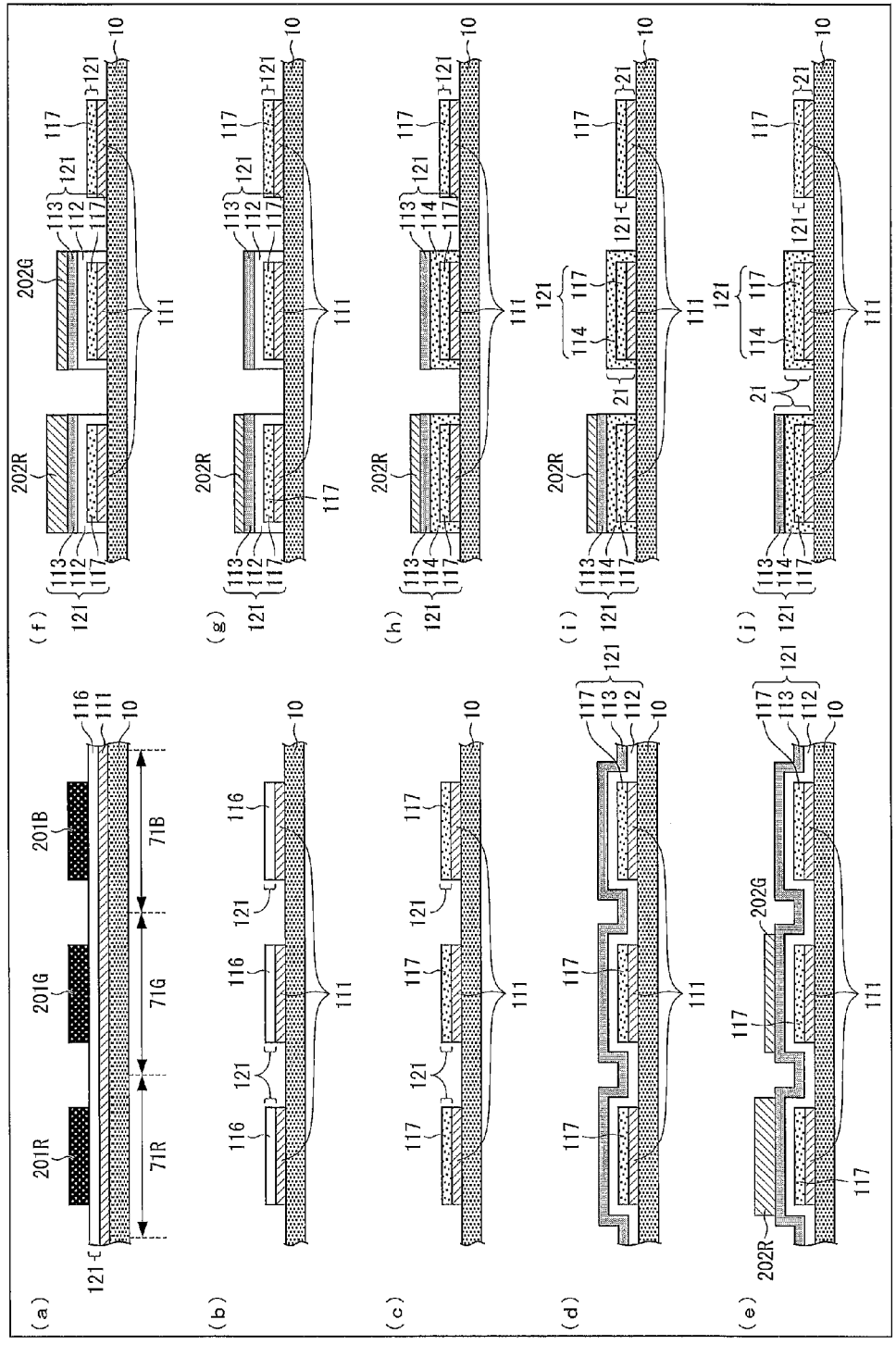
FIG. 14 is a cross-sectional view illustrating, in (a) through (j), successive steps in an example method for preparing a first electrode in a top emission organic EL display device in accordance with Embodiment 6.

FIG. 14 is a set of cross-sectional views (a) through (j) illustrating examples of the successive steps, respectively, of the method, employed in step S2, for preparing first electrodes 21 of a top emission organic EL display device 100.

The present embodiment is substantially identical to Embodiment 3, except that the steps illustrated in (a) through (c) of FIG. 11 in Embodiment 3 are replaced by the steps illustrated in (a) through (c) of FIG. 14, respectively.

In the present embodiment, the steps illustrated in (a) through (c) of FIG. 14 are substantially identical to those illustrated in (a) through (c) of FIG. 13 in Embodiment 5, except that an Al electrode having an electrode thickness of 100 nm is used as a reflecting electrode material to prepare a reflecting electrode layer 111.

Further, the steps illustrated in (d) through (j) of FIG. 14 are identical to those illustrated in (c) through (i) of FIG. 11, except that a p-ITO layer 117 (fourth transparent electrode layer) is stacked on the reflecting electrode layer 111.

For this reason, in the steps illustrated in (c) through (i) of FIG. 11, the term "reflecting electrode layer 111" shall be read as "reflecting electrode layer 111 and the p-ITO layer 117 which is the transparent electrode layer 121 stacked on the reflecting electrode layer 111".

However, in the present embodiment, as compared to Embodiment 3, the p-ITO layer 117 undesirably causes increases in the light path lengths 73R, 73G, and 73B between the reflecting electrode layer 111 of the first electrode 21 and the second electrode 31. Therefore, in the present embodiment, as in Embodiment 5, the film thickness of the hole transfer layer 23 (film thickness of NPB) is 10 nm, so that these light path lengths 73R, 73G, and 73B can be adjusted.

In the present embodiment, too, the step illustrated in (j) of FIG. 14 may involve concomitant use of wet processing with a resist removing solution, as with the step illustrated in (i) of FIG. 1. Alternatively, the resist pattern 202R remaining in the sub-pixel 71R may be removed solely by wet processing with a resist removing solution.

Further, in the present embodiment, too, the steps illustrated in (g) and (h) of FIG. 14 may be transposed as described with reference to (f) and (g) of FIG. 9, as with the steps illustrated in (f) and (g) of FIG. 1.

Through these steps described above, the present embodiment, too, allows the transparent electrode layer 121 to have different film thicknesses for the sub-pixels 71R, 71G, and 71B of different colors as illustrated in (j) of FIG. 14.

Modification Example

Although the present embodiment, too, has been described by taking, as an example, a case where as mentioned above, an Al electrode is formed as the reflecting electrode layer, it is needless to say that the reflecting electrode material of which the reflecting electrode layer 111 is made can be a reflecting electrode material which is identical to that exemplified in Embodiments 1 and 3.

As compared to Embodiment 3, the present embodiment makes it possible that the number of transparent electrode layers that are stacked in the sub-pixels 71R and 71G can be increased without an increase in the total number of times of photolithography. That is, the present embodiment allows first electrodes 21 having different thicknesses for the respective sub-pixels 71 to be formed by carrying out photolithography twice, including patterning of the reflecting electrode layer 111.

Further, the present embodiment makes it possible that by carrying out the steps similar to those of Embodiment 3 in the steps illustrated in (d) through (j) of FIG. 14 as mentioned above, a transparent electrode layer made of p-ITO can be formed in such a manner as to entirely cover the reflecting electrode layer 111, including side surfaces of the reflecting electrode layer 111, as in Embodiment 3.

Embodiment 7

The present embodiment is described below mainly with reference to (a) through (j) of FIG. 15.

Note that the present embodiment is described mainly in terms of difference from Embodiments 1, 4, and 5, and components having the same functions as those used in Embodiments 1, 4, and 5 are given the same reference numerals, and as such, are not described below.

The organic EL display device 100 according to the present embodiment is substantially identical to that of Embodiment 1, except for the stacking structure of each first electrode 21 and the method, employed in step 2, for preparing first electrodes 21. Accordingly, in the present embodiment, the different method, employed in step 2, for preparing first electrodes 21 and a stacking structure of each first electrode 21 are described.

<Method for Preparing First Electrodes 21>

Figure 15:
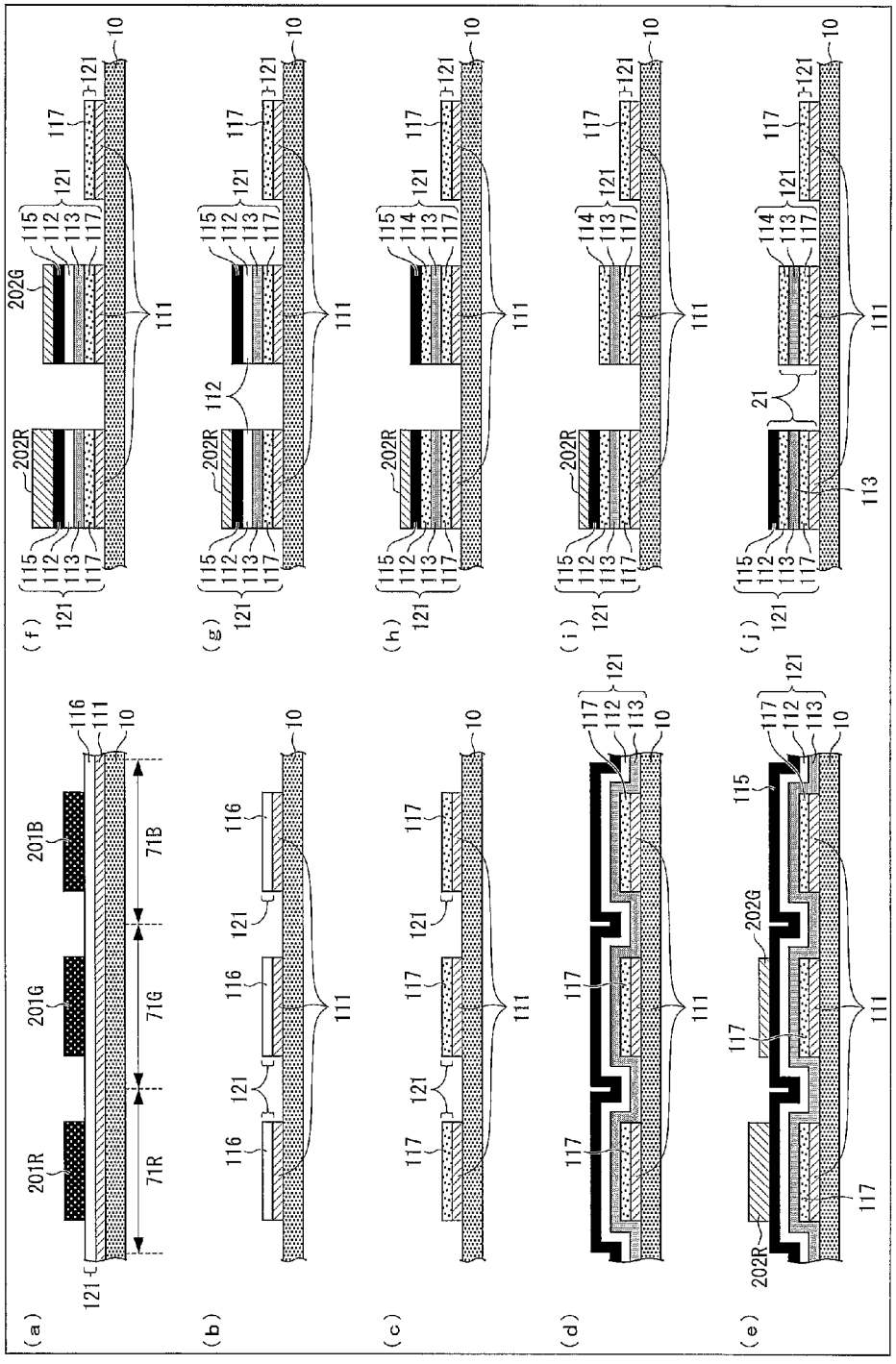
FIG. 15 is a cross-sectional view illustrating, in (a) through (j), successive steps in an example method for preparing a first electrode in a top emission organic EL display device in accordance with Embodiment 7.

FIG. 15 is a set of cross-sectional views (a) through (j) illustrating examples of the successive steps, respectively, of the method, employed in step S2, for preparing first electrodes 21 of a top emission organic EL display device 100.

The present embodiment is substantially identical to Embodiment 4, except that the steps illustrated in (a) through (c) of FIG. 12 in Embodiment 4 are replaced by the steps illustrated in (a) through (c) of FIG. 15, respectively.

In the present embodiment, the steps illustrated in (a) through (c) of FIG. 15 are identical to those illustrated in (a) through (c) of FIG. 13 in Embodiment 5, except that an Al electrode having an electrode thickness of 100 nm is used as a reflecting electrode material to prepare a reflecting electrode layer 111.

Further, the steps illustrated in (d) through (j) of FIG. 15 are identical to those illustrated in (c) through (j) of FIG. 12, except that a p-ITO layer 117 (fourth transparent electrode layer) is stacked on the reflecting electrode layer 111.

For this reason, in the steps illustrated in (c) through (i) of FIG. 12, the term "reflecting electrode layer 111" shall be read as "reflecting electrode layer 111 and the p-ITO layer 117 which is the transparent electrode layer 121 stacked on the reflecting electrode layer 111".

However, in the present embodiment, as compared to Embodiment 4, the p-ITO layer 117 undesirably causes increases in the light path lengths 73R, 73G, and 73B between the reflecting electrode layer 111 of the first electrode 21 and the second electrode 31. Therefore, in the present embodiment, as in Embodiments 5 and 6, the film thickness of the hole transfer layer 23 (film thickness of NPB) is 10 nm, so that these light path lengths 73R, 73G, and 73B can be adjusted.

Modification Example

In the present embodiment, too, the step illustrated in (j) of FIG. 15 may involve concomitant use of wet processing with a resist removing solution, as with the step illustrated in (i) of FIG. 1. Alternatively, the resist pattern 202R remaining in the sub-pixel 71R may be removed solely by wet processing with a resist removing solution.

Further, in the present embodiment, too, the steps illustrated in (g) and (h) of FIG. 15 may be transposed as described with reference to (f) and (g) of FIG. 9, as with the steps illustrated in (f) and (g) of FIG. 1.

Through these steps described above, the present embodiment, too, allows the transparent electrode layer 121 to have different film thicknesses for the sub-pixels 71R, 71G, and 71B of different colors as illustrated in (j) of FIG. 15.

Although the present embodiment, too, has been described by taking, as an example, a case where as mentioned above, an Al electrode is formed as the reflecting electrode layer, it is needless to say that as the reflecting electrode material of which the reflecting electrode layer 111 is made, a reflecting electrode material which is identical to that taken as an example in Embodiments 1 and 3 may be used as in Embodiment 4.

As compared to Embodiment 4, the present embodiment makes it possible that the number of transparent electrode layers that are stacked in the sub-pixels 71R and 71G can be increased without an increase in the total number of times of photolithography. That is, the present embodiment allows first electrodes 21 having different thicknesses for the respective sub-pixels 71 to be formed by carrying out photolithography twice, including patterning of the reflecting electrode layer 111.

Further, in the present embodiment, as in Embodiment 3, the resist patterns 202R and 202G may be formed so as to overlap the patterned reflecting electrode layer 111 when viewed in the plan view and be larger than the patterned reflecting electrode layer 111 when viewed in the plan view. This makes it possible to bring about effects which are similar to those brought about by Embodiment 3.

Modification Example 1 of Embodiments 5 Through 7

As described above, Embodiments 5 through 7 have been described by taking, as an example, a case where the a-ITO layer 116 is formed on the reflecting electrode layer 111, turned into a pattern, and then transformed into the p-ITO layer 117.

Not only is p-ITO obtained by heat-treating a-ITO, but p-ITO can also be formed directly by a film forming apparatus. However, direct formation of p-ITO increases the likelihood of deterioration in flatness of the film due to the growth of crystal grains during film formation and the likelihood of appearance of a pin hole between crystals. The deterioration in flatness of the film increases the likelihood of damage to the organic EL element 20 due to a short circuit between a first electrode 21 and a second electrode 31. Further, the appearance of a pin hole may allow an etchant, a developer, or the like to enter through the pin hole to cause damage to a lower layer. For this reason, it is desirable that the a-ITO layer 116 be formed on the reflecting electrode layer 111, turned into a pattern, and then transformed into the p-ITO layer 117.

Modification Example 2 of
Embodiments 5 Through 7

Further, as described above, in (a) through (c) of FIG. 13, (a) through (c) of FIG. 14, and (a) through (c) of FIG. 15, a description has been given by taking, as an example, a case where the a-ITO layer 116 is formed on the reflecting electrode layer 111, turned into a pattern, and then transformed into the p-ITO layer 117.

However, a p-ITO layer can be provided below the reflecting electrode layer 111, as well as above the reflecting electrode layer 111.

In this case, after an a-ITO layer 110 is formed prior to the formation of the reflecting electrode layer 111 in the step illustrated in (a) of FIG. 13, (a) of FIG. 14, and (a) of FIG. 15, the a-ITO layer 110, the reflecting electrode layer 111, and the a-ITO layer 116 may be wet-etched all at once in the step illustrated in (b) of FIG. 13, (b) of FIG. 14, and (b) of FIG. 15.

In the step illustrated in (c) of FIG. 13, (c) of FIG. 14, and (c) of FIG. 15, the supporting substrate 10 is heat-treated, whereby not only the a-ITO layer 116 but also the a-ITO layer provided under the reflecting electrode layer 111 are crystallized. This makes it possible to form p-ITO layers both on the top and bottom of the reflecting electrode layer 111.

By thus forming the a-ITO layer (not illustrated), the reflecting electrode layer 111, and the a-ITO layer 112 in this order, turning them into patterns, and then heat-treating them, the reflecting electrode layer 111 can be formed to be provided between the p-ITO layers or to be surrounded (i.e., sealed) by the p-ITO layers.

Further, forming an a-ITO layer also on the top of the terminal parts of the signal lines 14 such as the source lines in the step of forming an a-ITO layer allows the p-ITO layer thus formed on the top or bottom of the reflecting electrode layer 111 to be used as a protective film that covers the terminal parts of the signal lines 14 such as the source lines.

Note that by being stacked on the terminal parts of the signal lines 14 such as the source lines, the other transparent electrode layers stacked on the reflecting electrode layer 111 can also be used as protective films that cover the terminal parts of the signal lines 14.

In a case where (i) the reflecting electrode layer 111 or the terminal parts of the signal lines 14 is/are made of Ag and (ii) Ag is in a bared state (i.e., in an exposed state), the bared Ag is oxidized into silver oxide, for example, when the supporting substrate 10 is irradiated with ultraviolet radiation for higher resist wettability.

For this reason, in a case where the reflecting electrode layer 111 or the terminal parts of the signal lines 14 is/are made of Ag, it is not desirable that Ag be in a bared state while being irradiated with ultraviolet.

Further, in a case where the reflecting electrode layer 111 or the terminal parts of the signal lines 14 is/are made of Al, Al may allow a solvent to penetrate through the IZO layer because Al is low in solvent resistance.

For this reason, in any case, it is desirable that the reflecting electrode layer 111 and the terminal parts of the signal lines 14 be covered with a p-ITO layer as described above.

In a case where the reflecting electrode layer 111 and the terminal parts of the signal lines 14 are covered with a p-ITO layer as described above in an early stage of the manufacturing process, it is possible to reduce (i) the number of times the reflecting electrode layer 111 and the terminal parts of the signal lines 14 are immersed in a developer or (ii) regions in the reflecting electrode layer 111 and the terminal parts of the signal lines 14 which regions are immersed in a developer.

Embodiment 8

The present embodiment is described below mainly with reference to FIGS. 16 and 17.

Note that the present embodiment is described mainly in terms of difference from Embodiments 1 through 7, and components having the same functions as those used in Embodiments 1 through 7 are given the same reference numerals, and as such, are not described below.

Figure 16:
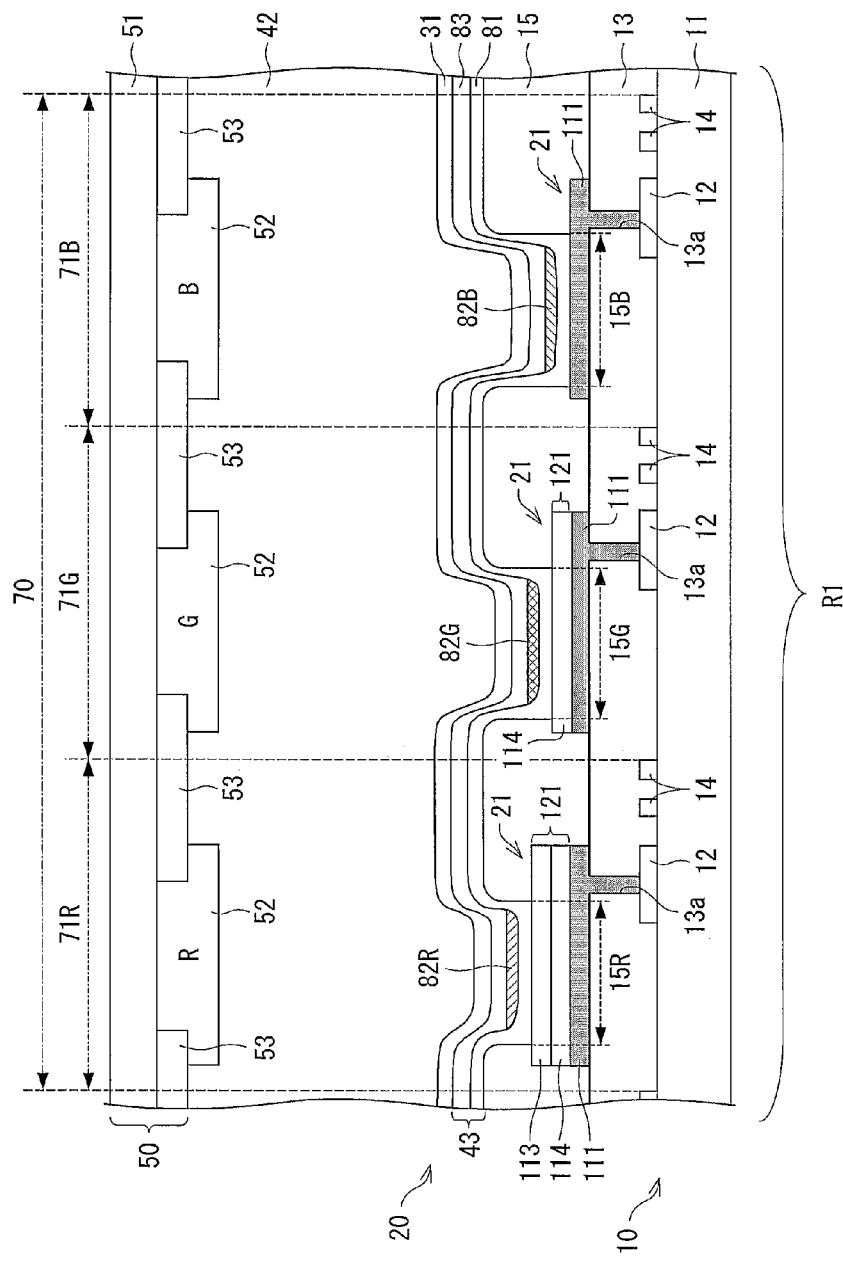
FIG. 16 is a cross-sectional view schematically illustrating a configuration of an organic EL display panel in accordance with Embodiment 8.

FIG. 16 is a cross-sectional view schematically illustrating a configuration of an organic EL display panel 1 in accordance with the present embodiment. FIG. 2 is referred to here as an exploded cross-sectional view schematically illustrating a main part of an organic EL display device 100 in accordance with the present embodiment. FIG. 3 is referred to here as a plan view schematically illustrating a supporting substrate 10 of the organic EL display device 100. FIG. 4 is referred to here as a plan view illustrating a main part of a display region R1 of the supporting substrate 10. FIG. 16 is equivalent to a cross-sectional view schematically illustrating a configuration of the organic EL display panel 1 as taken along line A-A shown in FIG. 4.

As described above, each of Embodiments 1 through 7 has been described by taking, as an example, a case where white light is obtained by combining emission light colors by stacking a plurality of luminescent layers.

However, the method for forming first electrodes 21 as described in each of Embodiments 1 through 7 is similarly applicable to even a case where a plurality of luminescent layers of different emission light colors are formed in the same plane by employing a selective application method in which deposition is carried out separately for each the luminescent layers of different colors.

In the full-color organic EL display device 100 based on the selective application method, as illustrated in FIG. 16, for example, organic EL element 20 each including luminescent layers 82R, 82G, and 82B corresponding to their respective colors of RGB are formed as sub-pixels 71R, 71G, and 71B to be arrayed on the supporting substrate 10. In such an organic EL display device 100, a color image is displayed by selectively causing, with the use of the TFTs 12, these organic EL elements 20 to emit light at a desired luminance.

In the present embodiment, a full-color image display is achieved as described above by forming a plurality of luminescent layers 82R, 82G, and 82B of different emission light colors in the same plane and introducing a microcavity structure into each of the sub-pixels 71R, 71G, and 71B of different emission light colors.

Further, in the present embodiment, too, concomitant use of the CF layer 52 as illustrated in FIG. 16 allows a spectrum of light emitted from the organic EL element 20 to be adjusted with use of the CF layer 52.

As illustrated in FIG. 16, the organic EL display device 100 in accordance with the present embodiment is substantially identical in configuration to the organic EL display device 100 illustrated in FIG. 5, except that the organic EL layers 43 in the organic EL elements 20 have different stacking structures.

The following describes a configuration of an organic EL element 20 in accordance with the present embodiment.

<Configuration of an Organic EL Element 20>

In the organic EL display device 100 illustrated in FIG. 16, for example, a hole injection layer/hole transfer layer 81, luminescent layers 82R, 82G, and 82B, and an electron transfer layer/electron injection layer 83 are formed, as the organic EL layer 43, in this order from the first electrode 21 between the first electrode 21 and the second electrode 31.

The layer serving both as a hole injection layer and a hole transfer layer and the layer serving both as an electron injection layer and an electron transfer layer are as described above in Embodiment 1, and as such, the hole injection layer/hole transfer layer 81 and the electron transfer layer/electron injection layer 83 are not described here.

As illustrated in FIG. 16, the hole injection layer/hole transfer layer 81 is uniformly formed over the entire display region R1 of the supporting substrate 10 so as to cover the first electrodes 21 and the edge covers 15.

On the hole injection layer/hole transfer layer 81, the luminescent layers 82R, 82G, and 82B are formed in correspondence with the sub-pixels 71R, 71G, and 71B, respectively.

The luminescent layers 82R, 82G, and 82B emit light by recombining positive holes injected from the first electrode 21 with electrons injected from the second electrode 31. In the present embodiment, too, the luminescent layers 82R, 82G, and 82B are each made of a material, such as a low-molecular fluorescent pigment or a metal complex, which has a high light emission efficiency.

Above the luminescent layers 82R, 82G, and 82B and the hole injection layer/hole transfer layer 81, the electron transfer layer/electron injection layer 83 is uniformly formed over the entire display region R1 of the supporting substrate 10 so as to cover the luminescent layers 82R, 82G, and 82B and the hole injection layer/hole transfer layer 81.

As described above, the present embodiment has been illustrated by taking, as an example, a case where the hole injection layer/hole transfer layer 81 is provided as a hole injection layer and a hole transfer layer, and has been illustrated by taking, as an example, a case where the electron transfer layer/electron injection layer 83 is provided as an electron injection layer and an electron transfer layer. However, the present embodiment is not to be limited to these examples. A hole injection layer and a hole transfer layer may be formed as layers independent of each other. Similarly, an electron injection layer and an electron transfer layer may be formed as layers independent of each other.

Note that organic layers other than the luminescent layers 82R, 82G, and 82B are not necessary layers as the organic EL layer 43, and may be formed as appropriate in accordance with a property desired for the organic EL element 20.

Further, as in the case of the hole injection layer/hole transfer layer 81 and the electron transfer layer/electron injection layer 83, a single layer may have a plurality of functions.

Further, to the organic EL layer 43, a carrier block layer can be added as needed. For example, the addition of a hole blocking layer as a carrier blocking layer between (i) the luminescent layers 82R, 82G, and 82B and (ii) the electron transfer layer/electron injection layer 83 prevents holes from entering the electron transfer layer/electron injection layer 83, thus making it possible to improve the light emission efficiency.

In the present embodiment, too, the layers other than the first electrode 21 (anode), the second electrode 31 (cathode), and the luminescent layers 82R, 82G, and 82B may be inserted as appropriate.

Employable examples of the configuration of the organic EL element 20 include the following layer configurations (1) through (8):

(1) First electrode/Luminescent layer/Second electrode
(2) First electrode/Hole transfer layer/Luminescent layer/Electron transfer layer/Second electrode
(3) First electrode/Hole transfer layer/Luminescent layer/Hole blocking layer/Electron transfer layer/Second electrode
(4) First electrode/Hole transfer layer/Luminescent layer/Hole blocking layer/Electron transfer layer/Electron injection layer/Second electrode
(5) First electrode/Hole injection layer/Hole transfer layer/Luminescent layer/Electron transfer layer/Electron injection layer/Second electrode
(6) First electrode/Hole injection layer/Hole transfer layer/Luminescent layer/Hole blocking layer/Electron transfer layer/Second electrode
(7) First electrode/Hole injection layer/Hole transfer layer/Luminescent layer/Hole blocking layer/Electron transfer layer/Electron injection layer/Second electrode
(8) First electrode/Hole injection layer/Hole transfer layer/Electron blocking layer/Luminescent layer/Hole blocking layer/Electron transfer layer/Electron injection layer/Second electrode Note that, also in the present embodiment, the order of stacking layers is determined on the assumption that the first electrode 21 serves as an anode and the second electrode 31 serves as a cathode. In the present embodiment, too, in a case where the first electrode 21 serves as a cathode and the second electrode 31 serves as an anode, the order of stacking layers of the organic EL layer 43 is inverted.

<Method for Manufacturing Organic EL Display Device 100>

The following description will discuss a method for manufacturing the organic EL display device 100 in accordance with the present embodiment.

In the present embodiment also, the flow of manufacturing the organic EL display device 100, which has been schematically described with reference to FIG. 7, is employed. In the present embodiment, too, the order of stacking layers is determined on the assumption that the first electrode 21 serves as an anode and the second electrode 31 serves as a cathode. Therefore, in a case where the first electrode 21 serves as a cathode and the second electrode 31 serves as an anode, the materials and the thicknesses of the first electrode 21 and the second electrode 31 are inverted.

The following description will schematically discuss a flow of preparing the organic EL layer 43 in the step S4 of FIG. 7 while exemplifying the organic EL display device 100 having the configuration illustrated in FIG. 16.

<Flow of Preparing Organic EL Layer 43>

Figure 17:
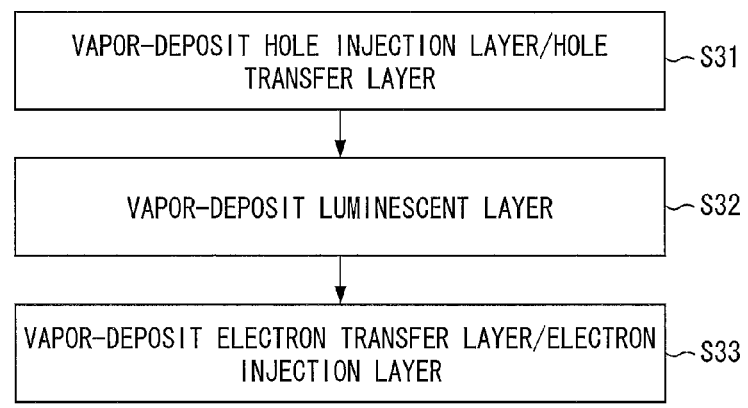
FIG. 17 is a flowchart illustrating successive steps in an example method for preparing an organic EL layer illustrated in FIG. 16.
Figure 18:
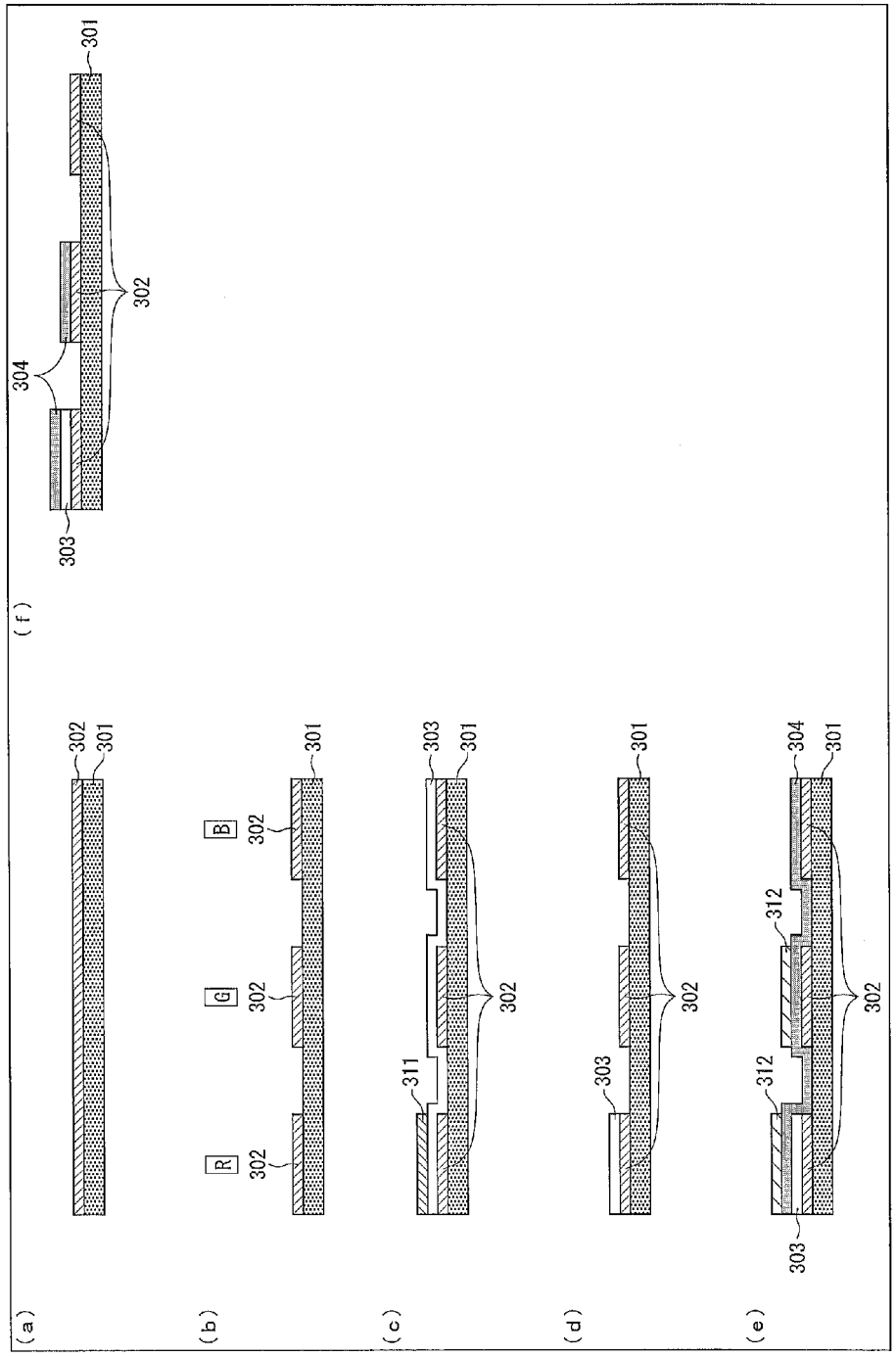
FIG. 18 is a cross-sectional view illustrating, in (a) through (f), successive steps in an example method for changing, for each sub-pixel, a total film thickness of transparent electrode layers on a reflecting electrode layer of an anode.

FIG. 17 is a flowchart illustrating successive steps in an example method for preparing the organic EL layer 43 illustrated in FIG. 16.

In the present embodiment, first, in the step S4 illustrated in FIG. 7, a hole injection layer/hole transfer layer 81 (a hole injection layer and a hole transfer layer) is formed by vacuum vapor deposition in a pattern in an entire display region R1 of the supporting substrate 10, which has been subjected to (i) a bake under a reduced pressure for dehydration and (ii) an oxygen plasma treatment for surface washing of the first electrode 21, so that the hole injection layer/hole transfer layer 81 covers the first electrode 21 and the edge cover 15 (step S31 in FIG. 17).

As mentioned above, the hole injection layer/hole transfer layer 81 is uniformly formed over the entire display region R1 of the supporting substrate 10. For this reason, as with the hole injection layer 22 and the hole transfer layer 23 of Embodiment 1, the vapor deposition is carried out by using, as a vapor deposition mask, an open mask having an opening equivalent to the display region R1.

Meanwhile, in the full-color organic EL display device 100 based on the selective application method as in the present embodiment, as mentioned above, a color image is displayed by selectively causing, with the use of the TFTs 12, the organic EL elements 20 to emit light at desired luminances.

For this reason, in order to manufacture the organic EL display device 100, it is necessary that luminescent layers 82R, 82G, and 82B made of organic luminescent materials that emit their respective colors of light be deposited in a predetermined pattern for each organic EL element 20.

Accordingly, the luminescent layers 82R, 82G, and 82B are selectively applied by vacuum vapor deposition by using, as a vapor deposition mask, a fine mask having openings in regions where luminescent materials of desired display colors are deposited (step S32). This causes a patterned film corresponding to the sub-pixels 71R, 71G, and 71B to be formed.

After that, over the supporting substrate 100 on which the luminescent layers 82R, 82G, and 82B have been formed, an electron transfer layer/electron injection layer 83 (an electron transfer layer and an electron injection layer) (step S33) and a second electrode 31 (step S5) are formed in this order over the entire surface of the pixel region by vacuum vapor deposition by using, as a vapor deposition mask, an open mask having an opening equivalent to the display region R1.

In the present embodiment, too, the vapor deposition can be carried out by using a vacuum vapor deposition device which is similar to that conventional used. Note that the conditions such as a suitable degree of vacuum are as described in Embodiment 1. Therefore, the following description will omit to describe or illustrate the details of a vacuum vapor deposition device and a vapor deposition method.

The materials and thicknesses of a layer that is used as the hole injection layer/hole transfer layer 81 and of a layer that is used as the electron transfer layer/electron injection layer 83 are as described in Embodiment 1.

Further, the materials of which the luminescent layers 82R, 82G, and 82B are made are as described in Embodiment 1. Note that the luminescent layers 82R, 82G, and 82B may each be made of a single material that emits a different color of light, or may be made of a mixed material obtained by mixing a material serving as a host material with another material serving as a guest material or as a dopant.

In this case, the film thicknesses of the luminescent layers 82R, 82G, and 82B are for example in the range between 10 nm and 100 nm.

In the present embodiment, as illustrated in FIG. 16, as in Embodiment 1, the microcavity structure is introduced into the organic EL element 20 by preparing the first electrode 21 in the form of a stacking structure in which the reflecting electrode layer 111 and the transparent electrode layer 121 are stacked.

For this reason, in the present embodiment, the luminescent layers 82R, 82G, and 82B are the same in film thickness. Accordingly, the optical path lengths 73R, 73G, and 73B are set in a similar manner to those of Embodiments 1 through 7.

Therefore, the materials and film thicknesses of the hole injection layer/hole transfer layer 81, the electron transfer layer/electron injection layer 83, and the luminescent layers 82R, 82G, and 82B can be set in a manner similar to a conventional manner. For this reason, the present embodiment omits to describe specific materials and film thicknesses of the hole injection layer/hole transfer layer 81, the electron transfer layer/electron injection layer 83, and the luminescent layers 82R, 82G, and 82B.

<Effects>

As mentioned above, in the present embodiment, as in Embodiment 1, the microcavity structure is introduced into the organic EL element 20 by preparing the first electrode 21 in the form of a stacking structure in which the reflecting electrode layer 111 and the transparent electrode layer 121 are stacked.

This makes it unnecessary, in the present embodiment, to make the respective film thicknesses of the luminescent layers 82R, 82G, and 82B different for the respective emission light colors in order to introduce the microcavity structure into the organic EL element 20.

This makes it possible, in the present embodiment, too, to form the luminescent layers 82R, 82G, and 82B so that they have equally thin film thicknesses, as in the cases of Embodiments 1 through 7 where luminescent layers for emitting white light are used, and this makes it possible to shorten tact time.

Further, in the present embodiment, too, light can be obtained, by the organic EL element 20, from a combination of lights emitted from the luminescent layers 82R, 82G, and 82B on which combination of lights the microcavity effect is exerted. Further, by adjusting the light with the use of the CF layer 52 provided in the sealing substrate 50, it is possible to take out light having a desired spectrum to the outside. By thus combining (i) the luminescent layers 82R, 82G, and 82B which have been formed by the selective application, (ii) the microcavity effect, and (iii) the CF layer 52, it is possible to improve a color purity.

Further, in the present embodiment, too, effects which are similar to those brought about by Embodiments 1 through 7 are of course brought about by causing the transparent electrode layers 121 to have different film thicknesses for the first electrodes 21 in the respective sub-pixels 71R, 71G, and 71B as in Embodiments 1 through 7.

<Main Points of Embodiments 1 Through 8 and Modification Example>

As above described, according to Embodiments 1 through 8, the second transparent electrode layer, which is made of the transparent electrode material whose composition is different from the amorphous transparent electrode material, is formed on the first transparent electrode layer which is made of the amorphous transparent electrode material, and resist patterns having different film thicknesses are formed in respective at least two sub-pixels, and the transparent electrode layers are etched by making use of (i) reduction in thickness of the resist pattern by ashing and (ii) a variation of etching tolerance which variation is derived by utilizing crystallization of the first transparent electrode layer. This makes it possible to vary the number of transparent electrode layers, which are stacked on the reflecting electrode layer, between sub-pixels (e.g., for each sub-pixel).

Note that, Embodiments 1 through 8 have been described with reference to any of the following examples for varying the number of transparent electrode layers between sub-pixels: that is, (1) the reflecting electrode layer, on which the transparent electrode layers are being stacked as appropriate, is patterned, and then at least the first transparent electrode layer, which is made of the amorphous transparent electrode material, and the second transparent electrode layer are stacked on the patterned reflecting electrode layer, and (2) before patterning the reflecting electrode layer, at least the first transparent electrode layer made of the amorphous transparent electrode material and the second transparent electrode layer are stacked on the reflecting electrode layer, and at least one of or all of the transparent electrode layers, which have been thus stacked in advance, is/are selectively removed by etching in not all the sub-pixels of different emission light colors. Note, however, that the embodiments of the present invention are not limited to those.

Embodiments 1 through 8 have been described with reference to the example in which the transparent electrode layers are etched in three sub-pixels of different emission light colors. Note, however, that the embodiments of the present invention are not limited to this.

For example, it is possible to arbitrarily and easily set and change the number of transparent electrode layers and the number of sub-pixels, in which different numbers of transparent electrode layers are stacked, by (i) the method (1) or (2) alone, (ii) repeating the method (1) or (2), (iii) repeating a combination of the methods (1) and (2), or (iv) employing a combination of the methods (1) and (2) and a known method such as stacking of a single transparent electrode layer with the use of photolithography.

In any of the cases, it is possible to vary, between sub-pixels of different display colors, the number of transparent electrode layers on the reflecting electrode layer and a total film thickness of the transparent electrode layers by the smaller number of times of photolithography than a conventional technique, provided that the number of transparent electrode layers to be stacked is identical with that of the conventional technique.

As above described, an example of an embodiment of the present invention includes the steps of: (c) forming first resist patterns, which have different film thicknesses, on the second transparent electrode layer in respective at least two of a plurality of sub-pixels having different display colors;
(d) patterning at least the second transparent electrode layer and the first transparent electrode layer by etching while using the first resist patterns as a mask;
(e) ashing the first resist patterns so as to (i) remove a thinnest one of the first resist patterns so that the second transparent electrode layer is exposed and (ii) reduce thicknesses of the other of the first resist patterns, and then etching and removing an exposed part of the second transparent electrode layer while using, as a mask, the other of the first resist patterns whose thicknesses have been reduced or, in a case where a transparent electrode layer made of an amorphous transparent electrode material exists, etching and removing the exposed part of the second transparent electrode layer and the transparent electrode layer, the step (e) being carried out at least once;
(f) after the step (e), removing a thickest one of the first resist patterns which have been formed in the step (c),
the step (e) being repeated until a part of the second transparent electrode layer, which part is provided under a second thickest one of the first resist patterns, is removed by etching,
the step (e) at least including the steps of:
(e-1) ashing so as to (i) remove the second thickest one of the first resist patterns so that the part of the second transparent electrode layer, which part is provided under the second thickest one of the first resist patterns, is exposed and (ii) reduce a thickness of the thickest one of the first resist patterns;
(e-2) etching and removing the exposed part of the second transparent electrode layer while using, as a mask, the thickest one of the first resist patterns whose thickness has been reduced in the step (e-1); and
(e-3) crystallizing the first transparent electrode layer so as to transform the first transparent electrode layer into a polycrystalline first transparent electrode layer,
the step (e-3) being carried out (i) immediately before the step (e-1) or (ii) between the step (e-1) and the step (e-2).

This makes it possible to arbitrarily make a total film thickness of transparent electrode layers on the reflecting electrode layer different between, for example, sub-pixels (e.g., for each of sub-pixels) of different display colors by the smaller number of times of photolithography than that of a conventional technique.

<Overview>

As above described, according to the method of an aspect of the present invention for manufacturing a display device, the second transparent electrode layer is formed on the first transparent electrode layer which is made of the amorphous transparent electrode material, and resist patterns having different film thicknesses are formed in respective at least two sub-pixels, and the transparent electrode layers are etched by making use of (i) reduction in thickness of the resist pattern by ashing and (ii) a variation of etching tolerance which variation is derived by utilizing crystallization of the first transparent electrode layer.

As above described, a method of an aspect of the present invention for manufacturing a display device is a method for manufacturing a display device in which, (i) in at least one sub-pixel, one of two electrodes, which are paired so as to form an electric field, has a reflecting electrode layer and a plurality of transparent electrode layers formed on the reflecting electrode layer, and (ii) a total film thickness of the plurality of transparent electrode layers varies between sub-pixels having different display colors, the method including the steps of:
(a) forming a first transparent electrode layer from an amorphous transparent electrode material;
(b) forming, on the first transparent electrode layer, a second transparent electrode layer from a transparent electrode material whose composition is different from the amorphous transparent electrode material;
(c) forming first resist patterns, which have different film thicknesses, on the second transparent electrode layer in respective at least two of a plurality of sub-pixels having different display colors;
(d) patterning at least the second transparent electrode layer and the first transparent electrode layer by etching while using the first resist patterns as a mask;
(e) ashing the first resist patterns so as to (i) remove a thinnest one of the first resist patterns so that the second transparent electrode layer is exposed and (ii) reduce thicknesses of the other of the first resist patterns, and then etching and removing an exposed part of the second transparent electrode layer while using, as a mask, the other of the first resist patterns whose thicknesses have been reduced or, in a case where a transparent electrode layer made of an amorphous transparent electrode material exists, etching and removing the exposed part of the second transparent electrode layer and the transparent electrode layer, the step (e) being carried out at least once;
(f) after the step (e), removing a thickest one of the first resist patterns which have been formed in the step (c),
the step (e) being repeated until a part of the second transparent electrode layer, which part is provided under a second thickest one of the first resist patterns, is removed by etching,
the step (e) at least including the steps of:
(e-1) ashing so as to (i) remove the second thickest one of the first resist patterns so that the part of the second transparent electrode layer, which part is provided under the second thickest one of the first resist patterns, is exposed and (ii) reduce a thickness of the thickest one of the first resist patterns;
(e-2) etching and removing the exposed part of the second transparent electrode layer while using, as a mask, the thickest one of the first resist patterns whose thickness has been reduced in the step (e-1); and (e-3) crystallizing the first transparent electrode layer so as to transform the first transparent electrode layer into a polycrystalline first transparent electrode layer, the step (e-3) being carried out (i) immediately before the step (e-1) or (ii) between the step (e-1) and the step (e-2).

By thus stacking the plurality of transparent electrode layers by utilizing an etching selectivity due to the difference in etching tolerance, it is possible to arbitrarily make a total film thickness of transparent electrode layers, which are stacked on the reflecting electrode layer, different for, for example, each of sub-pixels of different display colors by the smaller number of times of photolithography than that of a conventional technique. This makes it possible to reduce cost and footprint as compared with a conventional technique. Further, the number of times of the processes such as exposure, development, and resist removing can be reduced, and it is therefore possible to prevent a defective pixel from being generated. Moreover, it is possible to shorten a tact time.

According to the method, it is preferable that the first transparent electrode layer is made of indium tin oxide, and the second transparent electrode layer is made of indium zinc oxide.

Amorphous indium tin oxide can be easily transformed into polycrystalline indium tin oxide by a heat treatment. Polycrystalline indium tin oxide has an etching tolerance higher than that of indium zinc oxide, and therefore, when the indium zinc oxide is intended to be etched in the step (e-2), the polycrystalline indium tin oxide is not etched or is etched very slowly. Therefore, in the step (e-2), only the second transparent electrode layer made of indium zinc oxide is removed, whereas the first transparent electrode layer is not removed.

It is preferable that the method further includes the step of: before the step (a), forming reflecting electrode layers which have been patterned for respective of the sub-pixels having different display colors, in the step (a) and the step (b), the first transparent electrode layer and the second transparent electrode layer being formed on the reflecting electrode layers in this order.

According to the configuration, it is possible to form the electrodes, which are made of transparent electrode layers stacked on the reflecting electrode layer and are different in thicknesses for each sub-pixel, by carrying out photolithography twice, even though the patterning of the reflecting electrode layer is included.

Therefore, according to the method, it is possible to form the electrodes, which are different, for each of sub-pixels of different display colors, in total film thickness of transparent electrode layers stacked on the reflecting electrode layer, by carrying out the smaller number of times of photolithography than that of a conventional technique.

It is preferable that the method further includes the step of: before the step (a), forming a reflecting electrode layer, in the step (a) and the step (b), the first transparent electrode layer and the second transparent electrode layer being formed on the reflecting electrode layer in this order, in the step (c), the first resist patterns having different film thicknesses being formed on the second transparent electrode layer for the respective plurality of sub-pixels, and in the step (d), the second transparent electrode layer, the first transparent electrode layer, and the reflecting electrode layer being etched and patterned while using the first resist patterns as masks.

According to the configuration, the first transparent electrode layer made of the amorphous transparent electrode material and the second transparent electrode layer are formed in this order on the reflecting electrode layer, and then the first transparent electrode layer and the second transparent electrode layer are etched altogether with the use of the first resist patterns which are different in film thickness for each sub-pixel.

According to the configuration, it is possible to form the electrodes, which are made of transparent electrode layers stacked on the reflecting electrode layer and are different in thicknesses for each sub-pixel, by carrying out photolithography once, even though the patterning of the reflecting electrode layer is included.

Therefore, according to the method, it is possible to form the electrodes, which are different, for each of sub-pixels of different display colors, in total film thickness of transparent electrode layers stacked on the reflecting electrode layer, by carrying out the still smaller number of times of photolithography than that of a conventional technique.

It is preferable that the method further includes the step of: before the step (a), forming reflecting electrode layers which are patterned for respective of the sub-pixels having different display colors: and forming, on the reflecting electrode layers, a third transparent electrode layer from a transparent electrode material whose composition is different from the amorphous transparent electrode material of which the first transparent electrode layer is made, in the step (a) and the step (b), the first transparent electrode layer and the second transparent electrode layer being formed on the third transparent electrode layer in this order, in the step (d), the second transparent electrode layer, the first transparent electrode layer, and the third transparent electrode layer being etched and patterned while using the first resist patterns as masks.

According to the method, the first transparent electrode layer made of the amorphous transparent electrode material is formed on the reflecting electrode layer via the third transparent electrode layer.

Therefore, according to the method, a region of contact between the reflecting electrode layer and the amorphous transparent electrode layer is not exposed.

In a case where the amorphous transparent electrode layer is directly stacked on the reflecting electrode layer, electrolytic corrosion is caused in washing or in development depending on a combination of the reflecting electrode layer and the amorphous transparent electrode layer, and therefore the reflecting electrode layer and the transparent electrode layer may be damaged.

However, according to the method, the region of contact between the reflecting electrode layer and the amorphous transparent electrode layer is not exposed. This makes it possible to prevent such a problem.

It is preferable that the method further includes the step of: before the step (a), forming (i) reflecting electrode layers which are patterned for respective of the sub-pixels having different display colors and (ii) polycrystalline fourth transparent electrode layers on the respective reflecting electrode layers, in the step (a) and the step (b), the first transparent electrode layer and the second transparent electrode layer being formed on the polycrystalline fourth transparent electrode layers in this order.

Depending on a type of the reflecting electrode material, in a case where the reflecting electrode layer is not covered (i.e., is exposed) and, for example, is irradiated with ultraviolet rays in order to enhance wettability of the resist, reflective characteristic of the reflecting electrode layer can be decreased due to oxidation. Further, in a case where the reflecting electrode layer is not covered (i.e., is exposed) and is made of a reflecting electrode material which is low in solvent tolerance, a solvent can be soaked into the exposed reflecting electrode layer. Therefore, in a case where the reflecting electrode layer is made of such a reflecting electrode material, it is not preferable that the reflecting electrode layer is exposed.

According to the method, the fourth transparent electrode layer is thus formed on the reflecting electrode layer in an early stage of the manufacturing steps. This allows the reflecting electrode layer to be protected from the factors that may deteriorate quality of the reflecting electrode layer.

It is preferable that the method further includes the steps of:
before the step (a),
forming (i) reflecting electrode layers which are patterned for respective of the sub-pixels having different display colors and (ii) polycrystalline fourth transparent electrode layers on the respective reflecting electrode layers: and
forming, on the polycrystalline fourth transparent electrode layers, a third transparent electrode layer from a transparent electrode material whose composition is different from the amorphous transparent electrode material of which the first transparent electrode layer is made,
in the step (a) and the step (b), the first transparent electrode layer and the second transparent electrode layer being formed on the third transparent electrode layer in this order,
in the step (d), the second transparent electrode layer, the first transparent electrode layer, and the third transparent electrode layer being etched and patterned while using the first resist patterns as masks.

In this case also, the fourth transparent electrode layer is thus formed on the reflecting electrode layer in an early stage of the manufacturing steps. This allows the reflecting electrode layer to be protected from the factors that may deteriorate quality of the reflecting electrode layer.

Moreover, according to the method, the number of transparent electrode layers to be stacked on the reflecting electrode layer can be increased. By thus changing the number of stacked layers as well as a film thickness of each of the transparent electrode layers, it is possible to further easily change a ratio of light path length between the sub-pixels.

According to the method, it is preferable that the step of forming the reflecting electrode layers and the polycrystalline fourth transparent electrode layers includes the steps of:
forming a reflecting electrode layer;
forming a fourth transparent electrode layer from an amorphous transparent electrode material on the reflecting electrode layers;
forming second resist patterns on the fourth transparent electrode layer for the respective sub-pixels having different display colors;
patterning the reflecting electrode layer and the fourth transparent electrode layer while using the second resist patterns as masks; and
crystallizing the fourth transparent electrode layers so as to transform the fourth transparent electrode layers into the polycrystalline fourth transparent electrode layers.

According to the configuration, the fourth transparent electrode layer made of the amorphous transparent electrode material and the reflecting electrode layer are simultaneously patterned. This makes it possible to form, on the patterned reflecting electrode layer, the fourth transparent electrode layer made of the polycrystalline transparent electrode material in a pattern identical with that of the reflecting electrode layer, without increasing the number of times of carrying out photolithography.

Depending on a type of the reflecting electrode material, a reflective characteristic of the reflecting electrode layer can be decreased due to oxidation by irradiation with ultraviolet rays or, in a case where the reflecting electrode layer is made of a reflecting electrode material which is low in solvent tolerance, a solvent can be soaked into the reflecting electrode layer. Therefore, in a case where the reflecting electrode layer is made of such a reflecting electrode material, it is not preferable that the reflecting electrode layer is exposed.

According to the method, the fourth transparent electrode layer is formed on the reflecting electrode layer in an early stage of the manufacturing steps. This allows the reflecting electrode layer to be protected from the factors that may deteriorate quality of the reflecting electrode layer.

Moreover, according to the method, the number of transparent electrode layers to be stacked on the reflecting electrode layer can be increased without increasing the number of times of carrying out photolithography throughout the manufacturing. According to the method, it is possible to form the electrodes, which are made of transparent electrode layers stacked on the reflecting electrode layer and are different in thicknesses for each of sub-pixels of different display colors, by carrying out photolithography twice, even though the patterning of the reflecting electrode layer is included.

According to the method, it is preferable that the fourth transparent electrode layer is made of indium tin oxide.

As early described, amorphous indium tin oxide can be easily transformed into polycrystalline indium tin oxide, which is high in etching tolerance, by heat treatment.

The polycrystalline indium tin oxide can be directly formed with a film formation device, instead of being formed by subjecting the amorphous indium tin oxide to the heat treatment. Note, however, that the polycrystalline indium tin oxide which has been directly formed has a problem of (i) deteriorated film-flatness due to growth of crystal grains in the film formation and (ii) pinholes which are easily generated between crystals. Therefore, in a case where the polycrystalline indium tin oxide is formed on the reflecting electrode layer, it is preferable to (i) form the amorphous indium tin oxide on the reflecting electrode layer as the amorphous fourth transparent electrode layer, then (ii) pattern the reflecting electrode layer and the amorphous fourth transparent electrode layer as above described, and then (iii) transform the amorphous indium tin oxide into the polycrystalline indium tin oxide.

According to the method, it is preferable that the third transparent electrode layer is made of indium zinc oxide.

Indium zinc oxide does not cause an electrolytic corrosion with respect to the reflecting electrode layer. Moreover, indium zinc oxide is lower in etching tolerance than that of the polycrystalline transparent electrode layer and therefore, in a case where the third transparent electrode layer is stacked on the polycrystalline transparent electrode layer, it is possible to selectively etch only the third transparent electrode layer which is made of indium zinc oxide.

According to the method, it is preferable that, in the step (c), the first resist pattern is formed so as to (i) overlap with the reflecting electrode layer, which has been patterned, in a plan view and (ii) be larger than the reflecting electrode layer, which has been patterned, in the plan view.

In a case where the amorphous transparent electrode layer is directly stacked on the reflecting electrode layer, electrolytic corrosion is caused in washing or in development depending on a combination of the reflecting electrode layer and the amorphous transparent electrode layer, and therefore the reflecting electrode layer and the transparent electrode layer may be damaged.

However, according to the method, the reflecting electrode layer can be covered with the second transparent electrode layer.

Therefore, according to the method, the region of contact between the reflecting electrode layer and the amorphous transparent electrode layer is not exposed. This makes it possible to prevent such a problem.

According to the method, it is preferable that the reflecting electrode layer is made of any one selected from the group consisting of silver, a silver alloy, and an aluminum alloy.

These materials do not cause electrolytic corrosion with respect to the amorphous transparent electrode layer. Therefore, these materials are suitable for the reflecting electrode material of which the reflecting electrode layer is made.

As early described, in a case where the first resist pattern is formed so as to (i) overlap with the reflecting electrode layer, which has been patterned, in a plan view and (ii) be larger than the reflecting electrode layer, which has been patterned, in the plan view or the first transparent electrode layer made of the amorphous transparent electrode material is formed on the reflecting electrode layer via the third transparent electrode layer, the reflecting electrode layer can include an aluminum layer.

The aluminum layer hardly causes a problem of decrease in reflective characteristic which decrease is caused by oxidation due to irradiation of ultraviolet rays, as with the reflecting electrode layer made of silver.

However, depending on a type of the amorphous transparent electrode material (e.g., in a case where the amorphous transparent electrode material is indium tin oxide) and in a case where the region of contact between the reflecting electrode layer and the amorphous transparent electrode layer is exposed, electrolytic corrosion is caused in washing or in development, and therefore the reflecting electrode layer and the transparent electrode layer may be damaged.

However, as above described, in a case where (i) the first resist pattern is formed so as to (a) overlap with the reflecting electrode layer, which has been patterned, in a plan view and (b) be larger than the reflecting electrode layer, which has been patterned, in the plan view or (ii) the first transparent electrode layer made of the amorphous transparent electrode material is formed on the reflecting electrode layer via the third transparent electrode layer, the region of contact between the reflecting electrode layer and the amorphous transparent electrode layer is not exposed. Therefore, in this case, the above described problem does not occur even in a case where aluminum is employed as the reflecting electrode material. Therefore, as the reflecting electrode layer, it is possible to employ the reflecting electrode layer including an aluminum layer that brings about the above described effect.

According to the method, it is preferable that the two electrodes are an anode and a cathode, respectively, and the one of the two electrodes is the anode; and an organic electroluminescence layer is formed between the anode and the cathode.

According to the method, it is possible to easily change, for each of sub-pixels of different emission light colors, a light path length of an organic electroluminescence element which is made up of the anode, the cathode, and the organic electroluminescence layer provided between the anode and the cathode.

Therefore, according to the method, it is possible to obtain the organic electroluminescence element that has a microcavity structure. From this, due to a microcavity effect, it is possible to improve properties such as a color purity, a chromaticity of emitted light, and light emission efficiency in the display device including the organic electroluminescence element.

The present invention is not limited to the embodiments, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The present invention can be suitably applied to a method for manufacturing a display device that includes a light-emitting element, such as an organic EL element or an inorganic EL element, which can be configured as a micro resonator.

REFERENCE SIGNS LIST

1: Organic EL display panel
2: Electric wiring terminal
10: Supporting substrate
11: Insulating substrate
12: TFT
13: Interlayer insulating film
13a: Contact hole
14: Signal line
15: Edge cover
15R, 15G, 15B: Opening
20: Organic EL element
21: First electrode
22: Hole injection layer
23: Hole transfer layer
24: First luminescent layer
25: Electron transfer layer
26: Carrier generation layer
27: Hole transfer layer
28: Second luminescent layer
29: Electron transfer layer
30: Electron injection layer
31: Second Electrode
41: Sealing resin layer
42: Filler resin layer
43: Organic EL layer
50: Sealing substrate
51: Insulating substrate
52: CF layer
53: BM
60: Connection part
70: Pixel
71: Sub-pixel
71R, 71G, 71B: Sub-pixel
72: Luminescent region
73R, 73G, 73B: Light path length
81: Hole injection layer/hole transfer layer
82R, 82G, 82B: Luminescent layer
83: Electron transfer layer/electron injection layer
100: Organic EL display device
101: Pixel section
102: Circuit section
103: Connection terminal
110: a-ITO layer
111: Reflecting electrode layer
112: a-ITO layer
113: IZO layer
114: p-ITO layer
115: IZO layer 116: a-ITO layer
117: p-ITO layer
121: Transparent electrode layer
201R, 201G, 201B: Resist pattern
211R, 211G, 211B: Resist pattern
L: Sealing region
R1: Display region
R2: Second electrode connection region
R3: Terminal section region

The invention claimed is:

1. A method for manufacturing a display device in which, (i) in at least one sub-pixel, one of two electrodes, which are paired so as to form an electric field, has a reflecting electrode layer and a plurality of transparent electrode layers formed on the reflecting electrode layer and (ii) a total film thickness of the plurality of transparent electrode layers varies between sub-pixels having different display colors, said method comprising the steps of:
(a) forming a first transparent electrode layer from an amorphous transparent electrode material;
(b) forming, on the first transparent electrode layer, a second transparent electrode layer from a transparent electrode material whose composition is different from the amorphous transparent electrode material;
(c) forming first resist patterns, which have different film thicknesses, on the second transparent electrode layer in respective at least two of a plurality of sub-pixels having different display colors;
(d) patterning at least the second transparent electrode layer and the first transparent electrode layer by etching while using the first resist patterns as a mask;
(e) ashing the first resist patterns so as to (i) remove a thinnest one of the first resist patterns so that the second transparent electrode layer is exposed and (ii) reduce thicknesses of the other of the first resist patterns, and then etching and removing an exposed part of the second transparent electrode layer while using, as a mask, said other of the first resist patterns whose thicknesses have been reduced or, in a case where a transparent electrode layer made of an amorphous transparent electrode material exists, etching and removing the exposed part of the second transparent electrode layer and the transparent electrode layer, the step (e) being carried out at least once;
(f) after the step (e), removing a thickest one of the first resist patterns which have been formed in the step (c),
the step (e) being repeated until a part of the second transparent electrode layer, which part is provided under a second thickest one of the first resist patterns, is removed by etching,
the step (e) at least including the steps of:
(e-1) ashing so as to (i) remove the second thickest one of the first resist patterns so that the part of the second transparent electrode layer, which part is provided under the second thickest one of the first resist patterns, is exposed and (ii) reduce a thickness of the thickest one of the first resist patterns;
(e-2) etching and removing the exposed part of the second transparent electrode layer while using, as a mask, the thickest one of the first resist patterns whose thickness has been reduced in the step (e-1); and
(e-3) crystallizing the first transparent electrode layer so as to transform the first transparent electrode layer into a polycrystalline first transparent electrode layer, the step (e-3) being carried out (i) immediately before the step (e-1) or (ii) between the step (e-1) and the step (e-2).

2. The method as set forth in claim 1, wherein:
the first transparent electrode layer is made of indium tin oxide, and the second transparent electrode layer is made of indium zinc oxide.

3. A method as set forth in claim 1, further comprising the step of:
before the step (a), forming reflecting electrode layers which have been patterned for respective of the sub-pixels having different display colors,
in the step (a) and the step (b), the first transparent electrode layer and the second transparent electrode layer being formed on the reflecting electrode layers in this order.

4. A method as set forth in claim 1, further comprising the step of:
before the step (a), forming a reflecting electrode layer,
in the step (a) and the step (b), the first transparent electrode layer and the second transparent electrode layer being formed on the reflecting electrode layer in this order,
in the step (c), the first resist patterns having different film thicknesses being formed on the second transparent electrode layer for the respective plurality of sub-pixels, and
in the step (d), the second transparent electrode layer, the first transparent electrode layer, and the reflecting electrode layer being etched and patterned while using the first resist patterns as masks.

5. A method as set forth in claim 1, further comprising the steps of:
before the step (a),
forming reflecting electrode layers which are patterned for respective of the sub-pixels having different display colors: and
forming, on the reflecting electrode layers, a third transparent electrode layer from a transparent electrode material whose composition is different from the amorphous transparent electrode material of which the first transparent electrode layer is made,
in the step (a) and the step (b), the first transparent electrode layer and the second transparent electrode layer being formed on the third transparent electrode layer in this order,
in the step (d), the second transparent electrode layer, the first transparent electrode layer, and the third transparent electrode layer being etched and patterned while using the first resist patterns as masks.

6. A method as set forth in claim 1, further comprising a step of:
before the step (a), forming (i) reflecting electrode layers which are patterned for respective of the sub-pixels having different display colors and (ii) polycrystalline fourth transparent electrode layers on the respective reflecting electrode layers,
in the step (a) and the step (b), the first transparent electrode layer and the second transparent electrode layer being formed on the polycrystalline fourth transparent electrode layers in this order.

7. A method as set forth in claim 1, further comprising the steps of:
before the step (a),
forming (i) reflecting electrode layers which are patterned for respective of the sub-pixels having different display colors and (ii) polycrystalline fourth transparent electrode layers on the respective reflecting electrode layers: and
forming, on the polycrystalline fourth transparent electrode layers, a third transparent electrode layer from a transparent electrode material whose composition is different from the amorphous transparent electrode material of which the first transparent electrode layer is made, in the step (a) and the step (b), the first transparent electrode layer and the second transparent electrode layer being formed on the third transparent electrode layer in this order, in the step (d), the second transparent electrode layer, the first transparent electrode layer, and the third transparent electrode layer being etched and patterned while using the first resist patterns as masks.

8. The method as set forth in claim 6, wherein:

the step of forming the reflecting electrode layers and the polycrystalline fourth transparent electrode layers includes the steps of:

forming a reflecting electrode layer;

forming a fourth transparent electrode layer from an amorphous transparent electrode material on the reflecting electrode layers;

forming second resist patterns on the fourth transparent electrode layer for the respective sub-pixels having different display colors;

patterning the reflecting electrode layer and the fourth transparent electrode layer while using the second resist patterns as masks; and crystallizing the fourth transparent electrode layers so as to transform the fourth transparent electrode layers into the polycrystalline fourth transparent electrode layers.

9. The method as set forth in claim 6, wherein:

the fourth transparent electrode layer is made of indium tin oxide.

10. The method as set forth in claim 5, wherein:

the third transparent electrode layer is made of indium zinc oxide.

11. The method as set forth in claim 4, wherein:

in the step (c), the first resist pattern is formed so as to (i) overlap with the reflecting electrode layer, which has been patterned, in a plan view and (ii) be larger than the reflecting electrode layer, which has been patterned, in the plan view.

12. The method as set forth in claim 1, wherein:

the reflecting electrode layer is made of any one selected from the group consisting of silver, a silver alloy, and an aluminum alloy.

13. The method as set forth in claim 5, wherein:

the reflecting electrode layer includes an aluminum layer.

14. The method as set forth in claim 1, wherein:

the two electrodes are an anode and a cathode, respectively, and the one of the two electrodes is the anode; and an organic electroluminescence layer is formed between the anode and the cathode.

15. The method as set forth in claim 7, wherein:

the step of forming the reflecting electrode layers and the polycrystalline fourth transparent electrode layers includes the steps of:

forming a reflecting electrode layer;

forming a fourth transparent electrode layer from an amorphous transparent electrode material on the reflecting electrode layers;

forming second resist patterns on the fourth transparent electrode layer for the respective sub-pixels having different display colors;

patterning the reflecting electrode layer and the fourth transparent electrode layer while using the second resist patterns as masks; and crystallizing the fourth transparent electrode layers so as to transform the fourth transparent electrode layers into the polycrystalline fourth transparent electrode layers.

16. The method as set forth in claim 7, wherein:

the fourth transparent electrode layer is made of indium tin oxide.

17. The method as set forth in claim 7, wherein:

the third transparent electrode layer is made of indium zinc oxide.

18. The method as set forth in claim 5, wherein:

in the step (c), the first resist pattern is formed so as to (i) overlap with the reflecting electrode layer, which has been patterned, in a plan view and (ii) be larger than the reflecting electrode layer, which has been patterned, in the plan view.

19. The method as set forth in claim 6, wherein:

in the step (c), the first resist pattern is formed so as to (i) overlap with the reflecting electrode layer, which has been patterned, in a plan view and (ii) be larger than the reflecting electrode layer, which has been patterned, in the plan view.

20. The method as set forth in claim 7, wherein:

in the step (c), the first resist pattern is formed so as to (i) overlap with the reflecting electrode layer, which has been patterned, in a plan view and (ii) be larger than the reflecting electrode layer, which has been patterned, in the plan view.

* * * * *